United States Patent
Tsuchi

(10) Patent No.: US 9,224,356 B2
(45) Date of Patent: Dec. 29, 2015

(54) DIGITAL TO-ANALOG-CONVERSION CIRCUIT AND DATA DRIVER FOR DISPLAY DEVICE

(75) Inventor: Hiroshi Tsuchi, Kanagawa (JP)

(73) Assignee: Renesas Elecronics Corporation, Kanagawa (JP)

( * ) Notice: Subject to any disclaimer, the term of this patent is extended or adjusted under 35 U.S.C. 154(b) by 289 days.

(21) Appl. No.: 14/002,948

(22) PCT Filed: Mar. 1, 2012

(86) PCT No.: PCT/JP2012/055153
§ 371 (c)(1),
(2), (4) Date: Sep. 3, 2013

(87) PCT Pub. No.: WO2012/121087
PCT Pub. Date: Sep. 13, 2012

(65) Prior Publication Data
US 2013/0342520 A1    Dec. 26, 2013

(30) Foreign Application Priority Data

Mar. 4, 2011    (JP) ................................. 2011-047282

(51) Int. Cl.
| | |
|---|---|
| *H03M 1/00* | (2006.01) |
| *G09G 5/00* | (2006.01) |
| *H03M 1/66* | (2006.01) |
| *G09G 3/32* | (2006.01) |
| *G09G 3/36* | (2006.01) |
| *H03M 1/76* | (2006.01) |

(52) U.S. Cl.
CPC ................ *G09G 5/00* (2013.01); *G09G 3/3291* (2013.01); *G09G 3/3696* (2013.01); *H03M 1/661* (2013.01); *G09G 3/3688* (2013.01); *G09G 2310/027* (2013.01); *H03M 1/76* (2013.01)

(58) Field of Classification Search
None
See application file for complete search history.

(56) References Cited

U.S. PATENT DOCUMENTS

| | | | |
|---|---|---|---|
| 6,441,763 | B1 | 8/2002 | Nakao |
| 7,391,399 | B2 | 6/2008 | Kikuchi et al. |
| 7,551,111 | B2 | 6/2009 | Shimatani |
| 8,035,593 | B2 | 10/2011 | Kikuchi et al. |
| 2008/0012843 | A1* | 1/2008 | Meno ............................. 345/208 |
| 2009/0109077 | A1 | 4/2009 | Tsuchi et al. |

(Continued)

FOREIGN PATENT DOCUMENTS

| | | |
|---|---|---|
| JP | 2002-43944 A | 2/2002 |
| JP | 2005-156621 A | 6/2005 |

(Continued)

*Primary Examiner* — Adam R Giesy
*Assistant Examiner* — Henok Heyi
(74) *Attorney, Agent, or Firm* — Foley & Lardner LLP

(57) ABSTRACT

DAC includes a decoder that receives N number of reference voltages and an n-bit digital signal (n 4) to select first to third voltages, and an operational amplifier to output (first voltage+ second voltage+2 third voltage)/4 voltage. The operational amplifier is able to output, for respective $2^n$ combinations of the n-bit digital signal, voltage levels from an Ath level, as a base level, to an $(A-1+2^n)$th level. The N number of reference voltages include Ath level, (A+4)th level, $(A-4+2^n)$ and $(A+2^n)$, and an at most $\{-4+2^{(n-2)}\}$ reference voltages obtained by decimating a pre-set at least one reference voltage from $\{-3+2^{(n-2)}\}$ reference voltages that are other than the four number of reference voltages from the $\{1+2^{(n-2)}\}$ reference voltages corresponding to the voltage levels spaced each other at an interval of 4 levels from the Ath level. N is not less than 4 and not more than $2^{(n-2)}$.

13 Claims, 34 Drawing Sheets

(56) References Cited

U.S. PATENT DOCUMENTS

2009/0303219 A1* 12/2009 Kimura et al. ............... 345/211
2010/0238146 A1*  9/2010 Zebedee ....................... 345/205
2012/0026154 A1*  2/2012 Tsuchi .......................... 345/212

FOREIGN PATENT DOCUMENTS

| | | |
|---|---|---|
| JP | 2008-67145 A | 3/2008 |
| JP | 2009-104056 A | 5/2009 |

* cited by examiner

FIG. 2A

RELATIONSHIP OF CORRESPONDENCE OF
4-BIT 16-LEVEL OUTPUT LEVELS AND REFERENCE
VOLTAGES (n=4, N=4, A=0)

| VOLTAGE LEVELS | REFERENCE VOLTAGE LEVELS |
|---|---|
| 0 | 0 |
| 1 | |
| 2 | |
| 3 | |
| 4 | 4 |
| 5 | |
| 6 | |
| 7 | |
| 8 | |
| 9 | |
| 10 | |
| 11 | |
| 12 | 12 |
| 13 | |
| 14 | |
| 15 | |
| 16 | 16 |

- 0, 1, 2, 3, 4: NOT DECIMATED
- 8: DECIMATED REFERENCE VOLTAGES
- 12, 13, 14, 15, 16: NOT DECIMATED

FIG. 2B

ALL COMBINATIONS OF REFERENCE VOLTAGES AND RESULTS OF
OPERATION OUTPUTS (OUTPUT VOLTAGE LEVELS)

| V(T1) | V(T2) | V(T3) | Vout | V(T1) | V(T2) | V(T3) | Vout | V(T1) | V(T2) | V(T3) | Vout | V(T1) | V(T2) | V(T3) | Vout |
|---|---|---|---|---|---|---|---|---|---|---|---|---|---|---|---|
| 0 | 0 | 0 | 0 | 0 | 0 | 4 | 2 | 0 | 0 | 12 | 6 | 0 | 0 | 16 | 8 |
| 4 | 0 | 0 | 1 | 4 | 0 | 4 | 3 | 4 | 0 | 12 | 7 | 4 | 0 | 16 | 9 |
| 4 | 4 | 0 | 2 | 4 | 4 | 4 | 4 | 4 | 4 | 12 | 8 | 4 | 4 | 16 | 10 |
| 12 | 0 | 0 | 3 | 12 | 0 | 4 | 5 | 12 | 0 | 12 | 9 | 12 | 0 | 16 | 11 |
| 12 | 4 | 0 | 4 | 12 | 4 | 4 | 6 | 12 | 4 | 12 | 10 | 12 | 4 | 16 | 12 |
| 12 | 12 | 0 | 6 | 12 | 12 | 4 | 8 | 12 | 12 | 12 | 12 | 12 | 12 | 16 | 14 |
| 16 | 0 | 0 | 4 | 16 | 0 | 4 | 6 | 16 | 0 | 12 | 10 | 16 | 0 | 16 | 12 |
| 16 | 4 | 0 | 5 | 16 | 4 | 4 | 7 | 16 | 4 | 12 | 11 | 16 | 4 | 16 | 13 |
| 16 | 12 | 0 | 7 | 16 | 12 | 4 | 9 | 16 | 12 | 12 | 13 | 16 | 12 | 16 | 15 |
| 16 | 16 | 0 | 8 | 16 | 16 | 4 | 10 | 16 | 16 | 12 | 14 | 16 | 16 | 16 | 16 |

$$Vout = \{V(T1) + V(T2) + 2 \times V(T3)\}/4$$

FIG. 3

RELATIONSHIP OF CORRESPONDENCE OF
5-BIT 32-LEVEL OUTPUT LEVELS AND REFERENCE
VOLTAGES (n=5, N=6, A=0)

| VOLTAGE LEVELS | REFERENCE VOLTAGE LEVELS | |
|---|---|---|
| 0 | 0 | ← |
| 1 | | NOT DECIMATED |
| 2 | | |
| 3 | | |
| 4 | 4 | ← |
| 5 | | |
| 6 | | |
| 7 | | |
| 8 | | ← |
| 9 | | |
| 10 | | |
| 11 | | |
| 12 | 12 | |
| 13 | | |
| 14 | | |
| 15 | | |
| 16 | | ← DECIMATED REFERENCE VOLTAGES |
| 17 | | |
| 18 | | |
| 19 | | |
| 20 | 20 | |
| 21 | | |
| 22 | | |
| 23 | | |
| 24 | | ← |
| 25 | | |
| 26 | | |
| 27 | | |
| 28 | 28 | ← |
| 29 | | NOT DECIMATED |
| 30 | | |
| 31 | | |
| 32 | 32 | ← |

FIG. 4

ALL COMBINATIONS OF REFERENCE VOLTAGES AND RESULTS OF OPERATION OUTPUTS (OUTPUT LEVELS)

$V_{out} = [V(T1) + V(T2) + 2 \times V(T3)] / 4$

FIG. 5

RELATIONSHIP OF CORRESPONDENCE OF
5-BIT 32-LEVEL OUTPUT LEVELS AND REFERENCE
VOLTAGES (n=5, N=5, A=0)

| VOLTAGE LEVELS | REFERENCE VOLTAGE LEVELS |
|---|---|
| 0 | 0 |
| 1 | |
| 2 | |
| 3 | |
| 4 | 4 |
| 5 | |
| 6 | |
| 7 | |
| 8 | |
| 9 | |
| 10 | |
| 11 | |
| 12 | |
| 13 | |
| 14 | |
| 15 | |
| 16 | 16 |
| 17 | |
| 18 | |
| 19 | |
| 20 | |
| 21 | |
| 22 | |
| 23 | |
| 24 | |
| 25 | |
| 26 | |
| 27 | |
| 28 | 28 |
| 29 | |
| 30 | |
| 31 | |
| 32 | 32 |

- Levels 0–4: NOT DECIMATED
- Levels 4–28: DECIMATED REFERENCE VOLTAGES
- Levels 28–32: NOT DECIMATED

FIG. 6

ALL COMBINATIONS OF REFERENCE VOLTAGES AND RESULTS OF OPERATION OUTPUTS (OUTPUT LEVELS)

| SELECTED VOLTAGES | | | OUTPUT | SELECTED VOLTAGES | | | OUTPUT | SELECTED VOLTAGES | | | OUTPUT | SELECTED VOLTAGES | | | OUTPUT |
|---|---|---|---|---|---|---|---|---|---|---|---|---|---|---|---|
| V(T1) | V(T2) | V(T3) | Vout | V(T1) | V(T2) | V(T3) | Vout | V(T1) | V(T2) | V(T3) | Vout | V(T1) | V(T2) | V(T3) | Vout |
| 0 | 0 | 0 | 0 | 0 | 0 | 4 | 2 | 0 | 0 | 16 | 8 | 0 | 0 | 32 | 16 |
| 4 | 0 | 0 | 1 | 4 | 0 | 4 | 3 | 4 | 0 | 16 | 9 | 4 | 0 | 32 | 17 |
| 4 | 4 | 0 | 2 | 4 | 4 | 4 | 4 | 4 | 4 | 16 | 10 | 4 | 4 | 32 | 18 |
| 16 | 0 | 0 | 4 | 16 | 0 | 4 | 6 | 16 | 0 | 16 | 12 | 16 | 0 | 32 | 20 |
| 16 | 4 | 0 | 5 | 16 | 4 | 4 | 7 | 16 | 4 | 16 | 13 | 16 | 4 | 32 | 21 |
| 16 | 16 | 0 | 8 | 16 | 16 | 4 | 10 | 16 | 16 | 16 | 16 | 16 | 16 | 32 | 24 |
| 28 | 0 | 0 | 7 | 28 | 0 | 4 | 9 | 28 | 0 | 16 | 15 | 28 | 0 | 32 | 23 |
| 28 | 4 | 0 | 8 | 28 | 4 | 4 | 10 | 28 | 4 | 16 | 16 | 28 | 4 | 32 | 24 |
| 28 | 16 | 0 | 11 | 28 | 16 | 4 | 13 | 28 | 16 | 16 | 19 | 28 | 16 | 32 | 27 |
| 28 | 28 | 0 | 14 | 28 | 28 | 4 | 16 | 28 | 28 | 16 | 22 | 28 | 28 | 32 | 30 |
| 32 | 0 | 0 | 8 | 32 | 0 | 4 | 10 | 32 | 0 | 16 | 16 | 32 | 0 | 32 | 24 |
| 32 | 4 | 0 | 9 | 32 | 4 | 4 | 11 | 32 | 4 | 16 | 17 | 32 | 4 | 32 | 25 |
| 32 | 16 | 0 | 12 | 32 | 16 | 4 | 14 | 32 | 16 | 16 | 20 | 32 | 16 | 32 | 28 |
| 32 | 28 | 0 | 15 | 32 | 28 | 4 | 17 | 32 | 28 | 16 | 23 | 32 | 28 | 32 | 31 |
| 32 | 32 | 0 | 16 | 32 | 32 | 4 | 18 | 32 | 32 | 16 | 24 | 32 | 32 | 32 | 32 |

$$V_{out} = [V(T1) + V(T2) + 2 \times V(T3)] / 4$$

FIG. 7

RELATIONSHIP OF CORRESPONDENCE OF 6-BIT 64-LEVEL
OUTPUT LEVELS AND REFERENCE VOLTAGES (n=6, N=7, A=0)

| VOLTAGE LEVELS | REFERENCE VOLTAGE LEVELS |
|---|---|
| 0 | 0 |
| 1 | |
| 2 | |
| 3 | |
| 4 | 4 |
| 5 | |
| 6 | |
| 7 | |
| 8 | |
| 9 | |
| 10 | |
| 11 | |
| 12 | |
| 13 | |
| 14 | |
| 15 | |
| 16 | 16 |
| 17 | |
| 18 | |
| 19 | |
| 20 | |
| 21 | |
| 22 | |
| 23 | |
| 24 | |
| 25 | |
| 26 | |
| 27 | |
| 28 | |
| 29 | |
| 30 | |
| 31 | |
| 32 | 32 |
| 33 | |
| 34 | |
| 35 | |
| 36 | |
| 37 | |
| 38 | |
| 39 | |
| 40 | |
| 41 | |
| 42 | |
| 43 | |
| 44 | |
| 45 | |
| 46 | |
| 47 | |
| 48 | 48 |
| 49 | |
| 50 | |
| 51 | |
| 52 | |
| 53 | |
| 54 | |
| 55 | |
| 56 | |
| 57 | |
| 58 | |
| 59 | |
| 60 | 60 |
| 61 | |
| 62 | |
| 63 | |
| 64 | 64 |

- Levels 0–4: NOT DECIMATED
- Levels 4–60: DECIMATED REFERENCE VOLTAGES
- Levels 60–64: NOT DECIMATED

FIG. 8

ALL COMBINATIONS OF REFERENCE VOLTAGES AND RESULTS OF OPERATION OUTPUTS (OUTPUT LEVELS)

$V_{out} = \{V(T1) + V(T2) + 2 \times V(T3)\}/4$

FIG. 9

RELATIONSHIP OF CORRESPONDENCE OF 6-BIT 64-LEVEL
OUTPUT LEVELS AND REFERENCE VOLTAGES (n=6, N=7, A=0)

| VOLTAGE LEVELS | REFERENCE VOLTAGE LEVELS |
|---|---|
| 0 | 0 |
| 1 | |
| 2 | |
| 3 | |
| 4 | 4 |
| 5 | |
| 6 | |
| 7 | |
| 8 | 8 |
| 9 | |
| 10 | |
| 11 | |
| 12 | |
| 13 | |
| 14 | |
| 15 | |
| 16 | |
| 17 | |
| 18 | |
| 19 | |
| 20 | |
| 21 | |
| 22 | |
| 23 | |
| 24 | |
| 25 | |
| 26 | |
| 27 | |
| 28 | |
| 29 | |
| 30 | |
| 31 | |
| 32 | 32 |
| 33 | |
| 34 | |
| 35 | |
| 36 | |
| 37 | |
| 38 | |
| 39 | |
| 40 | |
| 41 | |
| 42 | |
| 43 | |
| 44 | |
| 45 | |
| 46 | |
| 47 | |
| 48 | |
| 49 | |
| 50 | |
| 51 | |
| 52 | |
| 53 | |
| 54 | |
| 55 | |
| 56 | 56 |
| 57 | |
| 58 | |
| 59 | |
| 60 | 60 |
| 61 | |
| 62 | |
| 63 | |
| 64 | 64 |

- Levels 0–4: NOT DECIMATED
- Levels 4–60: DECIMATED REFERENCE VOLTAGES
- Levels 60–64: NOT DECIMATED

FIG. 10

ALL COMBINATIONS OF REFERENCE VOLTAGES AND RESULTS OF OPERATION OUTPUTS (OUTPUT LEVELS)

$$V_{out} = \{V(T1) + V(T2) + 2 \times V(T3)\}/4$$

FIG. 11

RELATIONSHIP OF CORRESPONDENCE OF 6-BIT 64-LEVEL
OUTPUT LEVELS AND REFERENCE VOLTAGES (n=6, N=7, A=0)

| VOLTAGE LEVELS | REFERENCE VOLTAGE LEVELS |
|---|---|
| 0 | 0 |
| 1 | |
| 2 | |
| 3 | |
| 4 | 4 |
| 5 | |
| 6 | |
| 7 | |
| 8 | |
| 9 | |
| 10 | |
| 11 | |
| 12 | 12 |
| 13 | |
| 14 | |
| 15 | |
| 16 | |
| 17 | |
| 18 | |
| 19 | |
| 20 | |
| 21 | |
| 22 | |
| 23 | |
| 24 | |
| 25 | |
| 26 | |
| 27 | |
| 28 | |
| 29 | |
| 30 | |
| 31 | |
| 32 | 32 |
| 33 | |
| 34 | |
| 35 | |
| 36 | |
| 37 | |
| 38 | |
| 39 | |
| 40 | |
| 41 | |
| 42 | |
| 43 | |
| 44 | |
| 45 | |
| 46 | |
| 47 | |
| 48 | |
| 49 | |
| 50 | |
| 51 | |
| 52 | 52 |
| 53 | |
| 54 | |
| 55 | |
| 56 | |
| 57 | |
| 58 | |
| 59 | |
| 60 | 60 |
| 61 | |
| 62 | |
| 63 | |
| 64 | 64 |

- 0, 4: NOT DECIMATED
- 8 through 56: DECIMATED REFERENCE VOLTAGES
- 60, 64: NOT DECIMATED

FIG. 12

ALL COMBINATIONS OF REFERENCE VOLTAGES AND RESULTS OF OPERATION OUTPUTS (OUTPUT LEVELS)

$$V_{out} = \{V(T1) + V(T2) + 2 \times V(T3)\}/4$$

FIG. 13

RELATIONSHIP OF CORRESPONDENCE OF 6-BIT 64-LEVEL
OUTPUT LEVELS AND REFERENCE VOLTAGES (n=6, N=7, A=0)

| VOLTAGE LEVELS | REFERENCE VOLTAGE LEVELS |
|---|---|
| 0 | 0 |
| 1 | |
| 2 | |
| 3 | |
| 4 | 4 |
| 5 | |
| 6 | |
| 7 | |
| 8 | |
| 9 | |
| 10 | |
| 11 | |
| 12 | |
| 13 | |
| 14 | |
| 15 | |
| 16 | |
| 17 | |
| 18 | |
| 19 | |
| 20 | 20 |
| 21 | |
| 22 | |
| 23 | |
| 24 | |
| 25 | |
| 26 | |
| 27 | |
| 28 | |
| 29 | |
| 30 | |
| 31 | |
| 32 | 32 |
| 33 | |
| 34 | |
| 35 | |
| 36 | |
| 37 | |
| 38 | |
| 39 | |
| 40 | |
| 41 | |
| 42 | |
| 43 | |
| 44 | 44 |
| 45 | |
| 46 | |
| 47 | |
| 48 | |
| 49 | |
| 50 | |
| 51 | |
| 52 | |
| 53 | |
| 54 | |
| 55 | |
| 56 | |
| 57 | |
| 58 | |
| 59 | |
| 60 | 60 |
| 61 | |
| 62 | |
| 63 | |
| 64 | 64 |

- NOT DECIMATED (levels 0–4)
- DECIMATED REFERENCE VOLTAGES (levels 4–60)
- NOT DECIMATED (levels 60–64)

FIG. 14

ALL COMBINATIONS OF REFERENCE VOLTAGES AND RESULTS OF OPERATION OUTPUTS (OUTPUT LEVELS)

$$V_{out} = \{V(T1) + V(T2) + 2 \times V(T3)\}/4$$

FIG. 16

| | | VOLTAGE LEVELS | REFERENCE VOLTAGE LEVELS | SELECTED VOLTAGES V(T1) | V(T2) | V(T3) | OUTPUT Vout | D9 | D8 | D7 | D6 | D5 | D4 | D3 | D2 | D1 | D0 |
|---|---|---|---|---|---|---|---|---|---|---|---|---|---|---|---|---|---|
| APPLICATION SECTIONS | FIRST SECTION | 0 | 0 | 0 | 0 | 0 | 0 | 0 | 0 | 0 | 0 | 0 | 0 | 0 | 0 | 0 | 0 |
| | | 1 | | 4 | 0 | 0 | 1 | 0 | 0 | 0 | 0 | 0 | 0 | 0 | 0 | 0 | 1 |
| | | 2 | | 0 | 0 | 4 | 2 | 0 | 0 | 0 | 0 | 0 | 0 | 0 | 0 | 1 | 0 |
| | | 3 | | 4 | 0 | 4 | 3 | 0 | 0 | 0 | 0 | 0 | 0 | 0 | 0 | 1 | 1 |
| | | 4 | 4 | 12 | 4 | 0 | 4 | 0 | 0 | 0 | 0 | 0 | 0 | 0 | 1 | 0 | 0 |
| | | 5 | | 16 | 4 | 0 | 5 | 0 | 0 | 0 | 0 | 0 | 0 | 0 | 1 | 0 | 1 |
| | | 6 | | 12 | 4 | 4 | 6 | 0 | 0 | 0 | 0 | 0 | 0 | 0 | 1 | 1 | 0 |
| | | 7 | | 16 | 4 | 4 | 7 | 0 | 0 | 0 | 0 | 0 | 0 | 0 | 1 | 1 | 1 |
| | | 8 | | 12 | 12 | 4 | 8 | 0 | 0 | 0 | 0 | 0 | 0 | 1 | 0 | 0 | 0 |
| | | 9 | | 16 | 12 | 4 | 9 | 0 | 0 | 0 | 0 | 0 | 0 | 1 | 0 | 0 | 1 |
| | | 10 | | 12 | 4 | 12 | 10 | 0 | 0 | 0 | 0 | 0 | 0 | 1 | 0 | 1 | 0 |
| | | 11 | | 16 | 4 | 12 | 11 | 0 | 0 | 0 | 0 | 0 | 0 | 1 | 0 | 1 | 1 |
| | | 12 | 12 | 12 | 12 | 12 | 12 | 0 | 0 | 0 | 0 | 0 | 0 | 1 | 1 | 0 | 0 |
| | | 13 | | 16 | 12 | 12 | 13 | 0 | 0 | 0 | 0 | 0 | 0 | 1 | 1 | 0 | 1 |
| | | 14 | | 12 | 12 | 16 | 14 | 0 | 0 | 0 | 0 | 0 | 0 | 1 | 1 | 1 | 0 |
| | | 15 | | 16 | 12 | 16 | 15 | 0 | 0 | 0 | 0 | 0 | 0 | 1 | 1 | 1 | 1 |
| | SECOND SECTION | 16 | 16 | 16 | 16 | 16 | 16 | 0 | 0 | 0 | 0 | 0 | 1 | 0 | 0 | 0 | 0 |
| | | 17 | | 20 | 16 | 16 | 17 | 0 | 0 | 0 | 0 | 0 | 1 | 0 | 0 | 0 | 1 |
| | | 18 | | 16 | 16 | 20 | 18 | 0 | 0 | 0 | 0 | 0 | 1 | 0 | 0 | 1 | 0 |
| | | 19 | | 20 | 16 | 20 | 19 | 0 | 0 | 0 | 0 | 0 | 1 | 0 | 0 | 1 | 1 |
| | | 20 | 20 | 28 | 20 | 16 | 20 | 0 | 0 | 0 | 0 | 0 | 1 | 0 | 1 | 0 | 0 |
| | | 21 | | 32 | 20 | 16 | 21 | 0 | 0 | 0 | 0 | 0 | 1 | 0 | 1 | 0 | 1 |
| | | 22 | | 28 | 20 | 20 | 22 | 0 | 0 | 0 | 0 | 0 | 1 | 0 | 1 | 1 | 0 |
| | | 23 | | 32 | 20 | 20 | 23 | 0 | 0 | 0 | 0 | 0 | 1 | 0 | 1 | 1 | 1 |
| | | 24 | | 28 | 28 | 20 | 24 | 0 | 0 | 0 | 0 | 0 | 1 | 1 | 0 | 0 | 0 |
| | | 25 | | 32 | 28 | 20 | 25 | 0 | 0 | 0 | 0 | 0 | 1 | 1 | 0 | 0 | 1 |
| | | 26 | | 28 | 20 | 28 | 26 | 0 | 0 | 0 | 0 | 0 | 1 | 1 | 0 | 1 | 0 |
| | | 27 | | 32 | 20 | 28 | 27 | 0 | 0 | 0 | 0 | 0 | 1 | 1 | 0 | 1 | 1 |
| | | 28 | 28 | 28 | 28 | 28 | 28 | 0 | 0 | 0 | 0 | 0 | 1 | 1 | 1 | 0 | 0 |
| | | 29 | | 32 | 28 | 28 | 29 | 0 | 0 | 0 | 0 | 0 | 1 | 1 | 1 | 0 | 1 |
| | | 30 | | 28 | 28 | 32 | 30 | 0 | 0 | 0 | 0 | 0 | 1 | 1 | 1 | 1 | 0 |
| | | 31 | | 32 | 28 | 32 | 31 | 0 | 0 | 0 | 0 | 0 | 1 | 1 | 1 | 1 | 1 |
| | THIRD SECTION | 32 | 32 | 32 | 32 | 32 | 32 | 0 | 0 | 0 | 0 | 1 | 0 | 0 | 0 | 0 | 0 |
| | | 33 | | 36 | 32 | 32 | 33 | 0 | 0 | 0 | 0 | 1 | 0 | 0 | 0 | 0 | 1 |
| | | 34 | | 32 | 32 | 36 | 34 | 0 | 0 | 0 | 0 | 1 | 0 | 0 | 0 | 1 | 0 |
| | | 35 | | 36 | 32 | 36 | 35 | 0 | 0 | 0 | 0 | 1 | 0 | 0 | 0 | 1 | 1 |
| | | 36 | 36 | 44 | 36 | 32 | 36 | 0 | 0 | 0 | 0 | 1 | 0 | 0 | 1 | 0 | 0 |
| | | 37 | | 48 | 36 | 32 | 37 | 0 | 0 | 0 | 0 | 1 | 0 | 0 | 1 | 0 | 1 |
| | | 38 | | 44 | 36 | 36 | 38 | 0 | 0 | 0 | 0 | 1 | 0 | 0 | 1 | 1 | 0 |
| | | 39 | | 48 | 36 | 36 | 39 | 0 | 0 | 0 | 0 | 1 | 0 | 0 | 1 | 1 | 1 |
| | | 40 | | 44 | 44 | 36 | 40 | 0 | 0 | 0 | 0 | 1 | 0 | 1 | 0 | 0 | 0 |
| | | 41 | | 48 | 44 | 36 | 41 | 0 | 0 | 0 | 0 | 1 | 0 | 1 | 0 | 0 | 1 |
| | | 42 | | 44 | 36 | 44 | 42 | 0 | 0 | 0 | 0 | 1 | 0 | 1 | 0 | 1 | 0 |
| | | 43 | | 48 | 36 | 44 | 43 | 0 | 0 | 0 | 0 | 1 | 0 | 1 | 0 | 1 | 1 |
| | | 44 | 44 | 44 | 44 | 44 | 44 | 0 | 0 | 0 | 0 | 1 | 0 | 1 | 1 | 0 | 0 |
| | | 45 | | 48 | 44 | 44 | 45 | 0 | 0 | 0 | 0 | 1 | 0 | 1 | 1 | 0 | 1 |
| | | 46 | | 44 | 44 | 48 | 46 | 0 | 0 | 0 | 0 | 1 | 0 | 1 | 1 | 1 | 0 |
| | | 47 | | 48 | 44 | 48 | 47 | 0 | 0 | 0 | 0 | 1 | 0 | 1 | 1 | 1 | 1 |
| | | 48 | 48 | 48 | 48 | 48 | 48 | 0 | 0 | 0 | 0 | 1 | 1 | 0 | 0 | 0 | 0 |
| | | ⁓ | ⁓ | ⁓ | ⁓ | ⁓ | ⁓ | ⁓ | ⁓ | ⁓ | ⁓ | ⁓ | ⁓ | ⁓ | ⁓ | ⁓ | ⁓ |
| | 64TH SECTION | 1008 | 1008 | 1008 | 1008 | 1008 | 1008 | 1 | 1 | 1 | 1 | 1 | 1 | 0 | 0 | 0 | 0 |
| | | 1009 | | 1012 | 1008 | 1008 | 1009 | 1 | 1 | 1 | 1 | 1 | 1 | 0 | 0 | 0 | 1 |
| | | 1010 | | 1008 | 1008 | 1012 | 1010 | 1 | 1 | 1 | 1 | 1 | 1 | 0 | 0 | 1 | 0 |
| | | 1011 | | 1012 | 1008 | 1012 | 1011 | 1 | 1 | 1 | 1 | 1 | 1 | 0 | 0 | 1 | 1 |
| | | 1012 | 1012 | 1020 | 1012 | 1008 | 1012 | 1 | 1 | 1 | 1 | 1 | 1 | 0 | 1 | 0 | 0 |
| | | 1013 | | 1024 | 1012 | 1008 | 1013 | 1 | 1 | 1 | 1 | 1 | 1 | 0 | 1 | 0 | 1 |
| | | 1014 | | 1020 | 1012 | 1012 | 1014 | 1 | 1 | 1 | 1 | 1 | 1 | 0 | 1 | 1 | 0 |
| | | 1015 | | 1024 | 1012 | 1012 | 1015 | 1 | 1 | 1 | 1 | 1 | 1 | 0 | 1 | 1 | 1 |
| | | 1016 | | 1020 | 1020 | 1012 | 1016 | 1 | 1 | 1 | 1 | 1 | 1 | 1 | 0 | 0 | 0 |
| | | 1017 | | 1024 | 1020 | 1012 | 1017 | 1 | 1 | 1 | 1 | 1 | 1 | 1 | 0 | 0 | 1 |
| | | 1018 | | 1020 | 1012 | 1020 | 1018 | 1 | 1 | 1 | 1 | 1 | 1 | 1 | 0 | 1 | 0 |
| | | 1019 | | 1024 | 1012 | 1020 | 1019 | 1 | 1 | 1 | 1 | 1 | 1 | 1 | 0 | 1 | 1 |
| | | 1020 | 1020 | 1020 | 1020 | 1020 | 1020 | 1 | 1 | 1 | 1 | 1 | 1 | 1 | 1 | 0 | 0 |
| | | 1021 | | 1024 | 1020 | 1020 | 1021 | 1 | 1 | 1 | 1 | 1 | 1 | 1 | 1 | 0 | 1 |
| | | 1022 | | 1020 | 1020 | 1024 | 1022 | 1 | 1 | 1 | 1 | 1 | 1 | 1 | 1 | 1 | 0 |
| | | 1023 | | 1024 | 1020 | 1024 | 1023 | 1 | 1 | 1 | 1 | 1 | 1 | 1 | 1 | 1 | 1 |
| | | 1024 | 1024 | | | | | | | | | | | | | | |

FIG. 17

| VOLTAGE LEVELS | REFERENCE VOLTAGE LEVELS | SELECTED VOLTAGES | | | OUTPUT | D9 | D8 | D7 | D6 | D5 | D4 | D3 | D2 | D1 | D0 |
|---|---|---|---|---|---|---|---|---|---|---|---|---|---|---|---|
| | | V(T1) | V(T2) | V(T3) | Vout | | | | | | | | | | |
| 0 | 0 | 0 | 0 | 0 | 0 | 0 | 0 | 0 | 0 | 0 | 0 | 0 | 0 | 0 | 0 |
| 1 | | 4 | 0 | 0 | 1 | 0 | 0 | 0 | 0 | 0 | 0 | 0 | 0 | 0 | 1 |
| 2 | | 0 | 0 | 4 | 2 | 0 | 0 | 0 | 0 | 0 | 0 | 0 | 0 | 1 | 0 |
| 3 | | 4 | 0 | 4 | 3 | 0 | 0 | 0 | 0 | 0 | 0 | 0 | 0 | 1 | 1 |
| 4 | 4 | 4 | 4 | 4 | 4 | 0 | 0 | 0 | 0 | 0 | 0 | 0 | 1 | 0 | 0 |
| 5 | | 8 | 4 | 4 | 5 | 0 | 0 | 0 | 0 | 0 | 0 | 0 | 1 | 0 | 1 |
| 6 | | 4 | 4 | 8 | 6 | 0 | 0 | 0 | 0 | 0 | 0 | 0 | 1 | 1 | 0 |
| 7 | | 8 | 4 | 8 | 7 | 0 | 0 | 0 | 0 | 0 | 0 | 0 | 1 | 1 | 1 |
| 8 | 8 | 8 | 8 | 8 | 8 | 0 | 0 | 0 | 0 | 0 | 0 | 1 | 0 | 0 | 0 |
| 9 | | 12 | 8 | 8 | 9 | 0 | 0 | 0 | 0 | 0 | 0 | 1 | 0 | 0 | 1 |
| 10 | | 8 | 8 | 12 | 10 | 0 | 0 | 0 | 0 | 0 | 0 | 1 | 0 | 1 | 0 |
| 11 | | 12 | 8 | 12 | 11 | 0 | 0 | 0 | 0 | 0 | 0 | 1 | 0 | 1 | 1 |
| 12 | 12 | 12 | 12 | 12 | 12 | 0 | 0 | 0 | 0 | 0 | 0 | 1 | 1 | 0 | 0 |
| 13 | | 16 | 12 | 12 | 13 | 0 | 0 | 0 | 0 | 0 | 0 | 1 | 1 | 0 | 1 |
| 14 | | 12 | 12 | 16 | 14 | 0 | 0 | 0 | 0 | 0 | 0 | 1 | 1 | 1 | 0 |
| 15 | | 16 | 12 | 16 | 15 | 0 | 0 | 0 | 0 | 0 | 0 | 1 | 1 | 1 | 1 |
| 16 | 16 | 16 | 16 | 16 | 16 | 0 | 0 | 0 | 0 | 0 | 1 | 0 | 0 | 0 | 0 |
| 17 | | 20 | 16 | 16 | 17 | 0 | 0 | 0 | 0 | 0 | 1 | 0 | 0 | 0 | 1 |
| 18 | | 16 | 16 | 20 | 18 | 0 | 0 | 0 | 0 | 0 | 1 | 0 | 0 | 1 | 0 |
| 19 | | 20 | 16 | 20 | 19 | 0 | 0 | 0 | 0 | 0 | 1 | 0 | 0 | 1 | 1 |
| 20 | 20 | 28 | 20 | 16 | 20 | 0 | 0 | 0 | 0 | 0 | 1 | 0 | 1 | 0 | 0 |
| 21 | | 32 | 20 | 16 | 21 | 0 | 0 | 0 | 0 | 0 | 1 | 0 | 1 | 0 | 1 |
| 22 | | 28 | 20 | 20 | 22 | 0 | 0 | 0 | 0 | 0 | 1 | 0 | 1 | 1 | 0 |
| 23 | | 32 | 20 | 20 | 23 | 0 | 0 | 0 | 0 | 0 | 1 | 0 | 1 | 1 | 1 |
| 24 | | 28 | 28 | 20 | 24 | 0 | 0 | 0 | 0 | 0 | 1 | 1 | 0 | 0 | 0 |
| 25 | | 32 | 28 | 20 | 25 | 0 | 0 | 0 | 0 | 0 | 1 | 1 | 0 | 0 | 1 |
| 26 | | 28 | 20 | 28 | 26 | 0 | 0 | 0 | 0 | 0 | 1 | 1 | 0 | 1 | 0 |
| 27 | | 32 | 20 | 28 | 27 | 0 | 0 | 0 | 0 | 0 | 1 | 1 | 0 | 1 | 1 |
| 28 | 28 | 28 | 28 | 28 | 28 | 0 | 0 | 0 | 0 | 0 | 1 | 1 | 1 | 0 | 0 |
| 29 | | 32 | 28 | 28 | 29 | 0 | 0 | 0 | 0 | 0 | 1 | 1 | 1 | 0 | 1 |
| 30 | | 28 | 28 | 32 | 30 | 0 | 0 | 0 | 0 | 0 | 1 | 1 | 1 | 1 | 0 |
| 31 | | 32 | 28 | 32 | 31 | 0 | 0 | 0 | 0 | 0 | 1 | 1 | 1 | 1 | 1 |
| 32 | 32 | 32 | 32 | 32 | 32 | 0 | 0 | 0 | 0 | 1 | 0 | 0 | 0 | 0 | 0 |
| 33 | | 36 | 32 | 32 | 33 | 0 | 0 | 0 | 0 | 1 | 0 | 0 | 0 | 0 | 1 |
| 34 | | 32 | 32 | 36 | 34 | 0 | 0 | 0 | 0 | 1 | 0 | 0 | 0 | 1 | 0 |
| 35 | | 36 | 32 | 36 | 35 | 0 | 0 | 0 | 0 | 1 | 0 | 0 | 0 | 1 | 1 |
| 36 | 36 | 44 | 36 | 32 | 36 | 0 | 0 | 0 | 0 | 1 | 0 | 0 | 1 | 0 | 0 |
| 37 | | 48 | 36 | 32 | 37 | 0 | 0 | 0 | 0 | 1 | 0 | 0 | 1 | 0 | 1 |
| 38 | | 44 | 36 | 36 | 38 | 0 | 0 | 0 | 0 | 1 | 0 | 0 | 1 | 1 | 0 |
| 39 | | 48 | 36 | 36 | 39 | 0 | 0 | 0 | 0 | 1 | 0 | 0 | 1 | 1 | 1 |
| 40 | | 44 | 44 | 36 | 40 | 0 | 0 | 0 | 0 | 1 | 0 | 1 | 0 | 0 | 0 |
| 41 | | 48 | 44 | 36 | 41 | 0 | 0 | 0 | 0 | 1 | 0 | 1 | 0 | 0 | 1 |
| 42 | | 44 | 36 | 44 | 42 | 0 | 0 | 0 | 0 | 1 | 0 | 1 | 0 | 1 | 0 |
| 43 | | 48 | 36 | 44 | 43 | 0 | 0 | 0 | 0 | 1 | 0 | 1 | 0 | 1 | 1 |
| 44 | 44 | 44 | 44 | 44 | 44 | 0 | 0 | 0 | 0 | 1 | 0 | 1 | 1 | 0 | 0 |
| 45 | | 48 | 44 | 44 | 45 | 0 | 0 | 0 | 0 | 1 | 0 | 1 | 1 | 0 | 1 |
| 46 | | 44 | 44 | 48 | 46 | 0 | 0 | 0 | 0 | 1 | 0 | 1 | 1 | 1 | 0 |
| 47 | | 48 | 44 | 48 | 47 | 0 | 0 | 0 | 0 | 1 | 0 | 1 | 1 | 1 | 1 |
| 48 | 48 | 48 | 48 | 48 | 48 | 0 | 0 | 0 | 0 | 1 | 1 | 0 | 0 | 0 | 0 |
| ≀ | ≀ | ≀ | ≀ | ≀ | ≀ | ≀ | ≀ | ≀ | ≀ | ≀ | ≀ | ≀ | ≀ | ≀ | ≀ |
| 1008 | 1008 | 1008 | 1008 | 1008 | 1008 | 1 | 1 | 1 | 1 | 1 | 1 | 0 | 0 | 0 | 0 |
| 1009 | | 1012 | 1008 | 1008 | 1009 | 1 | 1 | 1 | 1 | 1 | 1 | 0 | 0 | 0 | 1 |
| 1010 | | 1008 | 1008 | 1012 | 1010 | 1 | 1 | 1 | 1 | 1 | 1 | 0 | 0 | 1 | 0 |
| 1011 | | 1012 | 1008 | 1012 | 1011 | 1 | 1 | 1 | 1 | 1 | 1 | 0 | 0 | 1 | 1 |
| 1012 | 1012 | 1020 | 1012 | 1008 | 1012 | 1 | 1 | 1 | 1 | 1 | 1 | 0 | 1 | 0 | 0 |
| 1013 | | 1024 | 1012 | 1008 | 1013 | 1 | 1 | 1 | 1 | 1 | 1 | 0 | 1 | 0 | 1 |
| 1014 | | 1020 | 1012 | 1012 | 1014 | 1 | 1 | 1 | 1 | 1 | 1 | 0 | 1 | 1 | 0 |
| 1015 | | 1024 | 1012 | 1012 | 1015 | 1 | 1 | 1 | 1 | 1 | 1 | 0 | 1 | 1 | 1 |
| 1016 | | 1020 | 1020 | 1012 | 1016 | 1 | 1 | 1 | 1 | 1 | 1 | 1 | 0 | 0 | 0 |
| 1017 | | 1024 | 1020 | 1012 | 1017 | 1 | 1 | 1 | 1 | 1 | 1 | 1 | 0 | 0 | 1 |
| 1018 | | 1020 | 1012 | 1020 | 1018 | 1 | 1 | 1 | 1 | 1 | 1 | 1 | 0 | 1 | 0 |
| 1019 | | 1024 | 1012 | 1020 | 1019 | 1 | 1 | 1 | 1 | 1 | 1 | 1 | 0 | 1 | 1 |
| 1020 | 1020 | 1020 | 1020 | 1020 | 1020 | 1 | 1 | 1 | 1 | 1 | 1 | 1 | 1 | 0 | 0 |
| 1021 | | 1024 | 1020 | 1020 | 1021 | 1 | 1 | 1 | 1 | 1 | 1 | 1 | 1 | 0 | 1 |
| 1022 | | 1020 | 1020 | 1024 | 1022 | 1 | 1 | 1 | 1 | 1 | 1 | 1 | 1 | 1 | 0 |
| 1023 | | 1024 | 1020 | 1024 | 1023 | 1 | 1 | 1 | 1 | 1 | 1 | 1 | 1 | 1 | 1 |
| 1024 | 1024 | | | | | | | | | | | | | | |

Rows 0–15: FIRST SECTION
Rows 16–31: SECOND SECTION
Rows 32–47: THIRD SECTION
Rows 1008–1023: 64TH SECTION
(APPLICATION SECTIONS)

FIG. 18

| 10-BIT DIGITAL SIGNAL | FIG.2 | FIG.3, FIG.4 | FIG.5, FIG.6 | FIG.7 THROUGH TO FIG.14 |
|---|---|---|---|---|
| NUMBER OF LEVELS PER SECTION | 16 | 32 | 32 | 64 |
| NUMBER OF REFERENCE VOLTAGES PER SECTION | 3+1 | 5+1 | 4+1 | 6+1 |
| NUMBER OF SECTIONS | 64 | 32 | 32 | 16 |
| NUMBER OF REFERENCE VOLTAGES FOR ALL SECTIONS | 193 | 161 | 129 | 97 |

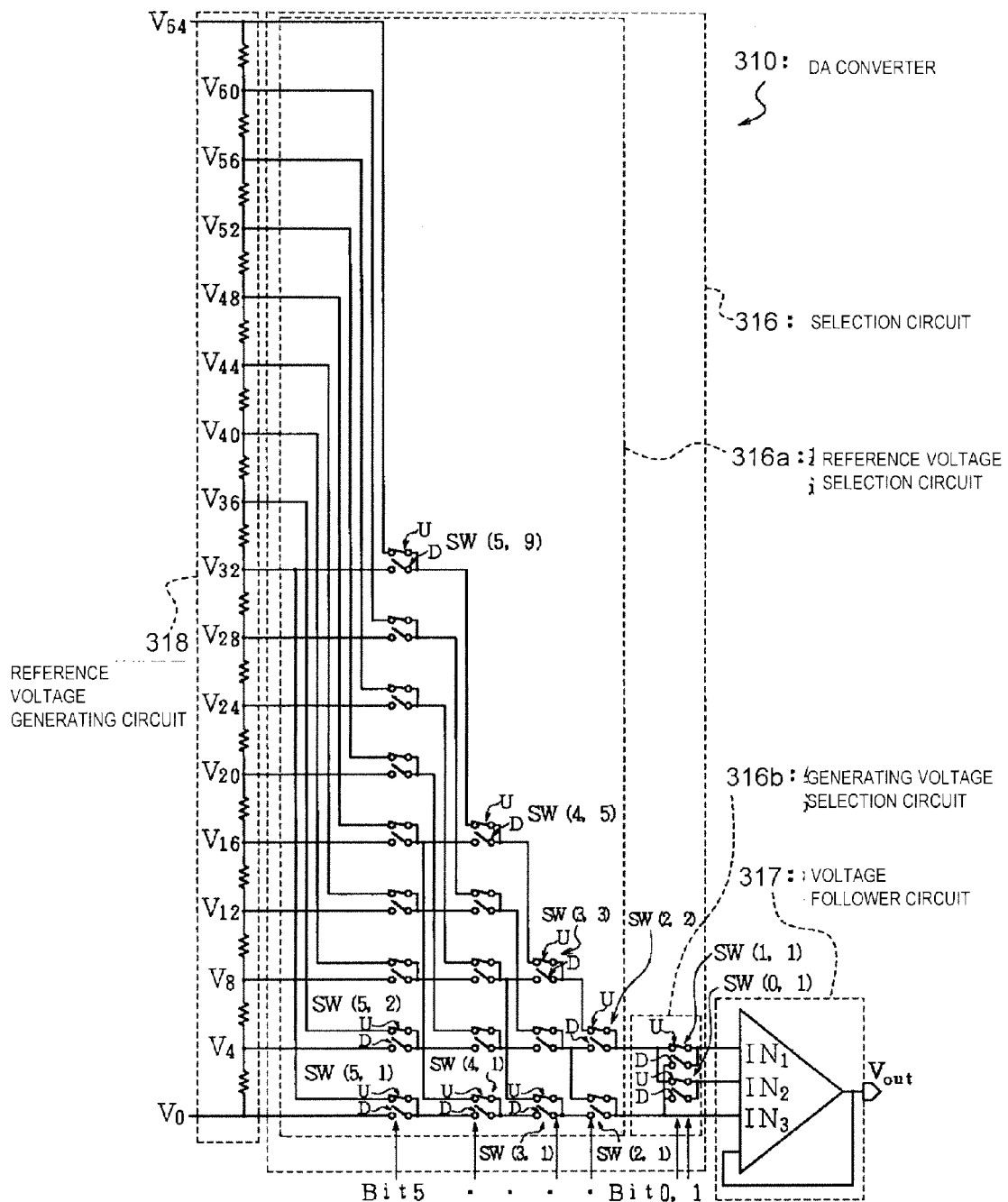
FIG. 21   REALTED ART

FIG. 22    RELATED ART

| GRADA-TION | Bit 5 | 4 | 3 | 2 | 1 | 0 | IN₃ | IN₂ | IN₁ | $V_{out} = (VIN_3 + VIN_2 + VIN_1 \times 2)/4$ |
|---|---|---|---|---|---|---|---|---|---|---|
| 0 | 0 | 0 | 0 | 0 | 0 | 0 | $V_0$ | $V_0$ | $V_0$ | $V_0$ |
| 1 | 0 | 0 | 0 | 0 | 0 | 1 | $V_0$ | $V_4$ | $V_0$ | $(V_0 + V_4 + V_0 \times 2)/4$ |
| 2 | 0 | 0 | 0 | 0 | 1 | 0 | $V_0$ | $V_0$ | $V_4$ | $(V_0 + V_0 + V_4 \times 2)/4$ |
| 3 | 0 | 0 | 0 | 0 | 1 | 1 | $V_0$ | $V_4$ | $V_4$ | $(V_0 + V_4 + V_4 \times 2)/4$ |
| 4 | 0 | 0 | 0 | 1 | 0 | 0 | $V_4$ | $V_4$ | $V_4$ | $V_4$ |
| ⋮ | ⋮ | ⋮ | ⋮ | ⋮ | ⋮ | ⋮ | ⋮ | ⋮ | ⋮ | ⋮ |
| 59 | 1 | 1 | 1 | 0 | 1 | 1 | $V_{56}$ | $V_{60}$ | $V_{60}$ | $(V_{56} + V_{60} + V_{60} \times 2)/4$ |
| 60 | 1 | 1 | 1 | 1 | 0 | 0 | $V_{60}$ | $V_{60}$ | $V_{60}$ | $V_{60}$ |
| 61 | 1 | 1 | 1 | 1 | 0 | 1 | $V_{60}$ | $V_{64}$ | $V_{60}$ | $(V_{60} + V_{64} + V_{60} \times 2)/4$ |
| 62 | 1 | 1 | 1 | 1 | 1 | 0 | $V_{60}$ | $V_{60}$ | $V_{64}$ | $(V_{60} + V_{60} + V_{64} \times 2)/4$ |
| 63 | 1 | 1 | 1 | 1 | 1 | 1 | $V_{60}$ | $V_{64}$ | $V_{64}$ | $(V_{60} + V_{64} + V_{64} \times 2)/4$ |

REALTED ART

FIG. 25

| VOLTAGE LEVELS | REFERENCE VOLTAGE LEVELS | SELECTED VOLTAGES ||| OUTPUT | D3 | D2 | D1 | D0 |
|---|---|---|---|---|---|---|---|---|---|
| | | V(T1) | V(T2) | V(T3) | Vout | | | | |
| 0 | 0 | 0 | 0 | 0 | 0 | 0 | 0 | 0 | 0 |
| 1 | | 4 | 0 | 0 | 1 | 0 | 0 | 0 | 1 |
| 2 | | 0 | 0 | 4 | 2 | 0 | 0 | 1 | 0 |
| 3 | | 4 | 0 | 4 | 3 | 0 | 0 | 1 | 1 |
| 4 | 4 | 12 | 4 | 0 | 4 | 0 | 1 | 0 | 0 |
| 5 | | 16 | 4 | 0 | 5 | 0 | 1 | 0 | 1 |
| 6 | | 12 | 4 | 4 | 6 | 0 | 1 | 1 | 0 |
| 7 | | 16 | 4 | 4 | 7 | 0 | 1 | 1 | 1 |
| 8 | | 12 | 12 | 4 | 8 | 1 | 0 | 0 | 0 |
| 9 | | 16 | 12 | 4 | 9 | 1 | 0 | 0 | 1 |
| 10 | | 12 | 4 | 12 | 10 | 1 | 0 | 1 | 0 |
| 11 | | 16 | 4 | 12 | 11 | 1 | 0 | 1 | 1 |
| 12 | 12 | 12 | 12 | 12 | 12 | 1 | 1 | 0 | 0 |
| 13 | | 16 | 12 | 12 | 13 | 1 | 1 | 0 | 1 |
| 14 | | 12 | 12 | 16 | 14 | 1 | 1 | 1 | 0 |
| 15 | | 16 | 12 | 16 | 15 | 1 | 1 | 1 | 1 |
| 16 | 16 | | | | | | | | |

FIG. 29

| VOLTAGE LEVELS | REFERENCE VOLTAGE LEVELS | SELECTED VOLTAGES ||| OUTPUT | D3 | D2 | D1 | D0 |
|---|---|---|---|---|---|---|---|---|---|
| | | V(T1) | V(T2) | V(T3) | Vout | | | | |
| 0 | 0 | 0 | 0 | 0 | 0 | 0 | 0 | 0 | 0 |
| 1 | | 4 | 0 | 0 | 1 | 0 | 0 | 0 | 1 |
| 2 | | 0 | 0 | 4 | 2 | 0 | 0 | 1 | 0 |
| 3 | | 4 | 0 | 4 | 3 | 0 | 0 | 1 | 1 |
| 4 | 4 | 12 | 4 | 0 | 4 | 0 | 1 | 0 | 0 |
| 5 | | 16 | 4 | 0 | 5 | 0 | 1 | 0 | 1 |
| 6 | | 12 | 4 | 4 | 6 | 0 | 1 | 1 | 0 |
| 7 | | 16 | 4 | 4 | 7 | 0 | 1 | 1 | 1 |
| 8 | | 12 | 12 | 4 | 8 | 1 | 0 | 0 | 0 |
| 9 | | 16 | 12 | 4 | 9 | 1 | 0 | 0 | 1 |
| 10 | | 12 | 4 | 12 | 10 | 1 | 0 | 1 | 0 |
| 11 | | 16 | 4 | 12 | 11 | 1 | 0 | 1 | 1 |
| 12 | 12 | 12 | 4 | 16 | 12 | 1 | 1 | 0 | 0 |
| 13 | | 16 | 4 | 16 | 13 | 1 | 1 | 0 | 1 |
| 14 | | 12 | 12 | 16 | 14 | 1 | 1 | 1 | 0 |
| 15 | | 16 | 12 | 16 | 15 | 1 | 1 | 1 | 1 |
| 16 | 16 | | | | | | | | |

FIG. 31

| VOLTAGE LEVELS | REFERENCE VOLTAGE LEVELS | SELECTED VOLTAGES V(T1) | V(T2) | V(T3) | OUTPUT Vout | D4 | D3 | D2 | D1 | D0 |
|---|---|---|---|---|---|---|---|---|---|---|
| 0 | 0 | 0 | 0 | 0 | 0 | 0 | 0 | 0 | 0 | 0 |
| 1 |  | 0 | 4 | 0 | 1 | 0 | 0 | 0 | 0 | 1 |
| 2 |  | 0 | 0 | 4 | 2 | 0 | 0 | 0 | 1 | 0 |
| 3 |  | 0 | 4 | 4 | 3 | 0 | 0 | 0 | 1 | 1 |
| 4 | 4 | 12 | 4 | 0 | 4 | 0 | 0 | 1 | 0 | 0 |
| 5 |  | 20 | 0 | 0 | 5 | 0 | 0 | 1 | 0 | 1 |
| 6 |  | 12 | 4 | 4 | 6 | 0 | 0 | 1 | 1 | 0 |
| 7 |  | 20 | 0 | 4 | 7 | 0 | 0 | 1 | 1 | 1 |
| 8 |  | 28 | 4 | 0 | 8 | 0 | 1 | 0 | 0 | 0 |
| 9 |  | 32 | 4 | 0 | 9 | 0 | 1 | 0 | 0 | 1 |
| 10 |  | 28 | 4 | 4 | 10 | 0 | 1 | 0 | 1 | 0 |
| 11 |  | 32 | 4 | 4 | 11 | 0 | 1 | 0 | 1 | 1 |
| 12 | 12 | 28 | 12 | 4 | 12 | 0 | 1 | 1 | 0 | 0 |
| 13 |  | 32 | 12 | 4 | 13 | 0 | 1 | 1 | 0 | 1 |
| 14 |  | 28 | 20 | 4 | 14 | 0 | 1 | 1 | 1 | 0 |
| 15 |  | 32 | 20 | 4 | 15 | 0 | 1 | 1 | 1 | 1 |
| 16 |  | 28 | 12 | 12 | 16 | 1 | 0 | 0 | 0 | 0 |
| 17 |  | 32 | 12 | 12 | 17 | 1 | 0 | 0 | 0 | 1 |
| 18 |  | 28 | 20 | 12 | 18 | 1 | 0 | 0 | 1 | 0 |
| 19 |  | 32 | 20 | 12 | 19 | 1 | 0 | 0 | 1 | 1 |
| 20 | 20 | 28 | 12 | 20 | 20 | 1 | 0 | 1 | 0 | 0 |
| 21 |  | 32 | 12 | 20 | 21 | 1 | 0 | 1 | 0 | 1 |
| 22 |  | 28 | 20 | 20 | 22 | 1 | 0 | 1 | 1 | 0 |
| 23 |  | 32 | 20 | 20 | 23 | 1 | 0 | 1 | 1 | 1 |
| 24 |  | 28 | 12 | 28 | 24 | 1 | 1 | 0 | 0 | 0 |
| 25 |  | 32 | 12 | 28 | 25 | 1 | 1 | 0 | 0 | 1 |
| 26 |  | 28 | 20 | 28 | 26 | 1 | 1 | 0 | 1 | 0 |
| 27 |  | 32 | 20 | 28 | 27 | 1 | 1 | 0 | 1 | 1 |
| 28 | 28 | 28 | 20 | 32 | 28 | 1 | 1 | 1 | 0 | 0 |
| 29 |  | 32 | 20 | 32 | 29 | 1 | 1 | 1 | 0 | 1 |
| 30 |  | 28 | 28 | 32 | 30 | 1 | 1 | 1 | 1 | 0 |
| 31 |  | 32 | 28 | 32 | 31 | 1 | 1 | 1 | 1 | 1 |
| 32 | 32 |  |  |  |  |  |  |  |  |  |

FIG. 33

| VOLTAGE LEVELS | REFERENCE VOLTAGE LEVELS | SELECTED VOLTAGES ||| OUTPUT | D4 | D3 | D2 | D1 | D0 |
|---|---|---|---|---|---|---|---|---|---|---|
| | | V(T1) | V(T2) | V(T3) | Vout | | | | | |
| 0 | 0 | 0 | 0 | 0 | 0 | 0 | 0 | 0 | 0 | 0 |
| 1 | | 4 | 0 | 0 | 1 | 0 | 0 | 0 | 0 | 1 |
| 2 | | 0 | 0 | 4 | 2 | 0 | 0 | 0 | 1 | 0 |
| 3 | | 4 | 0 | 4 | 3 | 0 | 0 | 0 | 1 | 1 |
| 4 | 4 | 0 | 16 | 0 | 4 | 0 | 0 | 1 | 0 | 0 |
| 5 | | 4 | 16 | 0 | 5 | 0 | 0 | 1 | 0 | 1 |
| 6 | | 0 | 16 | 4 | 6 | 0 | 0 | 1 | 1 | 0 |
| 7 | | 4 | 16 | 4 | 7 | 0 | 0 | 1 | 1 | 1 |
| 8 | | 4 | 28 | 0 | 8 | 0 | 1 | 0 | 0 | 0 |
| 9 | | 4 | 32 | 0 | 9 | 0 | 1 | 0 | 0 | 1 |
| 10 | | 4 | 28 | 4 | 10 | 0 | 1 | 0 | 1 | 0 |
| 11 | | 4 | 32 | 4 | 11 | 0 | 1 | 0 | 1 | 1 |
| 12 | | 0 | 16 | 16 | 12 | 0 | 1 | 1 | 0 | 0 |
| 13 | | 4 | 16 | 16 | 13 | 0 | 1 | 1 | 0 | 1 |
| 14 | | 0 | 0 | 28 | 14 | 0 | 1 | 1 | 1 | 0 |
| 15 | | 4 | 0 | 28 | 15 | 0 | 1 | 1 | 1 | 1 |
| 16 | 16 | 0 | 32 | 16 | 16 | 1 | 0 | 0 | 0 | 0 |
| 17 | | 4 | 32 | 16 | 17 | 1 | 0 | 0 | 0 | 1 |
| 18 | | 0 | 16 | 28 | 18 | 1 | 0 | 0 | 1 | 0 |
| 19 | | 4 | 16 | 28 | 19 | 1 | 0 | 0 | 1 | 1 |
| 20 | | 0 | 16 | 32 | 20 | 1 | 0 | 1 | 0 | 0 |
| 21 | | 4 | 16 | 32 | 21 | 1 | 0 | 1 | 0 | 1 |
| 22 | | 0 | 32 | 28 | 22 | 1 | 0 | 1 | 1 | 0 |
| 23 | | 4 | 32 | 28 | 23 | 1 | 0 | 1 | 1 | 1 |
| 24 | | 4 | 28 | 32 | 24 | 1 | 1 | 0 | 0 | 0 |
| 25 | | 4 | 32 | 32 | 25 | 1 | 1 | 0 | 0 | 1 |
| 26 | | 16 | 32 | 28 | 26 | 1 | 1 | 0 | 1 | 0 |
| 27 | | 16 | 28 | 32 | 27 | 1 | 1 | 0 | 1 | 1 |
| 28 | 28 | 32 | 16 | 32 | 28 | 1 | 1 | 1 | 0 | 0 |
| 29 | | 32 | 28 | 28 | 29 | 1 | 1 | 1 | 0 | 1 |
| 30 | | 28 | 28 | 32 | 30 | 1 | 1 | 1 | 1 | 0 |
| 31 | | 32 | 28 | 32 | 31 | 1 | 1 | 1 | 1 | 1 |
| 32 | 32 | | | | | | | | | |

DIGITAL TO-ANALOG-CONVERSION CIRCUIT AND DATA DRIVER FOR DISPLAY DEVICE

TECHNICAL FIELD

Description of Related Application

This application is the National Phase of PCT/JP2012/055153, filed Mar. 1, 2012, which claims the benefit of the priority of Japanese patent application No. 2011-047282 filed on Mar. 4, 2011, the disclosures of which are incorporated herein in their entirety by reference thereto.

This invention relates to a digital-to-analog conversion circuit, a data driver and a display unit employing the data driver.

These days, liquid crystal display devices (LCDs), featuring thin thickness, light weight and low power consumption, have become widespread, and are used in increasing numbers not only in a notebook PC or a monitor but also in a large sized liquid crystal television, a multi-function mobile phone or in a tablet type high function information terminal. As the liquid crystal display devices, a liquid crystal display device of the active matrix driving system, capable of high definition display, is widely used. As a thin-thickness display device next to the LCD, a display device of an active matrix driving architecture composed by an organic LED (OLED), featuring self light emission and clear image quality, is now under development.

The following describes example configurations of a thin-thickness display device of the active matrix driving system (a liquid crystal display and an organic LED display) with reference to FIG. 20A, FIG. 20B and FIG. 20C. FIG. 20A is a block diagram illustrating an essential configuration of a thin-thickness display device. FIG. 20B is a block diagram illustrating an essential configuration of a unit pixel of a display panel of a liquid crystal display device. FIG. 20C illustrates a block diagram illustrating an essential configuration of a unit pixel of a display panel of an organic LED display unit. In FIG. 20B and FIG. 20C, unit pixels are shown by schematic equivalent circuits.

Referring to FIG. 20A, a thin-thickness display of the active matrix driving system in general includes a power supply circuit 940, a display controller 950, a display panel 960, a gate driver 970 and a data driver 980. On the display panel 960, a plurality of unit pixels, each including a pixel switch 964 and a display element 963, are arrayed in a matrix pattern. In a color SXGA (Super eXtended Graphics Array), for example, a display screen includes 1280×3 pixel columns by 1024 pixel rows. A scan line 961 that transmits a scan signal output from the gate driver 970 to each unit pixel and a data line 962 that transmits a grayscale voltage signal output from the data driver 980 are provided in a lattice configuration. The gate driver 970 and the data driver 980 are controlled by the display controller 950 and are supplied with a clock signal CLK and a control signal from the display controller 950. Video data is supplied as a digital signal from the display controller 950 to the data driver 980. The power supply circuit 940 necessary supplies powers to the gate driver 970 and to the data driver 980. The display panel 960 is made up by a semiconductor substrate. Especially, in a large screen display device, a semiconductor substrate is in a wide spread use, on which pixel switches, for example, are formed by thin-film transistors (TFTs), with the semiconductor substrate being formed on an insulating substrate, such as a glass substrate or a plastic substrate.

In the above display device, a scan signal is configured to control switching on and off of the pixel switch 964. When the pixel switch 964 is turned on, a grayscale voltage signal corresponding to video data, is applied to the display element 963. The luminance of the display element 963 is changed in response to the grayscale voltage signal to display an image.

Data for one screen is rewritten every one frame period which is about 0.017 second when driven at 60 Hz. Each scan line 961 sequentially selects every pixel row (every line) to turn on pixel switches 964. During the selection period of the pixel row, each data line 962 supplies a grayscale voltage signal via the pixel switch 964 to the display element 963. There are such display devices in which a plurality of pixel rows are selected at the same time by scan lines, or a frame frequency of 120H or even higher is used for driving in order to improve a moving image characteristic.

<Liquid Crystal Display Device>

Referring to FIG. 20A and FIG. 20B, the display panel 960 of the liquid crystal display device includes a semiconductor substrate and an opposing substrate. The semiconductor substrate includes a matrix array of a plurality of pixel switches 964 and a plurality of transparent pixel electrodes 973, as unit pixels. The opposing substrate includes a single planar transparent electrode 974 (opposing substrate electrode). These two substrates are arranged facing each other with a liquid crystal material sealed in between. Note that the display element 963, composing a unit pixel, includes a pixel electrode 973, an opposing substrate electrode 974, a liquid crystal capacitance 971 and an auxiliary capacitance 972. A backlight, not shown, is provided as a light source on a back face of the display panel.

When the pixel switch 964 is turned on (rendered conductive) by the scan signal from the scan line 961, the grayscale voltage signal from the data line 962 is applied to the pixel electrode 973. The backlight transmitted through the liquid crystal material has its transmittance changed due to the potential difference between each pixel electrode 973 and the opposing substrate electrode 974. Even after the pixel switch 964 is turned off (rendered non-conductive), the potential difference is maintained by the liquid crystal capacitance 971 and the auxiliary capacitance 972 for a pre-set period to effect display.

In driving a liquid crystal display device, switching the voltage polarity (positive or negative) with respect to a common voltage of the opposing substrate electrode 974 is usually carried out each frame period from one pixel to another in order to prevent deterioration of the liquid crystal material (inversion driving). Typical of such inversion driving is a dot inversion in which the voltage polarity is made to differ between two neighboring pixels or a column inversion in which the voltage polarity is made to differ between two neighboring data lines. In the dot inversion, grayscale voltage signals of differing voltage polarities are output for every selection period (for every data period) on one data line, whereas, in the column inversion, grayscale voltage signals of differing voltage polarities are output for every frame period.

<Organic LED Display Device>

Referring to FIG. 20A and FIG. 20C, a display panel 960 of an organic LED display device includes a semiconductor substrate on which a plurality of pixel switches 964 as unit pixels, a plurality of organic LEDs 982 and a plurality of thin-film transistors (TFTs) 981, are arranged in a matrix configuration. Each organic LED 982 is formed by an organic film sandwiched between two thin-film electrode layers, and the TFTs control the current to be supplied to the organic LED 982. The TFT 981 and the organic LED 982 are connected in series between power supply terminals 984, 985 supplied with respective different power supply voltages. An auxiliary capacitance 983 holds a control terminal voltage of the TFT 981. Note that the display element 963 for one pixel is made up by the TFT 981, organic LED 982, power supply terminals 984 and 985 and the auxiliary capacitance 983.

When the pixel switch 964 is turned on (rendered conductive) by the scan signal from the scan line 961, the grayscale voltage signal from the data line 962 is applied to a control terminal of the TFT 981. A current corresponding to the grayscale voltage signal is supplied from the TFT 981 to the organic LED 982, which then emits light in keeping with the grayscale voltage signal to effect display. Even after the pixel switch 964 is turned off (rendered non-conductive), the grayscale voltage signal, applied to the control terminal of the TFT 981, is maintained for a pre-set time by the auxiliary capacitance 983 to maintain light emission. Although the pixel switch 964 and the TFT 981 shown herein are each formed by an N-channel transistor, they may also be each formed by P-channel transistors. The organic LED may also be connected to the power supply terminal 984. In the driving of the organic LED display device, no inversion driving, such as is used in a liquid crystal display device, is needed, such that a grayscale voltage signal correlated to a pixel of interest is output to the data line 962 for every selection period (one data period).

In the organic LED device, there is, apart from the above mentioned configuration in which display is done in correspondence with the grayscale voltage signal from the data line 962, a configuration in which display is responsive to a grayscale current signal output from the data driver. In the present description, such a configuration in which display is responsive to a grayscale voltage signal output from the data driver will be explained.

<Digital-to-Analog Conversion Circuit of a Data Driver>

In FIG. 20A, it is only necessary for the gate driver 970 to supply an at least two-valued scan signal. It is however necessary for the data driver 980 to drive each data line 962 with a multi-valued grayscale voltage signal which is in keeping with the number of grayscales. For this reason, the data driver 980 includes a digital-to-analog conversion circuit provided with a decoder configured to transform video data to the grayscale voltage signal and an amplifier circuit configured to amplify and output the grayscale voltage signal to each data line 962.

In high-end mobile equipment including a thin-thickness display device, such as a multi-function mobile phone, a high function tablet information terminal, a notebook personal computer, a monitor or a television receiver, the tendency is towards higher image quality, viz., towards a larger number of grayscales. At present, display devices in the mainstream are designed to cope with video data signals of eight bits for each of R, G and B (about 16800000 colors). There may further be a demand for a display device designed to cope with a 10-bit video data signal for about 1100000000 colors or more. Especially, in an organic LED display device, featuring a high image quality, there is an increasing demand for the 10-bit video data signal.

In the data driver configured to output a grayscale voltage signal corresponding to a multi-bit, such as 10-bit, a larger number of reference voltages that correspond to the number of grayscales are needed as reference voltages supplied to the digital-to-analog conversion circuit which transforms the video data signal to a grayscale signal. As a result, the number of the reference voltage wirings also increases.

The number of switch transistors provided in a decoder configured to select a voltage corresponding to the video data signal from among larger number of reference voltages also increases.

Namely, the progress towards the larger number of grayscale levels (10 or more bits) leads to an increase in an area of a decoder in a digital-to-analog conversion circuit, thus raising a cost of the data driver.

An area of the digital-to-analog conversion circuit, receiving a multi-bit video data signal, depends on a decoder configuration. There is thus a demand for a technique which possibly reduces the area of the decoder.

As a related technique reduce an area of the decoder, there is known a digital-to-analog conversion circuit that exploits an interpolation type operational amplifier to reduce the number of reference voltages and the number of switching transistors in a decoder configuration. As this sort of the related technique, Patent Literature 1 (JP Patent Kokai Publication No. JP2002-43944A) shows a configuration shown in FIG. 21 and FIG. 22 which correspond respectively to FIG. 1 and FIG. 4 of Patent Literature 1. Note that reference symbols for constituent elements used in FIG. 21 are changed from those used in FIG. 1 of Patent Literature 1.

In FIG. 21, a DA converter 310 converts a 6-bit digital signal (Bit5 to Bit0) to 64 grayscale voltage levels. More specifically, the DA converter includes a reference voltage generating circuit 318, a selection circuit 316 and a voltage follower circuit 317. The reference voltage generating circuit generates reference voltages at 17 different voltage levels of from 0th to 64th grayscales at an interval of four grayscales. The selection circuit selects two neighboring ones of the reference voltages, depending on a 6-bit digital signal (Bit5 to Bit0), and outputs the so selected reference voltages to three terminals (IN3, IN2, IN1) of the voltage follower circuit 317. The voltage follower circuit performs predetermined weighted operations on voltages (VIN3, VIN2, VIN1) supplied at its three terminals to output a voltage level from one of the two reference voltages and three voltage levels obtained by linear interpolation of the two reference voltages, totaling at four voltage levels. The voltage follower circuit 317 is an operational amplifier whose non-inverting input terminal is supplied with an input signal and whose output terminal is connected to its inverting input terminal.

The selection circuit 316 includes a reference voltage selection circuit 316a that selects two reference voltages, neighboring to each other in their voltage levels, based on upper bits Bit5 to Bit2 of the digital signal. The selection circuit 316 also includes a generating voltage selection circuit 316b that outputs one or both of the two reference voltages, as selected by the reference voltage selection circuit 316a, to the three terminals (IN1, IN2 and IN3) of the voltage follower circuit 317, based on the lower bits Bit 0, Bit 1. In the reference voltage selection circuit 316a, selection is sequentially executed from the upper bit side (Bit5) towards the lower bit side (Bit 0). Specifically, a switch SW (5, 1), controlled on/off by Bit5, selects one of V0 and V32, and a switch SW (5, 2), controlled on/off by Bit 5, selects one of V4 and V36. A switch (4, 1), controlled on/off by Bit4, lower by one bit than Bit5, selects one of an output of switch (5, 1) and an output of the switch SW (5, 5) that selects one of V16 and V48. A switch (3, 1), controlled on/off by Bit3, lower by one bit from Bit4, selects one of an output of switch (4, 1) and an output of switch (4, 3), and a switch (2, 1), controlled on/off by Bit2, lower by one bit from Bit3, selects one of an output of switch (3, 1) and an output of the switch SW (3, 2). Lower side two bits Bit1 and Bit0 (least significant bit) select one of allocation combinations to the three terminals (IN3, IN2, IN1) of the voltage follower circuit 317 from two outputs of SW(2, 1) and SW(2, 2).

FIG. 22 is a diagram illustrating the relationship among the 6-bit digital signals (Bit5 to Bit0), outputs from the selection circuit 316 to the three terminals (IN3, IN2, IN1) of the voltage follower circuit 317, and the output voltage Vout of the voltage follower circuit 317 in the DA converter 310 of FIG. 21. It is seen from FIG. 22 that, in case voltages of grayscale 0 to grayscale 3, for example, are output as output voltage Vout, the selection circuit 316 supplies (V0, V0, V0),
(V0, V4, V0),
(V0, V0, V4) and
(V0, V4, V4)

to the three terminals (IN3, IN2, IN1). Namely, one or both of two neighboring voltages V0 and V4 are selected at the three terminals (IN3, IN2, IN1), such that one of the two reference voltages is selected and output in duplicates to at least two of the three terminals.

The voltage follower circuit 317 performs weighted operation on the voltages at the three terminals (VIN3, VIN2, VIN1) at the weighting ratio of 1:1:2. These weighted operations, also termed weighted average operation or weighted summation, yield a voltage represented by the following equation as output voltage Vout:

$$Vout=(VIN3+VIN2+VIN1\times 2)/4 \quad (1)$$

Thus, if the grayscales 0, 1, 2 and 3 are to be output,
(V0, V0, V0),
(V0, V4, V0),
(V0, V0, V4) and
(V0, V4, V4)
are supplied from the neighboring two reference voltages V0 and V4 to the three terminals (IN3, IN2, IN1) of the voltage follower circuit 317. Output voltages Vout, corresponding to the grayscales 0, 1, 2 and 3, are respectively at four voltage levels
(V0+V0+2×V0)/4=V0
(V0+V4+2×V0)/4=(3×V0+V4)/4,
(V0+V0+2×V4)/4=(2×V0+2×V4)/4, and
(V0+V4+2×V4)/4=(V0+3×V4)/4,
where the four voltage levels represent linear interpolation of the reference voltages V0 and V4.

The operation of from the grayscale 4 onward is similar to that of the grayscales 0 to 3 described above. That is to say, when the (4j)th to (4j+3)rd grayscales, where j denotes integers from 1 to 15, are to be output,
(V(4j), V(4j), V(4j)),
(V(4j), V(4j+4), V(4j)),
(V(4j), V(4j), V(4j+4)) and
(V(4j), V(4j+4), V(4j+4))
are supplied from the neighboring reference voltages V(4j) and V(4j+4) to the three terminals (IN3, IN2, IN1) of the voltage follower circuit 317. The output voltages Vout takes one of the four voltage levels including the reference voltage V(4j) and three voltage levels obtained by linear interpolation of the reference voltages V(4j) and V(4j+4):
V(4j),
(3×V(4j)+V(4j+4))/4,
(2×V(4j)+2×V(4j+4))/4 and
(V(4j)+3×V(4j+4))/4.

Patent Literature 1 shows a concrete example of the voltage follower circuit 317. FIG. 23 illustrates a configuration disclosed in FIG. 2 of Patent Literature 1. This voltage follower circuit includes a first differential pair (NMOS transistor pair N1, N2) having coupled sources connected to a first current source (NMOS transistor N9) and having gates connected to IN1 and OUT;

a second differential pair (NMOS transistor pair N3, N4) having coupled sources connected to a second current source (NMOS transistor N10) and having gates connected to IN1 and OUT;

a third differential pair (NMOS transistor pair N5, N6) having coupled sources connected to a third current source (NMOS transistor N11) and having gates connected to IN2 and OUT; and a fourth differential pair (NMOS transistor pair N7, N8) having coupled sources connected to a fourth current source (NMOS transistor N12) and having gates connected to IN3 and OUT.

The NMOS transistors N1, N3, N5 and N7 have drains connected to the drain of a PMOS transistor P1 of an active load circuit (current mirror), and the NMOS transistors N2, N4, N6 and N8 have drains connected to the drain and the gate of a PMOS transistor P2 of the active load circuit (current mirror). The sources of the PMOS transistors P1 and P2 are connected in common to a power supply terminal. There is also provided a PMOS transistor P3 that has a source connected to a power supply terminal, has a drain connected to an output terminal. OUT, and has a gate connected to a junction node of the drains of the PMOS transistor P1 and the NMOS transistors N1, N3, N5 and N7. There is also provided an NMOS transistor N13 that has a source grounded, has a gate connected to a bias voltage terminal INf, and has a drain connected to OUT. The first to fourth current source transistors N9 to N12 have sources grounded and have gates connected to the bias voltage terminal INf.

Assuming that
ΔV1 (=VIN1−VOUT),
ΔV1,
ΔV2 (=VIN2−VOUT) and
ΔV3 (=VIN3−VOUT)
are differential voltages supplied to the first to fourth differential pairs, respectively, and gm is the mutual conductance of the first to fourth differential pairs, differential output currents of the first to fourth differential pairs ΔI1, ΔI2, ΔI3 and ΔI4 are given respectively by
ΔI1=I1−I2=gm ΔV1,
ΔI12=I3−I4=gm ΔV1,
ΔI3=I5−I6=gm ΔV2, and
ΔI4=I7−I8=gm ΔV3.
From
IL1=I1+I3+I5+I7,
IL2=I2+I4+I6+I8, and
IL1=IL2 (input current to current mirror P1, P2=its output current), ΔV1+ΔV1+ΔV2+ΔV3=0, i.e., (VIN1−VOUT)+(VIN1−VOUT)+(VIN2−VOUT)+
(VIN3−VOUT)=0 so that the above equation (1) holds.

It should be noted that, in FIG. 21 and FIG. 22, the selection circuit, voltage follower circuit, reference voltages and the DA converter are respectively referred to in the exemplary embodiments of the present description as a decoder, a differential amplifier (operational amplifier), reference voltages and a digital-to-analog conversion circuit, respectively.

PATENT LITERATURE

[PTL 1]
JP Patent Kokai Publication No. JP2002-43944A

SUMMARY

Technical Problem

The following is an analysis of the related technique from the side of the present invention.

In the related technique, shown in FIG. 21, the digital-to-analog conversion circuit (DA converter 310) is able to select two neighboring reference voltages, from reference voltages differing at steps of four levels (reference voltages V0, V4, V8, ..., V60, V64), and to output one out of the reference voltage and three voltage levels obtained by linear interpolation of the two neighboring reference voltages, totaling at four voltage levels.

The total number of the reference voltages is equal one-fourth of the number of output voltage levels (grayscale voltages) plus 1. In a case where the related technique is expanded to such a configuration where 10-bit digital data is supplied, the number of reference voltages needed is 257 with the number of the output voltage levels being 1024. In a case where e the related technique is expanded to such a configuration where 12-bit digital data is supplied, the number of reference voltages needed is 1025, with the number of the output voltage levels being 4096. For digital data with more than 10-bits, larger number of the reference voltages are needed and hence the number of switches to select the reference voltages is correspondingly increased. Hence, the decoder area is increased, so that a chip that has loaded thereon a digital-to-analog conversion circuit becomes costly.

The reference voltages generated may be taken at intervals of eight levels and seven voltage levels may be used to linearly interpolate two neighboring reference voltages. In this case, the total number of the reference voltages is one-eighth of the output voltage levels plus 1. By so doing, the number of the reference voltages may be decreased. However, in such case, it is necessary to use eight differential pairs in an interpolation amplifier (voltage follower circuit 317). This results in the increasing in the area of the interpolation amplifier.

The following discloses a digital-to-analog conversion circuit in which the number of input reference voltages may be decreased in comparison with the number of voltage levels output in correspondence with multi-bit digital data to suppress increase in a circuit area or to reduce the circuit area. A driver including said digital-to-analog conversion circuit and a display device including said driver are also disclosed.

In order to provide a solution to the above problem, the disclosure of the present Application may be summarized as follows:

In one aspect, there is disclosed a digital-to-analog conversion circuit comprising:

a first decoder that receives N number of reference voltages and an n-bit digital signal (n being a predetermined integer not less than 4) to select first to third voltages from the N number of reference voltages in accordance with the n-bit digital signal; and an operational amplifier that receives the first to third voltages selected by the first decoder to output a voltage level corresponding to operation of (first voltage+second voltage+2×third voltage)/4;
wherein for respective $2^n$ (^ being a power operator) number of combinations of the n-bit digital signal, $2^n$ number of voltage levels from Ath level, as a base level, to $(A-1+2^n)$th level, are able to be output from the operational amplifier, wherein the N number of reference voltages include:

for the Ath level to the $(A-1+2^n)$th level of the $2^n$ number of output voltage levels, four number of reference voltages including the Ath level, $(A+4)$th level, $(A-4+2^n)$ level, and $(A+2^n)$ level, out of $\{1+2^{(n-2)}\}$ number of reference voltages corresponding to voltage levels: A+4k (where k is an integer from 0 to $2^{(n-2)}$) that are spaced each other at an interval of 4 levels from the Ath level; and at most $\{-4+2^{(n-2)}\}$ number of reference voltages, obtained by decimating at least one predetermined reference voltage from $\{-3+2^{(n-2)}\}$ number of reference voltages that are other than the four number of reference voltages out of the $\{2^{(n-2)}+1\}$ reference voltages corresponding to the voltage levels spaced apart at an interval of 4 levels from the Ath level, and wherein N is not less than 4 and not more than $2^{(n-2)}$.

There is also provided a data driver including a digital-to-analog conversion circuit that receives an input digital signal corresponding to an input video signal to output a voltage corresponding to the input digital signal, wherein the data driver drives a data line at a voltage corresponding to the input digital signal; a pixel switch and a display element at an intersection of a data line and a scan line, and wherein a signal on the data line is written in the display element via the pixel switch turned on by the scan line. The display device includes the data driver to drive the data line.

In the above indicated digital-to-analog conversion circuit, disclosed in the present Application, the number of reference voltages supplied to a decoder may be appreciably decreased to cope with the use of multi-bit digital signal, thereby suppressing the number of transistor switches in the decoder to from increasing such as reduce the circuit area.

Moreover in the data driver disclosed in the present Application, the number of reference voltages supplied to the decoder may be suppressed from increasing to cope With the use of a multi-bit digital signal with larger number of bits to enable the circuit area and hence the costs of the data driver to be reduced. In addition, the costs of the display device making use of the data driver may be reduced.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2A, FIG. 2B are diagrams explaining a first specification of the first exemplary embodiment.

FIG. 3 is a diagram explaining a second specification of the first exemplary embodiment.

FIG. 4 is a diagram explaining the second specification of the first exemplary embodiment.

FIG. 5 is a diagram explaining a third specification of the first exemplary embodiment.

FIG. 6 is a diagram explaining the third specification of the first exemplary embodiment.

FIG. 7 is a diagram explaining a fourth specification of the first exemplary embodiment.

FIG. 8 is a diagram explaining the fourth specification of the first exemplary embodiment.

FIG. 9 is a diagram explaining a fifth specification of the first exemplary embodiment.

FIG. 10 is a diagram explaining the fifth specification of the first exemplary embodiment.

FIG. 11 is a diagram explaining a sixth specification of the first exemplary embodiment.

FIG. 12 is a diagram explaining the sixth specification of the first exemplary embodiment.

FIG. 13 is a diagram explaining a seventh specification of the first exemplary embodiment.

FIG. 14 is a diagram explaining the seventh specification of the first exemplary embodiment.

FIG. 16 is a diagram explaining a first specification of the second exemplary embodiment.

FIG. 17 is a diagram explaining a second specification of the second exemplary embodiment.

FIG. 18 is a diagram explaining respective specifications of a 10-bit digital-to-analog conversion circuit compares one another.

FIG. 21 is a circuit diagram corresponding to FIG. 1 of Patent Literature 1 as related technique.

FIG. 22 is a diagram corresponding to FIG. 4 of Patent literature 1 as related technique.

FIG. 25 is a diagram explaining a specification of a first example.

FIG. 29 is a diagram explaining a specification of a modification of the first example.

FIG. 31 is a diagram explaining a specification of a second example.

FIG. 33 is a diagram explaining a specification of a third example.

MODES

The following describes preferred modes with reference to the drawings. In preferred modes, there are provided a first decoder (10) that receives N number of reference voltages ($4 \leq N < 1+2^{(n-2)}$, where ^ is a power operator, n is a positive number not less than 4), and an n-bit digital signal, and that selects first to third voltages (V(T1), V(T2), V(T3)) from the N number of reference voltages in accordance with the n-bit digital signal, and an operational amplifier (60) that receives the first to third voltages to output a voltage level obtained by an operation of the first to third voltages with weighting factor of 1:1:2.

In the preferred modes, for $2^n$ number of voltage levels: Ath level, (A+1)th level, ..., (A−1+$2^n$)th level (where Ath level is any base level), that are able to be output from the operational amplifier in a one-to-one correspondence with the value of the n-bit digital signal, the N number of reference voltages include, four number of reference voltages (these four number of reference voltages not being to be decimated) including Ath level, (A+4)th level, (A−4+$2^n$) level, and (A+$2^n$) level, out of $\{1+2^{(n-2)}\}$ number of reference voltages corresponding to voltage levels: A+4k (where k is an integer from 0 to $2^{(n-2)}$) that are spaced each other at an interval of 4 levels from the Ath level; and at most $\{-4+2^{(n-2)}\}$ number of reference voltages which are obtained by decimating at least one predetermined reference voltage from $\{-3+2^{(n-2)}\}$ number of reference voltages that are other than the four number of reference voltages out of the $\{2^{(n-2)}+1\}$ reference voltages corresponding to the voltage levels spaced apart at an interval of 4 levels from the Ath level. Hence, the number of the reference voltages N is not less than 4 and is $4+\{-4+2^{(n-2)}\}=2^{(n-2)}$ or less.

In the preferred mode, the voltage levels output from the operational amplifier (60) include voltage levels output based on three reference voltages different to each other, selected as the first to third (V(T1), V(T2), V(T3)) in the first decoder (10). Several illustrative exemplary embodiments will be hereinafter described.

First Exemplary Embodiment

Figure 1:
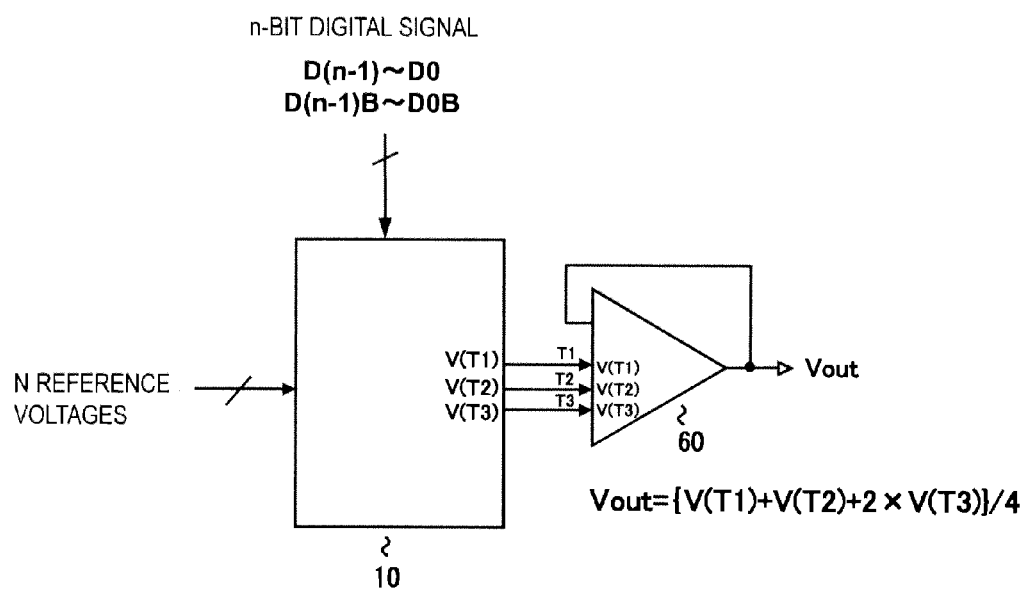
FIG. 1 is a diagram illustrating a first exemplary embodiment.

FIG. 1 shows a digital-to-analog conversion circuit according to a first exemplary embodiment. Referring to FIG. 1, the digital-to-analog conversion circuit includes:

a first decoder 10 that receives N number of reference voltages (where $4 \leq N < 1+2^{(n-2)}$, A being a power operator) and n being a pre-set positive number not less than 4), a n-bit digital signal (D(n−1) to D0 and complementary signal D(n−1)B to D0B), and selects first to third voltages (V(T1), V(T2) and V(T3)), from the N-number of the reference voltages, in accordance with the n-bit digital signal, and an operational amplifier 60 that receives the first to third voltages (V(T1), V(T2) and V(T3)) at its three input terminals (non-inverting input terminals) and performs weighted operation to the first to third voltages with factor of 1:1:2 to output a resulting voltage level Vout. Note that, in the n-bit digital signal (D(n−1) to D0), D0 is an LSB (Least Significant Bit) and D(n−1) is an MSB (Most Significant Bit).

The operational amplifier 60 has an output terminal thereof connected in a feedback configuration to an inverting input terminal thereof and performs the operation (interpolation operation) according to the following equation (2):

$$V\text{out} = \{V(T1) + V(T2) + 2 \times V(T3)\}/4 \tag{2}$$

Figure 23:
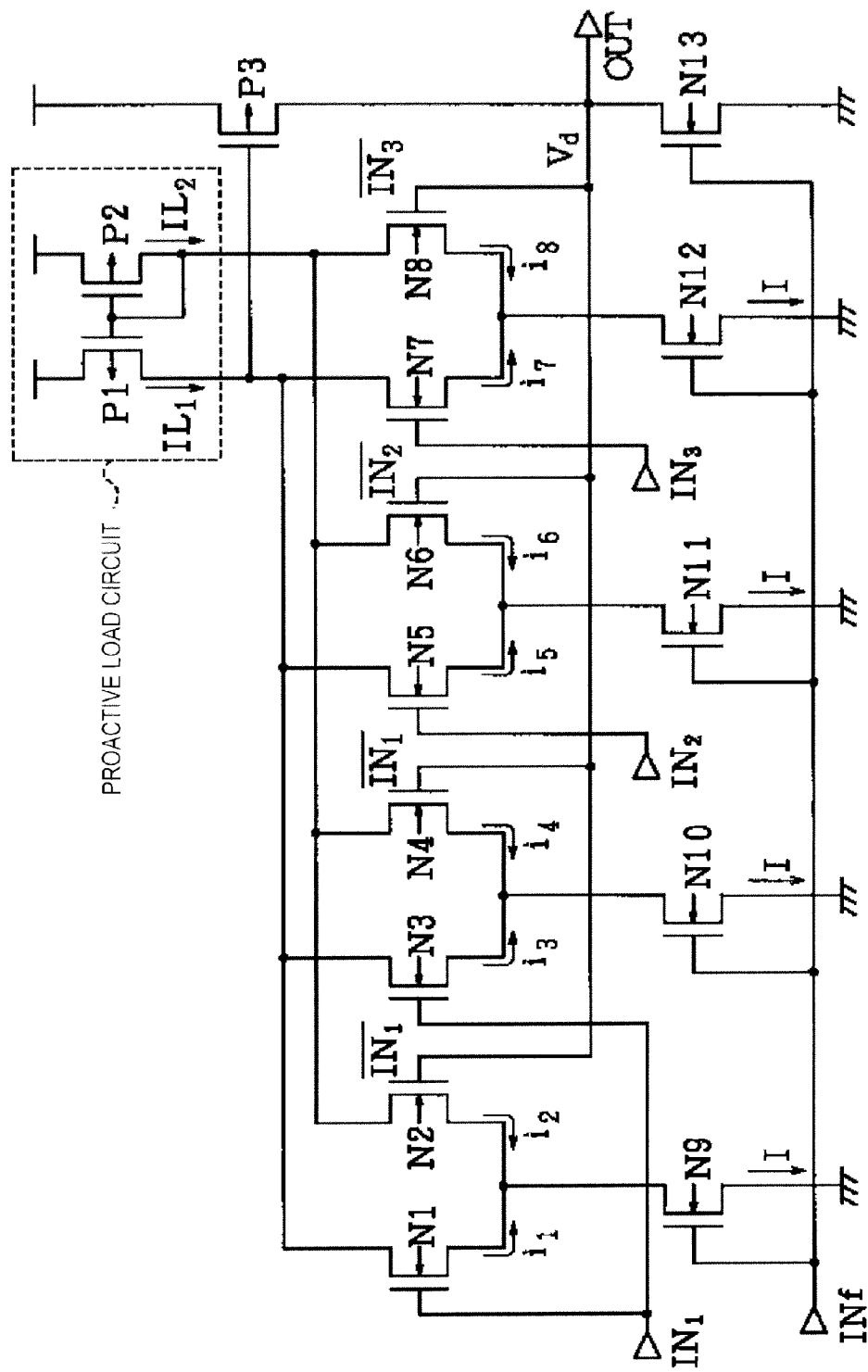
FIG. 23 is a circuit diagram corresponding to FIG. 2 of Patent Literature 1 as related technique.

The equation (2) is an operational expression in which V(T1), V(T2) and V(T3) correspond to VIN3, VIN2 and VIN1 of the above equation (I), respectively. In case wherein the circuit of FIG. 23 is used as the operational amplifier 60, the voltage VT(3) is applied in common to a gate (IN1) of an NMOS transistor N1 of the first differential pair (N1, N2) and to a gate (IN1) of an NMOS transistor N3 of the second differential pair (N3, N4), with the two gates (IN1) of the NMOS transistors (N1 and N2) constituting a third terminal (T3). The voltage V(T2) is applied to a gate (IN2) of an NMOS transistor N5 of the third differential pair (N5, N6), with the gate (IN2) constituting a second terminal T2. The voltage V(T1) is applied to a gate (IN3) of an NMOS transistor N7 of the fourth differential pair (N7, N8), with the gate (IN3) constituting a first terminal T1. Note that an interpolation amplifier of any suitable configuration may be used as the operational amplifier 60 provided that it is able to perform a weighted operation (weighted summation or weighted average operation) on the voltage V(T1) at the first terminal (T1), the voltage V(T2) at the second terminal (T2) and the voltage V(T3) at the third terminal (T3) with a weighting factor of 1:1:2 to output a resulting voltage level Vout.

N number of reference voltages ($4 \leq N < 1+2^{(n-2)}$) are supplied to the first decoder 10. For $2^n$ number of voltage levels: Ath-level, (A+1)st level, (A+2)nd level, ... (A−1+$2^n$)th level (where A is any selected base level) that are able to be output from the operational amplifier 60 and in one-to-one correspondence with the n-hit digital signal, out of $\{2^{(n-2)}+1\}$ number of reference voltages corresponding to voltage levels: A+4k (where k is an integer from 0 to $2^{(n-2)}$) that are spaced each other at an interval of 4 levels from the Ath level, four number of reference voltages corresponding respectively to:
the Ath level;
the (A+4)th level;
the (A−4+$2^n$); and
the (A+$2^n$), are not subject to decimation and included just as they are in the N number of reference voltages. From the $\{-3+2^{(n-2)}+1\}$ reference voltages other than these four number of reference voltages out of the $\{2^{(n-2)}+1\}$ reference voltages corresponding to the voltage levels spaced apart at an interval of 4 levels from the Ath level [($2^{(n-2)}+1-4=-3+2^{(n-2)}+1$)], a pre-set number (one or more) of the reference voltages is decimated. In case where the one or more reference voltages is decimated, the number of the reference voltages that are targeted for decimation and left over (after decimation) is $\{-4+2^{(n-2)}\}$ or less. The sum of the number of the reference voltages thus left over and the number (equal to 4) of the reference voltages not targeted for decimation is equal to the number N of the reference voltages, where N is not less than 4 and not greater than $2^{(n-2)}$.

For example, in case of n=4, N is 4 from $4 \leq N < 1+2^{(n-2)}=1+2^2=5$. The reference voltages, in case of N=4, are 0th level (base level), 4th level, 12th level and the 16th level. For $2^4=16$ number of voltage levels: 0th level (base level), 1st level, ..., 15th level, which are in one-to-one correspondence with the values of the 4-bit digital signal, out of $\{2^{(4-2)}+1\}=5$ number of reference voltages corresponding to 0th level and levels spaced each other at an interval of four levels from the 0th level: 0th, 4th, 8th level, 12th and 16th levels,
the Ath level=0th level;
the (A+4)th level=4th level;
the (A−4+$2^n$)th level=12th level and
the (A+$2^n$)th level=16th level
totaling at four number of reference voltages are not decimated. From the $\{-3+2^{(4-2)}\}=1$ other than the four number of reference voltages out of $\{2^{(4-2)}+1\}$, the reference voltage corresponding to a pre-set number (not less than one), hence the reference voltage corresponding to the 8th level, is decimated.

The number of remaining reference voltages targeted for decimation is $\{-4+2^{(n-2)}\}=0$. Hence, the reference voltages in case of N=4 are composed by the 0th, fourth, 12th and 16th levels.

It should be noted that the voltage levels Vout output from the operational amplifier 60, include at least two voltage levels that are amplified and output based on three reference voltages different to each other, which are selected as first to third voltages (V(T1), V(T2) and V(T3)) by the first decoder 10. That is to say, at least two voltage levels, output from the operational amplifier 60, are generated from three voltages (V(T1), V(T2) and V(T3)), where V(T1)≠V(T2) and V(T1)≠V(T3) and V(T2)≠V(T3).

<Difference from the Related Technique of FIG. 21>

The following describes the difference points between the present exemplary embodiment of FIG. 1 and the digital-to-analog conversion circuit (DA converter 310) of FIG. 21.

In the related technique of FIG. 21, the decoder (selection circuit 316) selects three voltages that are supplied to the three terminals (IN3, IN2, IN1) of the voltage follower circuit 317, from the same or neighboring two reference voltages.

In contrast, in the present exemplary embodiment of FIG. 1, the first decoder 10 is configured to select as the first, second and third voltages (V(T1), V(T2), V(T3)), not only the same or neighboring two reference voltages (a neighboring reference voltage pair), but also two or three reference voltages including also a set other than the neighboring voltages. With this configuration, it is possible to decrease the total number of reference voltages in comparison with that of the related technique in which the reference voltages are spaced apart from one another at an interval of four levels. That is to say, it is possible in the present exemplary embodiment to further decrease the total number of reference voltages, as compared with that of the related technique of FIG. 21, with a resolution of a digital-to-analog conversion circuit remaining the same, in the case where it is assumed that the number of bits of the digital signal in the present exemplary embodiment is the same as that in the related technique of FIG. 21 and the number of output grayscales in the present exemplary embodiment is the same as that in the related technique of FIG. 21.

Moreover, in the related technique of FIG. 21, at least two of three voltages, selected and output from the decoder (selection circuit 316) to the three terminals IN3, IN2 and IN1 of the voltage follower circuit 317, are the same voltages in duplicates (or in triplicates). That is, in the related technique of FIG. 21, three respectively different reference voltages are not selected at the three terminals IN3, IN2 and IN1 of the voltage follower circuit 317, such that there is no output voltage level amplified and output based on three reference voltages different to each other.

In contrast, in the present exemplary embodiment, there are a plurality of output voltage levels amplified and output based on three reference voltages different to each other, as the first to third voltages (V(T1), V(T2), V(T3)) selected by the first decoder 10. That is, as will be described in detail later, there are some number of output voltage levels from the operational amplifier 60 that are generated from (V(T1), V(T2), V(T3)), where V(T1)≠V(T2) and V(T1)≠V(T3) and V(T2)≠V(T3), as the first to third voltages supplied as input to the operational amplifier 60.

First Specification of the First Exemplary Embodiment

FIG. 2A and FIG. 2B illustrate a first specification of the exemplary embodiment of FIG. 1. In an instance shown in FIG. 2A, n, N and A in FIG. 1 are set to n=4, N=4 and A=0. For a section of 16 voltage levels of from 0th level to the 15th level, which can be output from the operational amplifier 60 with one-to-one correspondence with values of the 4-bit digital signal, four number of reference voltages are set to 0th level, 4th level, 12th level and 16th level.

Of the reference voltages corresponding voltage levels from the 0th level, spaced apart at an interval of 4 levels: 4k (where k is an integer from 0 to 4), the reference voltage corresponding to the 8th level is decimated (the reference voltage corresponding to the 8th level is unneeded). It should be noted that the 0th level through to the 16th level of output voltage levels are of a substantially linear voltage level which monotonously increases or decreases depending on the order of the level number (0, 1, 2 and so on). It should also be noticed that the respective numbers (0 through to 15) of the 0th level through to 15th level of the output voltage levels correspond to neighboring values of the 4-bit digital signal (binary codes of lower order bits including the LSB)). A difference voltage between the neighboring voltage level corresponds to a quantization step width of the digital-to-analog conversion circuit, that is, a step width of 1 LSB. The quantization step width is substantially uniform for the 0th through to 15th level (DNL (Differential Non-linearity) being constant).

FIG. 2B illustrates a list of voltage levels, as defined by the above equation (2), of the output Vout of the operational amplifier 60 that receives combinations of three voltages selected from the four number of reference voltages (0th, 4th, 12th and 16th levels) as set in FIG. 2A. These three voltages of the voltage combinations are the first to third voltages (V(T1), V(T2), V(T3)). The list shows all combinations of the four number of reference voltages (levels 0, and 16).

If the first and second voltages V(T1) and V(T2) are interchanged, the results of the operations remain unchanged. Hence, in FIG. 2B, the magnitude relationship of the voltage levels is shown as V(T1)>V(T2). That is, FIG. 2B shows 40 out of 4×4×4=64 combinations of allocating four voltages (levels 0, 4, 12 and 16) to three terminals, inclusive of overlapping. The 40 combinations are obtained by omitting the combinations where V(T1)<V(T2): (V(T1), V(T2))=(levels 0, 4), (levels 0, 12), (levels 0, 16), (levels 4, 12), (levels 4, 16) and (levels 12, 16), from the 64 combinations. Note that, in FIG. 2B, the voltages selected as V(T1) and V(T2) may be interchanged.

Referring to FIG. 2B, since the voltages selected as V(T1) and V(T2) are interchangeable, the combinations of (V(T1), V(T2), VT(3)) may include the combinations (V(T2), V(T1)), in which V(T1) and V(T2) are interchanged, in addition to the combinations shown in FIG. 2B. The same applies for the cases of FIGS. 4, 6, 8, 10, 12 and 14 which will be described subsequently.

From FIG. 2B, it is seen that the whole levels from the 0th to the 15th levels are present as voltage levels of Vout output from the operational amplifier 60, and that the 16 voltage levels of from the 0th to the 15th levels may be output from the four number of reference voltages as set in FIG. 2A. Note that the 16th level of FIG. 2B corresponds to the 0th level of the second section, for the first to third voltages (V(T1), V(T2), V(T3)) are all set to the 16th level.

The combinations of the first to third voltages (V(T1), V(T2), V(T3)), outputting the 5th and 11th levels, are respectively, (V(T1), V(T2), V(T3))=(levels 16, 4, 0) and (levels 12, 0, 4). These combination are composed by three reference voltages of (V(T1), V(T2), V(T3)) with respective different voltage levels combined together. The first to third voltages (V(T1), V(T2), V(T3)), outputting each of the 5th and 11th levels, thus differ to each other, such that there is no combination in which the same reference voltage is used in duplicates or triplicates.

The first decoder 10 of FIG. 1 is configured to select one of the combinations of the first to third voltages (V(T1), V(T2), V(T3)) (see FIG. 2B), corresponding to voltage levels of from the 0th to the 15th levels, output from the operational amplifier 60, depending on the value of the 4-bit signal.

One of the combinations of (V(T1), V(T2), V(T3)), corresponding to the 16 voltage levels 0, 1, 2, . . . , and 15 of Vout of FIG. 2B, is selected, using the 4-bit digital signal. For example, for Vout=5 (5th level), selection is made from the four number of reference voltages of the 0th, 4th, 8th and 16th levels, based on the 4-bit digital signal (D3, D2, D1, D0)=(0, 1, 0, 1), such that the 16th level, 4th level and 0th level are selected for the first voltage V(T1), the second voltage V(T2) and the third voltage V(T3), respectively. Or, the 12th level, 0th level and 4th level are selected for the first voltage V(T1), the second voltage V(T2) and the third voltage V(T3), respectively.

FIG. 2A illustrates a single section composed by 16 voltage levels of from the 0th level to the 15th level, in order to cope with 4-bit 16-level output voltages and the reference voltages, only for simplicity of explanation. It is however also possible to provide one or more additional sections for 5-bit 32-level or 6-bit 64-level configuration, and to set reference voltages for these additional sections in the same way as in the single section of from the 0th to the 15th levels. In such cases, the 16th level reference voltage for a given section is at the same voltage level as the 0th level reference voltage of the next section.

A decoder corresponding to a 10-bit digital signal may be configured by 16 levels (for one section)×64 (sections). In this case, a reference voltage may be decimated for each section and a total of 64 reference voltages may be decimated for 64 sections in comparison with the configuration of the related technique (the configuration in which the configuration of FIG. 21 and FIG. 22 are expanded to cope with the 10-bit).

FIG. 2A illustrates a case of consecutive 16 levels (level 0 to level 15), as output levels, in which the 0th level is set to a base level (Ath level). The Ath level may also be set to a 32nd level or to a 48th level so that the section is comprised of consecutive 16 levels of levels 32 to 47 or 48 to 63, the 16 levels then forming a portion of a larger number of voltage levels. In this case, the base level of a section is preferably set to the first voltage level of the section having 16 voltage levels as a unit.

Second Specification of the First Exemplary Embodiment

Figure 4:
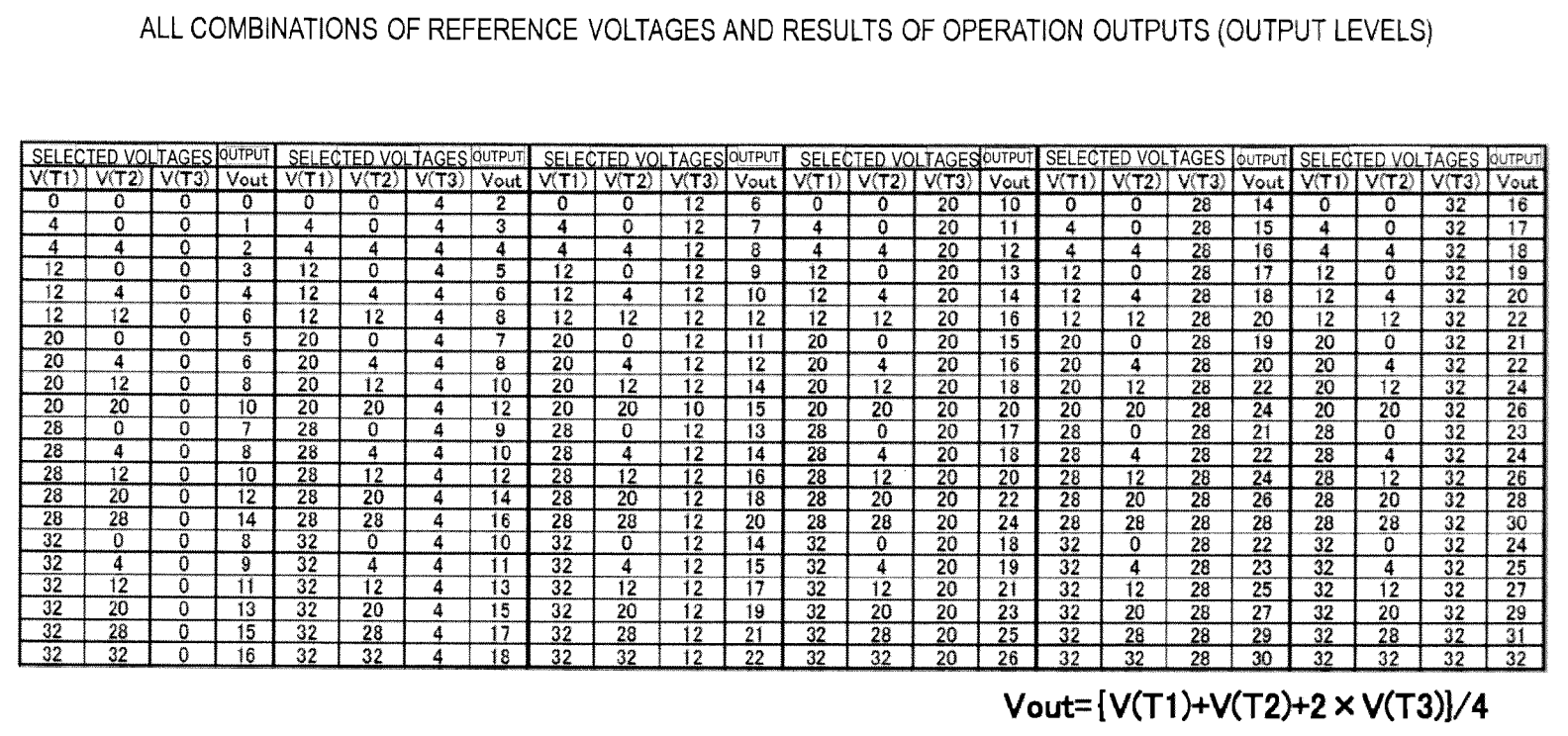

FIG. 3 and FIG. 4 illustrate a second specification in the exemplary embodiment of FIG. 1. FIG. 3 shows an instance in which n, N and A in FIG. 1 are set to n=5, N=6 and A=0. One section is made up by 32 voltage levels of from the 0th to the 31st levels which are in one-to-one correspondence with the values of the 5-bit digital signal. These voltage levels can be output from the operational amplifier 60. For this section, six reference voltages are set at 0th level, 4th level, a 12th level, a 20th level, a 28th level and a 32nd level. From the reference voltages corresponding to voltage levels 4k (where k is an integer from 0 to 8) that are spaced each other at an interval of 4 levels from the 0th level, three reference voltages corresponding to the 8th level, 16th level and 24th level (k=2, 4, 6) are decimated. Note that the 0th to the 32nd levels represent voltage levels are substantially linear voltage levels and monotonously increasing or decreasing voltage levels.

FIG. 4 shows voltage levels that are able to be output from the operational amplifier 60 when the six reference voltages (0th, 4th, 12th, 20th level, 28th and the 32nd levels), as set for the specification of FIG. 3, are combined together as the first to third voltages (V(T1), V(T2). V(T3)) in accordance with the above equation (2). Note that FIG. 4 shows an entirety of the combinations of the six reference voltages.

It is seen from FIG. 4 that a total of the voltage levels of from 0th level to the 31st levels exists as the voltage levels output from the operational amplifier 60, such that 32 voltage levels of from the 0th level to the 31st level can be output by the six reference voltages, that is, 0th, 4th, 12th, 20th level, 28th and 32nd levels, as set in FIG. 3.

The combinations of the first to third voltages (V(T1), V(T2), V(T3)), for outputting the 13th and 19th levels, respectively, are the combinations of the first to third reference voltages differing to each other in level. When these voltage levels (13th and 19th levels) are output, the first to third voltages (V(T1), V(T2), V(T3)) differ to each other, such that there are no combinations of the same overlapping reference voltages.

The first decoder 10 of FIG. 1 is configured to select one of the combinations of the first to third voltages (V(T1), V(T2), V(T3)), shown in FIG. 4, corresponding to voltage levels of from the 0th to the 31st levels, output from the operational amplifier 60, depending on the values of the 5-bit digital signal (lower 5 bit signal inclusive of an LSB).

FIG. 3 show a single section composed by 32 voltage levels of from 0th level to 31st level. It is however also possible to provide one or more additional sections from the 32nd level onward and to set reference voltages for each of these additional sections in the same way as in the single section of from the 0th to the 31st levels. In this case, the 32nd level reference voltage for a given section is at the same voltage level as the 0th level reference voltage of the next section. A decoder corresponding to a 10-bit digital signal may be composed by 32 levels (one section)×32 (sections). In this case, three reference voltages may be decimated for each section and a total of 96 reference voltages may be decimated for 32 sections in comparison with the configuration of the related technique (the configuration in which the configuration of FIG. 21 and FIG. 22 are expanded to cope with the 10-bit). FIG. 3 shows a case of 32 levels in which the 0th level is set to a base level only for convenience. Alternatively, the 32 levels may form a portion of a plurality of (for example, 64 or more number of) voltage levels. In this case, a base level of a given section is preferably set as the first voltage level of the section having 32 voltage levels as a unit.

Third Specification of the First Exemplary Embodiment

FIG. 5 and FIG. 6 illustrate a third specification in the exemplary embodiment of FIG. 1. FIG. 5 shows an instance in which n, N and A in FIG. 1 are set to n=5, N=5 and A=0. Five references voltages arranged for one section made up by 32 voltage levels of from the 0th to the 31st levels which are in one-to-one correspondence with the values of the 5-bit digital signal that can be output from the operational amplifier 60, are set at 0th level, 4th level, a 16th level, a 28th level and a 32nd level. Out of the reference voltages corresponding to voltage levels: 4k (where k is an integer from 0 to 8) that are spaced each other at an interval of 4 levels from 0th level, four number of reference voltages corresponding to the 8th level, 12th, 20th and 24th level (k=2, 3, 5, 6) are decimated. Note that the 0th to the 32nd levels are substantially linear voltage levels and monotonously increasing or decreasing voltage levels.

FIG. 6 shows voltage levels that are able to be output from the operational amplifier 60 and correspond to the equation (2), when the live reference voltages (0th, 4th, 16th level, 28th and the 32nd Levels) as set in accordance with the specification of FIG. 5, are combined as the first to third voltages (V(T1), V(T2), V(T3)). Note that shows an entirety of the combinations of the five reference voltages.

It is seen from FIG. 6 that a total of levels from the 0th level to the 31st level are included as the voltage levels output from the operational amplifier 60, such that 32 voltage levels of from the 0th to the 31st levels can be output by the five reference voltages as set in FIG. 5 (0th, 4th, 16th level, 28th and 32nd levels).

On the other hand, the combinations of the first to third voltages (V(T1), V(T2), V(T3)), for outputting the 5th, 6th, 9th, 15th, 17th, 23rd, 26th and 27th levels are the combinations of the first to third reference voltages differing to each other in voltage levels. When these voltage levels are output, the first to third voltages (V(T1), V(T2), V(T3)) differ to each other and there is no combination in which two or three of the first to third voltages are made up of the same reference voltage overlapped.

The first decoder 10 of FIG. 1 is configured to select one of the combinations of the first to third voltages (V(T1), V(T2), V(T3)), shown in FIG. 6, corresponding to voltage levels of from the 0th to the 31st levels, output from the operational amplifier 60, in correspondence with the value of the 5-bit digital signal.

In FIG. 5, as in the case of FIG. 3, one or more additional sections from 32nd level onward may be provided, or the 32 levels may be arranged to form a portion of a plurality of voltage levels.

Fourth Specification of the First Exemplary Embodiment

Figure 8:
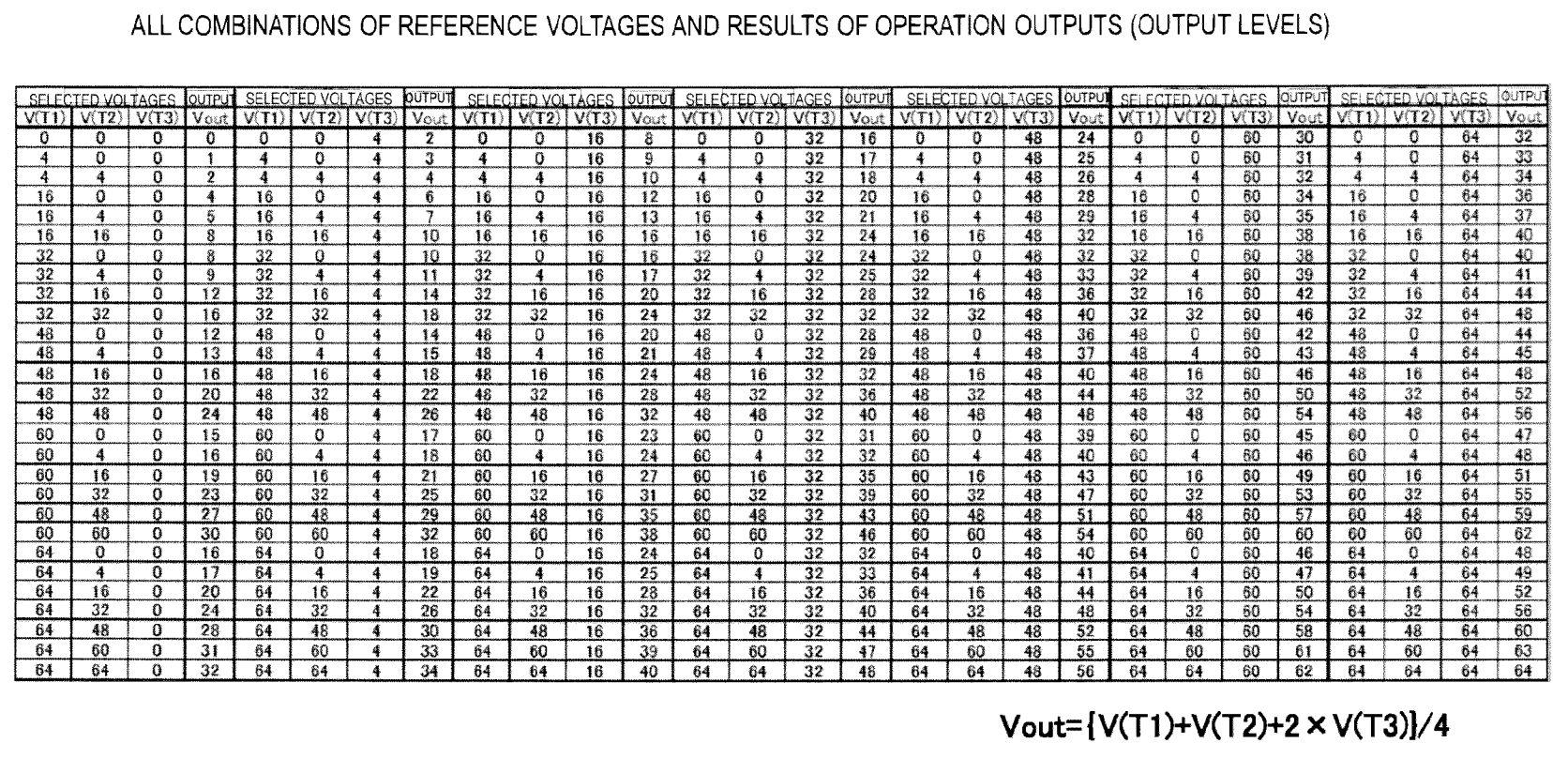

FIG. 7 and FIG. 8 illustrate a fourth specification in the exemplary embodiment of FIG. 1. FIG. 7 shows an instance in which n, N and A in FIG. 1 are set so that n=6, N=7 and A=0. Seven reference voltages for one section made up by 64 voltage levels of from the 0th to the 63rd levels which can be output from the operational amplifier 60 in one-to-one correspondence with the values of the 6-bit digital signal, are set to 0th level, 4th level, a 16th level, a 32nd level, a 48th level, a 60th level and a 64th level. Out of the reference voltages corresponding to voltage levels: 4k (where k is an integer from 0 to 16) that are spaced each other at an interval of 4 levels from 0th level, ten reference voltages corresponding to the 8th level, 12th, 20th level, 24th, 28th, 36th, 40th, 44th, 52nd and 56th levels (k=2, 3, 5, 6, 7, 9, 10, 11, 13, 14) are decimated. Note that the 0th to the 64th levels are substantially linear voltage levels and monotonously increasing or decreasing voltage levels.

FIG. 8 shows voltage levels corresponding to the above equation (2) that can be output from the operational amplifier 60 when the seven reference voltages (0th, 4th, 16th level, 32nd, 48th, 60th and 64th levels), as set for the specification of FIG. 7, are combined together as the first to third voltages (V(T1), V(T2), V(T3)). Note that FIG. 8 shows an entirety of the combinations of the seven reference voltages.

It is seen from FIG. 8 that all levels from the 0th level to the 63rd level exist as the voltage levels output from the operational amplifier 60, such that 64 voltage levels of from the 0th to the 63rd levels can be output by the seven reference voltages as set in FIG. 7 (0th, 4th, 16th level, 32nd, 48th, 60th and 64th levels).

On the other hand, the combinations of the first to third voltages (V(T1), V(T2), V(T3)), outputting the 5th level, 6th level, 9th level, . . . , are the combinations of the first to third reference voltages differing to each other in voltage levels. When these voltage levels are output, the first to third voltages (V(T1), V(T2), V(T3)) differ to each other, such that there are no combinations of the same overlapping reference voltages.

The first decoder 10 of FIG. 1 is configured to select one of the combinations of the first to third voltages (V(T1), V(T2) V(T3)), shown in FIG. 8, corresponding to voltage levels of from the 0th to the 63rd levels, output from the operational amplifier 60, depending on the value of the 6-bit signal (for example, lower 6 bits inclusive of an LS B).

In FIG. 7, one or more additional sections from 64th level onward may be provided, or the 64 levels may be arranged to form a portion of a plurality of voltage levels (such as 128 levels or more). When such additional section(s) is provided, the reference voltage at the 64th level of a given section is at the same voltage level as the reference voltage at the 0th level of the next section.

Fifth Specification of the First Exemplary Embodiment

Figure 10:
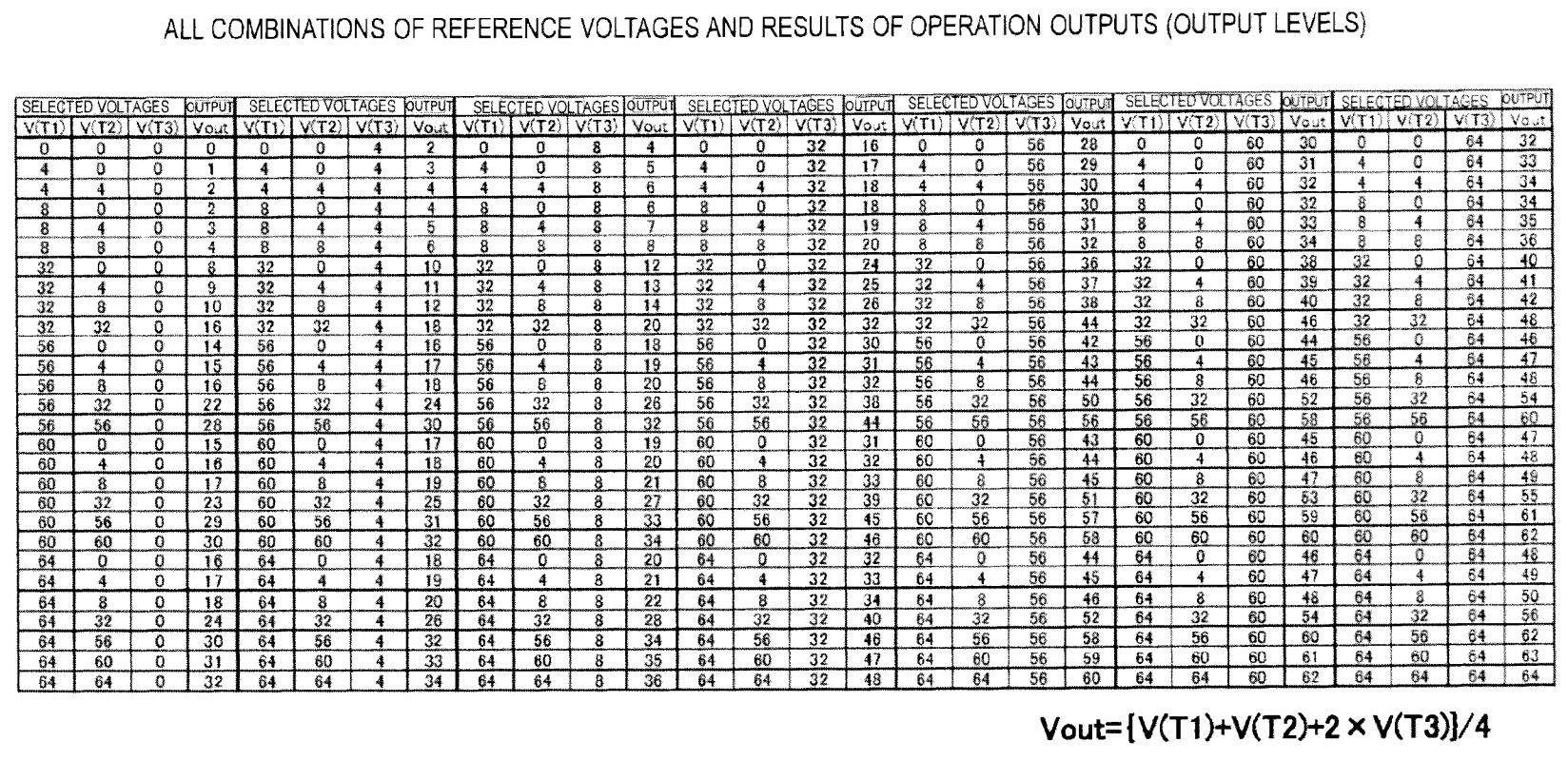

FIG. 9 and FIG. 10 illustrate a fifth specification in the exemplary embodiment of FIG. 1. FIG. 9 shows an instance in which n, N and A in FIG. 1 are set so that n=6, N=7 and A=0. For one section made up by 64 voltage levels of from the 0th to the 63rd levels which are in one-to-one correspondence with the values of the 6-bit digital signal that can be output from the operational amplifier 60, seven reference voltages are set at 0th level, 4th level, an 8th level, a 32nd level, a 56th level, a 60th level and at a 64th level. Out of reference voltages corresponding to voltage levels: 4k (where k is an integer from 0 to 16) that are spaced each other at an interval of 4 levels from the 0th level, ten reference voltages corresponding to the 12th, 16th level, 20th level, 24th, 28th, 36th level, 40th, 44th, 48th and 52nd levels (k=3, 4, 5, 6, 7, 9, 10, 11, 12 and 13) are decimated. Note that the 0th to the 64th levels are substantially linear voltage levels and monotonously increasing or decreasing voltage levels.

FIG. 10 shows voltage levels that correspond to the above equation (2) and that can be output from the operational amplifier 60 when the seven reference voltages: 0th, 4th, 8th level, 32nd, 56th, 60th and 64th levels, as set in accordance with the specification of FIG. 9 are combined as the first to third voltages (V(T1), V(T2), V(T3)). Note that FIG. 10 shows all combinations of the seven reference voltages.

It is seen from FIG. 10 that a total of the voltage levels of from 0th to the 63rd levels exists as the voltage levels output from the operational amplifier 60, such that 64 voltage levels of from the 0th level to the 63rd level can be output by the seven reference voltages as set in FIG. 9 (0$^{th}$ level, 4$^{th}$ level, 8th level, 32nd level, 56th level, 60th level and 64th level).

The combinations of the first to third voltages (V(T1), V(T2), V(T3)), outputting the 9th level, 10th level, 12th level, are the combinations of the first to third reference voltages differing to each other in level. When these voltage levels are output, the first to third voltages (V(T1), V(T2), V(T3)) differ to each other, such that there are no combinations of the same overlapping reference voltages.

The first decoder 10 of FIG. 1 is configured to select one of the combinations of the first to third voltages (V(T1), V(T2), V(T3)), shown in FIG. 10, corresponding to voltage levels of from the 0th to the 63rd levels, output from the operational amplifier 60, depending on the value of the 5-bit signal (lower 6 bits inclusive of an LSB, as an example).

In FIG. 9, as in the case of FIG. 7, an additional section(s) may be provided from the 64th level onward, or the 64 levels may form a portion of a plurality of (for example, 128 or more) voltage levels.

Sixth Specification of the First Exemplary Embodiment

Figure 12:
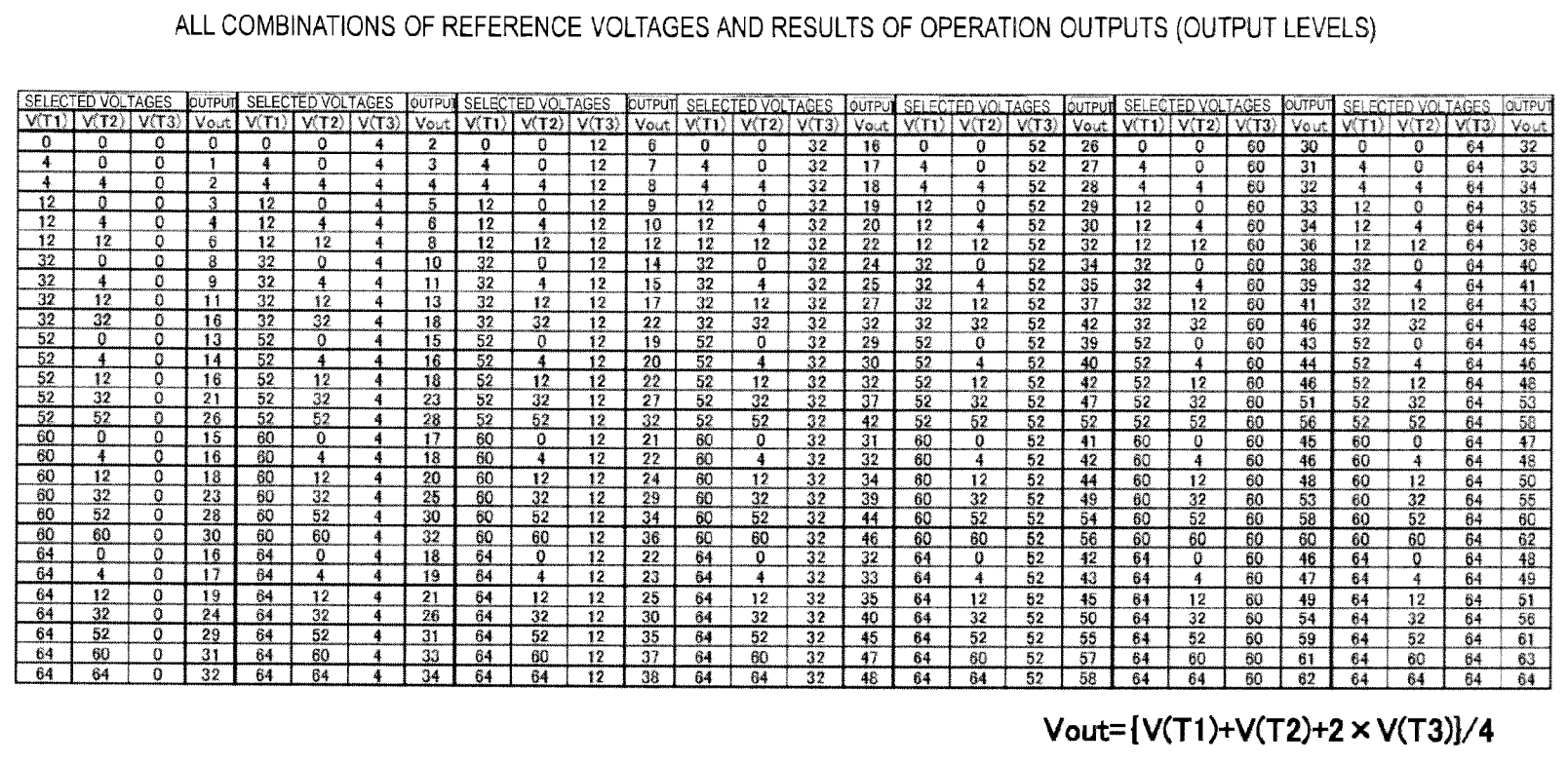

FIG. 11 and FIG. 12 illustrate a sixth specification in the exemplary embodiment of FIG. 1. FIG. 11 shows an instance in which n, N and A in FIG. 1 are such that n=6, N=7 and A=0. Out of one section made up by 64 voltage levels of from the 0th to the 63rd levels which are in one-to-one correspondence with the values of the 6-bit digital signal that can be output from the operational amplifier 60, seven reference voltages are set at 0th level, 4th level, 12th level, 32nd level, 52nd level, 60th level and 64th level. From the reference voltages at a plurality of voltage levels: 4k (where k is an integer from 0 to 16) that are spaced each other at an interval of 4 levels from 0th level, ten reference voltages corresponding to the 8th level, 16th level, 20th level, 24th level, 28th level, 36th level, 40th level, 44th level, 48th and 56th levels (k=2, 4, 5, 6, 7, 9, 10, 11, 12 and 14) are decimated. Note that the 0th to the 64th levels are substantially linear voltage levels and monotonously increasing or decreasing voltage levels.

FIG. 12 shows voltage levels that are able to be output from the operational amplifier 60 when the seven reference voltages of 0th level, 4th level, 12th level, 32nd level, 52nd level, 60th level and 64th level, as set in accordance with the specification of FIG. 11, are combined together as the first to third voltages (V(T1), V(T2), V(T3)) in accordance with the above equation (2). Note that FIG. 12 shows an entirety of the combinations of the seven reference voltages.

It is seen from FIG. 12 that a total of the voltage levels of from 0th to the 63rd levels exists as the voltage levels output from the operational amplifier 60, such that 64 voltage levels of from the 0th level to the 63rd level can be output by the seven reference voltages as set in FIG. 11 (0th level, 4th level, 12th level, 32nd level, 52nd level, 60th level and 64th level).

It should be noted that the combinations of the first to third voltages (V(T1), V(T2), V(T3)), outputting the 9th level, 10th level, 14$^{th}$ level, . . . are the combinations of the first to third reference voltages differing to each other in level. When these voltage levels are output, the first to third voltages (V(T1), V(T2), V(T3)) differ to each other, such that there are no combinations of the same overlapping reference voltages.

The first decoder 10 of FIG. 1 is configured to select one of the combinations of the first to third voltages (V(T1), V(T2), V(T3)), shown in FIG. 12, corresponding to voltage levels of from the 0th to the 63rd levels, output from the operational amplifier 60, depending on the value of the 6-bit signal.

In FIG. 11, as in the case of FIG. 7, one or more additional sections may be provided from the 64th level onward. Or the 64 levels may form a portion of a plurality of (for example, 128 or more) voltage levels.

Seventh Specification of the First Exemplary Embodiment

Figure 14:
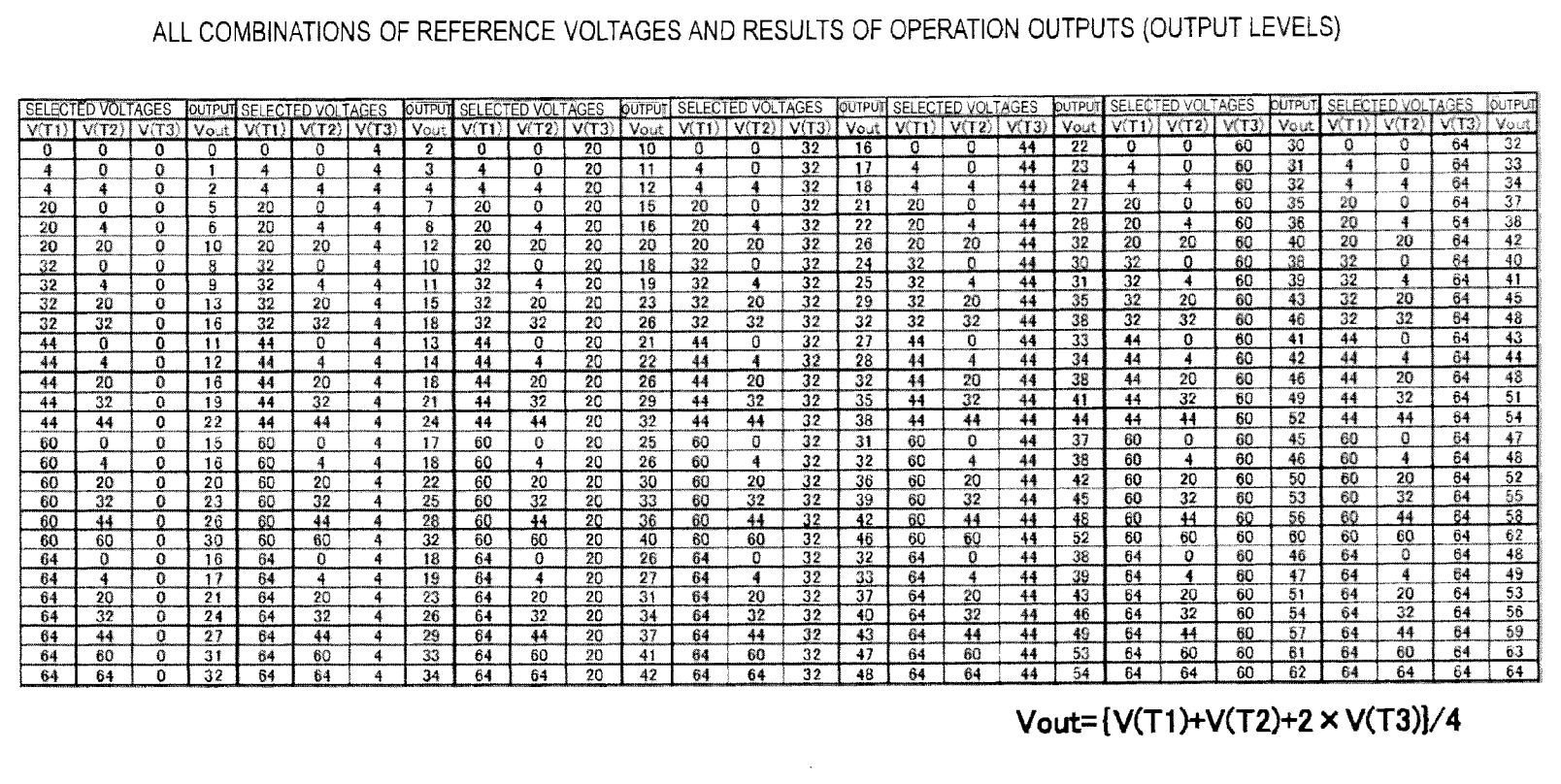

FIG. 13 and FIG. 14 illustrate a seventh specification in the exemplary embodiment of FIG. 1. FIG. 13 shows an instance in which n, N and A in FIG. 1 are such that n=6, N=7 and A=0. For one section is made up by 64 voltage levels of from the 0th to the 63rd levels which are in one-to-one correspondence with the values of a 6-bit digital signal that can be output from the operational amplifier 60, are set at 0th level, 4th level, 20th level, 32nd level, 44th level, 60th level and 64th level. From the reference voltages corresponding to voltage levels: 4k (where k is an integer from 0 to 16) that are spaced each other at an interval of 4 levels from 0th level, reference voltages corresponding to the 8th level, 12t level h, 16th level, 24th level, 28th level, 36th level, 40th level, 48th level, 52nd and 56th level (k=2, 3, 4, 6, 7, 9, 10, 12, 13 and 14) are decimated. Note that the 0th to the 64th levels are substantially linear voltage levels and monotonously increasing or decreasing voltage levels.

FIG. 14 shows voltage levels that are able to be output from the operational amplifier 60 when the seven reference voltages of 0th level, 4th level, 20th level, 32nd, 44th level, 60th level and 64th level, as set the specification of FIG. 13, are combined together as the first to third voltages (V(T1), V(T2), V(T3)) in accordance with the above equation (2). Note that FIG. 10 shows an entirety of the combinations of the seven reference voltages.

It en from FIG. 14 that all voltage levels of from 0th to the 63rd levels exist as the voltage levels output from the operational amplifier 60, such that 64 voltage levels of from the 0th level to the 63rd level can be output by the seven reference voltages as set in FIG. 13 (0th level, 4th level, 20th level, 32nd, 44th level, 60th and 64th levels). It should be noted that the combinations of the first to third voltages (V(T1), V(T2), V(T3)), outputting the 6th level, 7th level, 9th level, . . . , are the combinations of the first to third reference voltages differing to each other in level. When these voltage levels are output, the first to third voltages (V(T1), V(T2), V(T3)) differ to each other, such that there are no combinations of the same overlapping reference voltages.

The first decoder 10 of FIG. 1 is configured to select one of the combinations of the first to third voltages (V(T1), V(T2), V(T3)), shown in FIG. 12, corresponding to voltage levels of from the 0th to the 63rd levels, output from the operational amplifier 60, depending on the value of the 6-bit digital signal.

In FIG. 13, as in the case of FIG. 7, an additional section(s) may be provided from the 64th level onward. Or the 64 levels may form a portion of a plurality of (for example, 128 or more) voltage levels.

Second Exemplary Embodiment

Figure 15:
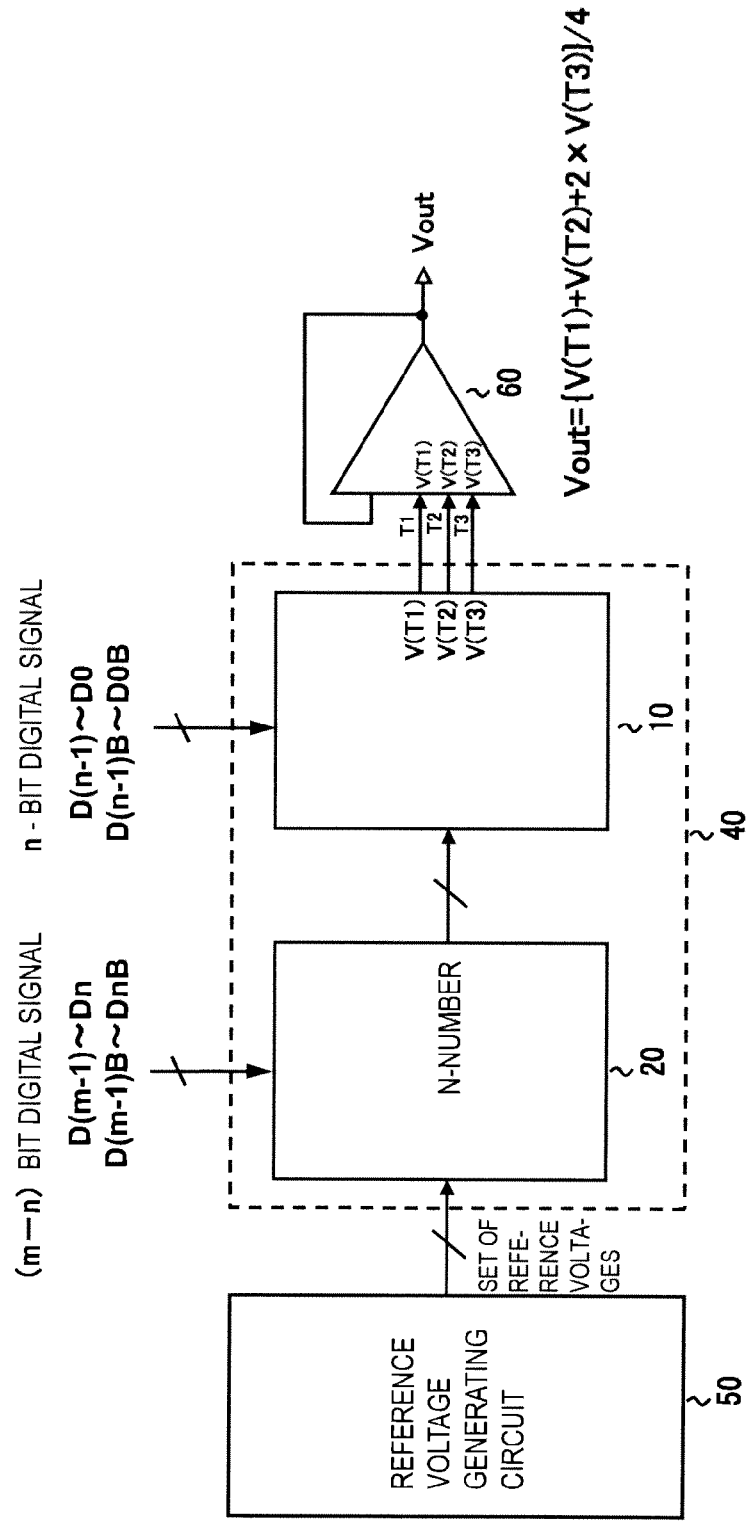
FIG. 15 is schematic view illustrating a second exemplary embodiment.

FIG. 15 shows a second exemplary embodiment of a digital-to-analog conversion circuit. Referring to FIG. 15, the present second exemplary embodiment includes, in addition to the configuration of the first exemplary embodiment shown in FIG. 1, a reference voltage generating circuit 50 that generates N reference voltages ($4 \leq N < 1+2^{(n-2)}$), an m-bit digital signal D(m−1) to D0, with its complementary signal D(m−1)B to D0B, inclusive of a n-hit digital signal, m being such that m>n, (n being a positive integer not less than 4), and a second decoder 20. The first decoder 10 and the second decoder 20, combined together, compose a decoder block 40.

Referring to FIG. 15, the output levels that are able to be output from the operational amplifier 60 are comprised of non-overlapping first to Sth sections, each of which is composed by $2^n$ voltage levels of from Azth level to $(Az-1+2^n)$th level (where S is a positive integer not less than 1 and Az is a base level of a zth section ($1 \leq z \leq S$).

For each of the first to Sth sections, the reference voltages supplied from the reference voltage generating circuit 50 to the decoder 20 are reference voltages obtained by decimating a pre-set number (one or more) of reference voltages from $-3+2^{(n-2)}$ reference voltages which are obtained by excluding out of the reference voltages corresponding to voltage levels: Az+4k (where k is an integer from 0 to $2^{(n-2)}$) that are spaced each other at an interval of 4 levels from the Azth level, four number of reference voltages of the Azth level, (Az+4)th level, $(Az-4+2^n)$th level and $(Az+2^n)$th level.

The second decoder 20 selects, from the reference voltages, supplied from the reference voltage generating circuit 50, N number of reference voltages (N is a positive number not less than 4 and not larger than $2^{(n-2)}$): Azth, (Az+4)th, . . . , $(Az-4+2^n)$th and $(Az+2^n)$th, allocated to one of the first to Sth sections of interest, such as zth section, in accordance with the values of the upper (m−n) bits of an m bit digital signal (D(m−1) to D0) and its complementary signal (D(m−1)B to D0B). The second decoder outputs the so selected reference voltages to the first decoder 10.

The first decoder 10 selects, from the N number of reference voltages selected by the second decoder 20 (Azth, (Az+4)th, . . . , $(Az-4+2^n)$th and $(Az+2^n)$th), first to third voltages (V(T1), V(T2), V(T3)), depending on the values of the lower n-hit digital signal D(n−1) to D0 and its complementary signal D(n−1)B to D0B. The configuration as well as the operation of the first decoder 10 and the operational amplifier 60 is analogous to that of FIG. 1 and hence the corresponding explanation is dispensed with.

Modification of the Second Exemplary Embodiment

The following describes a modification of the second exemplary embodiment. The digital-to-analog conversion circuit of FIG. 15, described above, may be configured so that voltage levels that are able to be output from the operational amplifier 60 will include a section of the specification different from those of FIG. 2A to FIG. 14.

Figure 24:
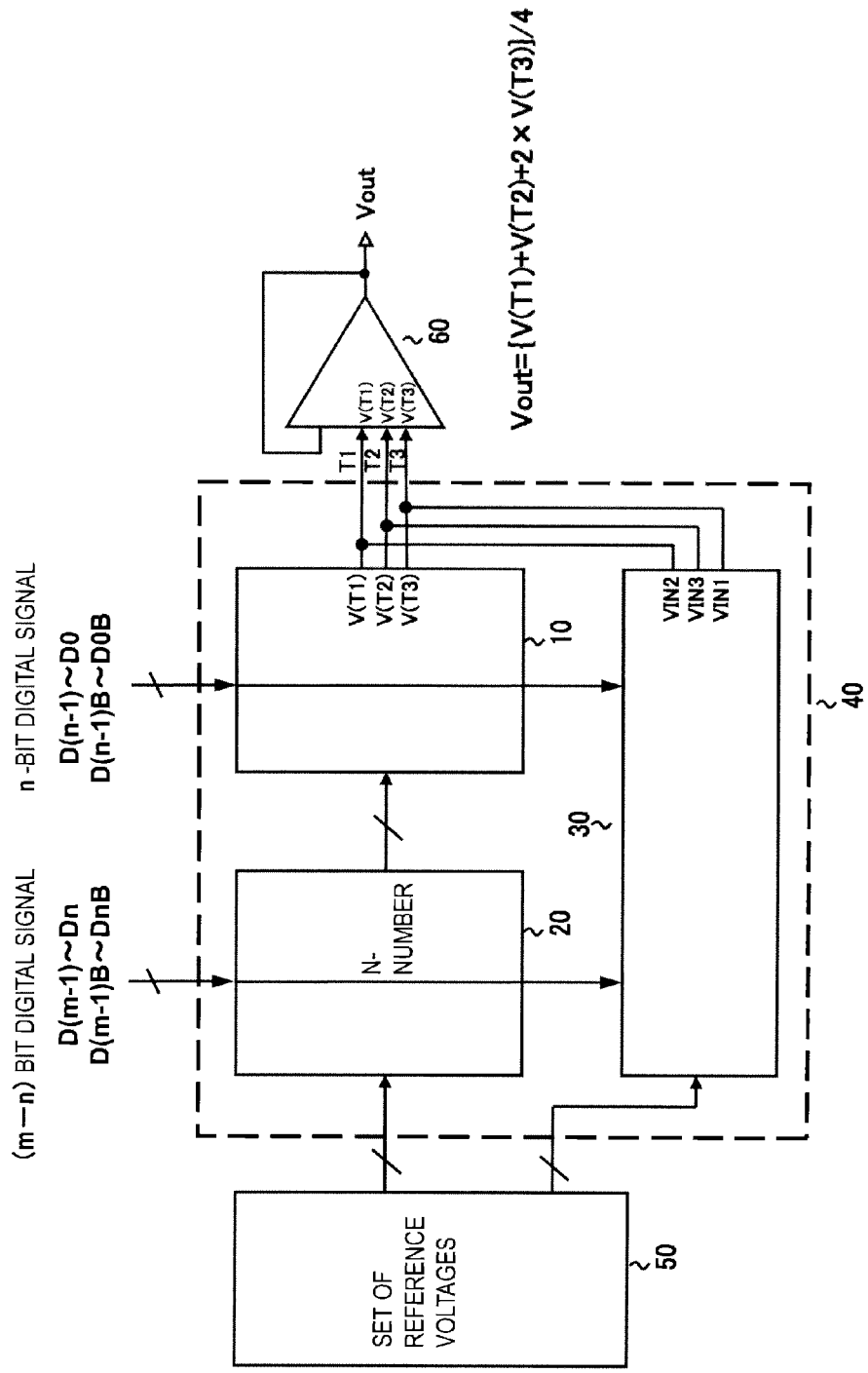
FIG. 24 illustrates a configuration example of a second specification of the second exemplary embodiment.

In this case, the decoder block 40 further includes a third decoder 30 adapted to the section of the different specification, as shown in FIG. 24. The third decoder 30 receives, from the reference voltage generating circuit 50, the reference voltages corresponding to the first to third voltages to be selected by the third decoder. The third decoder 30 selects the first to third voltages, depending on the values of the m-bit digital signal D(m−1) to D0 and its complementary signal D(n−1)B to D0B, received in common with the first decoder 10, and supplies the so selected first to third voltages to the operational amplifier 60.

The operational amplifier 60 is shared by the first decoder 10 and the third decoder 30. In FIG. 24, there is no overlapping of the sections among different specifications, such that, when one of the first decoder 10 and the third decoder 30 selects and outputs the first to third voltages, the other decoder is non-selected and thus does not output the first to third voltages. In response to the first to third voltages (V(T1), V(T2), V(T3)) output at terminals T1, T2 and T3 shared by the first decoder 10 and the third decoder 30, the operational amplifier 60 outputs a voltage corresponding to the operations according to the equation (2). Though not limited thereto, in an instance shown in FIG. 24, the operational amplifier 60 outputs, in response to the first to third voltages, selected by the third decoder 30, a voltage corresponding to the result of the operations (Vout={VIN3+VIN2+2×VIN1}/4) of the equation (1), as will be detailed subsequently. The first to third voltages, selected at this time by the third decoder 30, are VIN2, VIN3 and VIN1, respectively, and are respectively output to the terminals T1, T2 and T3 of the operational amplifier 60.

First Specification of the Second Exemplary Embodiment

FIG. 16 illustrates a first specification of the second exemplary embodiment of FIG. 15. In FIG. 16, m, n and N in FIG. 15 are set so that 10, n=4 and N=4. Specifically, FIG. 16 shows, for 1024 voltage levels of from 0th to 1023rd voltage levels that are able to be output from the operational amplifier 60 in response to the values of a 10-bit digital signal, an example relationship among the setting of reference voltages, combinations of the first to third voltages (V(T1), V(T2), V(T3)) and the values of the 10-bit digital signal (D9 to D0).

In the specification shown in FIG. 16 the 1024 voltage levels are composed by first to 64th sections (S=64). Each section is composed by 16 voltage levels, and the voltage levels do not overlap one with another.

In setting the reference voltages of the 1st to 64th sections, the specification of FIG. 2A is used. That is, four number of (N=4) reference voltages of 0th level, 4th level, 12th level and 16th level are set for each section. Also, for the 1024 voltage levels of from the 0th level to the 1023rd level, the respective first voltage levels of the first to 64th sections (0th level, 16th level, 32nd and so on until 1008th level), are set as the base levels (Azs) of the respective sections.

The respective Nth (N=4) reference voltages of the first to 64th sections are set as the base levels for the next following sections. However that, at the 64th section, there lacks the next section (65th section), such that the Nth (N=4) reference voltage of the 64th section is virtually set as a 1024th level which is the base level of a 65th section.

The second decoder 20 of FIG. 15, corresponding to the specification of FIG. 16, selects, from the reference voltages as set in FIG. 16, four number of reference voltages, allocated to a single section of interest from among the first to 64th sections of the reference voltages, in accordance with the values of the upper six bits (D9 to D4) of the 10-bit digital signal. The second decoder supplies the so selected reference voltages to the first decoder 10. For example, for the first section, the second decoder 20 selects, in case the digital signal (D9, D8, D7, D6, D5, D4)=(0, 0, 0, 0, 0, 0), the reference voltages of 0th level, 4th level, 12th level and 16th level, and supplies the so selected reference voltages to the first decoder 10. For the zth section, the second decoder 20 selects the Azth, (Az+4)th, (Az+12)th and (Az+16)th reference voltages, in correspondence with the values (D9, D8, D7, D6, D5, D4) of the digital signal, and outputs the so selected reference voltages to the first decoder 10.

In the specification of FIG. 16, in which the number of output voltage levels is 1024, the total number of the reference voltages (respective different potentials), supplied to the decoder 40, is 193.

In the related technique (FIG. 21, FIG. 22), the number of reference voltages of the digital-to-analog conversion circuit (DA converter 310), expanded to the 10-bit digital signal, is 257.

In the present exemplary embodiment, a total number of the reference voltages is reduced by about one-fourth of that of the related technique (FIG. 21, FIG. 22).

With reduction in the total number of the reference voltages, the total number of the switching transistors of the decoder is also decreased, as a result of which the decoder area may be decreased.

It should be noted that the operational amplifier 60 used may be the same as the operational amplifier (voltage follower circuit 317) of FIG. 21 and FIG. 23. Hence, the operational amplifier 60 in the present exemplary embodiment is not increased in area over that of the related technique of FIG. 21.

FIG. 18 illustrates in a list the results of comparison of the number of reference voltages in case the specifications of FIG. 2A to FIG. 14 are applied for a total of 1024 voltage levels of the digital-to-analog conversion circuit of FIG. 15 configured to be compatible with a 10-bit digital signal. Specifically, FIG. 18 shows, for each of the specification of FIG. 2A and FIG. 2B, that of FIG. 3 and FIG. 4, that of FIG. 5 and FIG. 6 and that of FIG. 7 through to FIG. 14, the number of voltage levels per section, the number of reference voltages per section, the number of sections and a total number of the reference voltages for the total of the sections. Note that the number of reference voltages per section denotes the number of reference voltages in the section concerned plus the reference voltage corresponding to the reference voltage level of the next section (indicated as '+1'). By the number of the reference voltages for the total of the sections is meant the number of the reference voltages corresponding to the voltage levels in each section multiplied by the number of the sections plus one reference voltage of the 1024th level.

It is seen from FIG. 18 that, by using the specifications of FIG. 3 through to FIG. 14, the number of the reference voltages is further appreciably reduced from that in case of using the above described specifications of FIG. 2A and FIG. 2B. Moreover, if the digital-to-analog conversion circuit of FIG. 15 is expanded to a case of using a 12-bit digital signal, not shown, the number of reference voltages may be further appreciably decreased from that of the digital-to-analog conversion circuit (DA converter 310) of FIG. 21 expanded and hence the decoder area may also be decreased appreciably.

The above exemplary embodiments are directed to the cases of application to a digital-to-analog conversion circuit that implements a linear voltage characteristic. The following describes example applications to a non-linear voltage characteristic.

Second Specification of the Second Exemplary Embodiment

In the first specification, the output voltage levels (16 levels) of each section are substantially linear. Thus, even though the non-linear characteristic can be dealt with across the sections, is difficult to implement a non-linear voltage characteristic within one section (within the range of 16 levels). However, a rather smoothly changing non-linear characteristic can be sufficiently dealt with by using, in combination, a specification of FIG. 22 in which four levels, for example, become linear. A digital-to-analog conversion circuit of FIG. 24, capable of dealing with such non-linear characteristic, will hereinafter be described.

FIG. 17 is a diagram explaining a second specification of the second exemplary embodiment. A circuit configuration of the second specification corresponds to FIG. 24. FIG. 17 shows a modification example of the specification of FIG. 16. In an instance shown in FIG. 17, the specification of FIG. 22 is applied for the first section out of the 1st to 64th sections and the specification of FIG. 2A is applied for each of the second to 64th sections (S=63).

For the 0th to the 15th level in the first section, the reference voltages are set at intervals of 4 levels, specifically at 0th level, 4th, 8 the level, 12th level and 16th level (in which the 16th level is overlapped with the base level of the second section). The input/output characteristic (that is, the relationship between inputs (V(T1), V(T2), V(T3)) and an output Vout) corresponds to that of the specification of FIG. 22 (that is, the relationship between inputs (VIN2, VIN3, VIN1) and an output Vout), and satisfies the relationship of Vout={VIN3+VIN2+2×VIN1}/4 according to the above equation (1).

For example, the combinations of (V(T1), V(T2), V(T3)), outputting the 0th to 3rd levels (V0 to V3) of FIG. 17, are:
0th level: (V(T1), V(T2), V(T3))=(V0, V0, V0)
1st level: (V(T1), V(T2), V(T3))=(V4, V0, V0)
2nd level: (V(T1), V(T2), V(T3))=(V0, V0, V4)
3rd level: (V(T1), V(T2), V(T3))=(V4, V0, V4), whereas,
the combinations of (VIN2, VIN3 and VIN1) outputting the 0th to third grayscales (VU to V3) of FIG. 22, are:
0th grayscale: (VIN2, VIN3, VIN1)=(V0, V0, V0)
1st grayscale: (VIN2, VIN3, VIN1)=(V4, V0, V0)
2nd grayscale: (VIN2, VIN3, VIN1)=(V0, V0, V4)
3rd grayscale: (VIN2, VIN3, VIN1)=(V4, V0, V4)
thus indicating a coincident relationship of correspondence.

(V(T1), V(T2)) of FIG. 17 may be interchanged, while (VIN2, VIN3) of FIG. 22 may also be interchanged.

A digital-to-analog conversion circuit of FIG. 24, associated with the second specification (FIG. 17), further includes the third decoder 30 in the decoder block 40 of FIG. 15. The third decoder 30 selects the first to third voltages (VIN2, VIN3, VIN1) to output a voltage level of the first section of FIG. 17, and outputs the so selected voltages to the terminals T1, T2 and T3. On the other hand, the first and second decoders 10 and 20 select the first to third voltages (V(T1), V(T2), V(T3)) to output voltage levels of the 2nd to 64th sections of FIG. 17, and outputs the so selected voltages to the terminals T1, T2 and T3.

Referring to FIG. 24, the third decoder 30 receives five reference voltages of 0th level, 4th level, 8th level, 12th level and the 16th level of the first section of FIG. 17, from the reference voltage generating circuit 50. The third decoder 30, in accordance with the 10-bit input digital signal of D9 to D0 (when (D9, D8, D7, D6, D5, D4)=(0, 0, 0, 0, 0, 0)), selects the first to third voltages (VIN2, VIN3, VIN1) of the first section of FIG. 17 (0th level to 15th level), and outputs the so selected voltages to the terminals T1, T2 and T3. The operational amplifier 60 (1:1:2 interpolation amplifier) receives the first to third voltages (VIN2, VIN3, VIN1) output to the terminals T1, T2 and T3, as (V(T1), V(T2), V(T3)), and outputs a voltage corresponding to the results of operations of the above equation (2). The voltage output from the operational amplifier 60 corresponds to the result of the operation of the above equation (1) in connection with the first to third voltages (VIN2, VIN3, VIN1) as selected by the third decoder 30.

From the reference voltage generating circuit 50, the first and second decoders 10 and 20 receive, for 63 sections of from the second section to the 64th section of FIG. 17, three voltage levels of each section×63 (number of the sections) plus the 1024th voltage level, totaling at 190 reference voltages, and select, in accordance with the 10-bit digital signal of D9 to D0 ((D9, D8, D7, D6, D5, D4)=(0, 0, 0, 0, 0, 1) to (1, 1, 1, 1, 1, 1)), first to third voltages (V(T1), V(T2), V(T3)) associated with the second to 64th sections of FIG. 17 (16th to 1023rd levels) to output the so selected voltages to the terminals T1, T2 and T3. The operational amplifier 60 (1:1:2 interpolation amplifier) receives the first to third voltages (V(T1), V(T2), V(T3)), supplied to the terminals T1, T2 and T3, and outputs a voltage corresponding to the result of the operation of the above equation (2).

The third decoder 130, outputting voltage levels (0th to 15th levels) of the first section of FIG. 17, may be of a configuration of the selection circuit 316 of FIG. 21 adapted to cope with the specification of FIG. 22 (0th level to 15th level). In this case, an upper 6-bit selecting circuit selecting (D0, D8, D7, D6, D5, D4) (0, 0, 0, 0, 0, 0, 0) is to be added to a lower 4 bit part of the selection circuit.

In the specification of FIG. 17, just the first specification is configured so as to cope with the non-linear voltage characteristic. However, the configuration may, of course, be modified depending on a range of the non-linear voltage characteristic.

As to the section of the non-linear voltage characteristic, a specification distinct from that of FIG. 22 may be used. For example, a plurality of reference voltages having one-to-one correspondence with the respective voltage levels of the section of the non-linear voltage characteristic may be provided and a decoder to select the voltage levels may be added to the decoder block 40 of FIG. 15. In such case, the operational amplifier 60 may be owned by the so added decoder as well. The added decoder selects the reference voltages corresponding to the output voltage level in duplicates or triplicates as first to third voltages (V(T1), V(T2), V(T3)), in response to the digital signal, and outputs the so selected reference voltages to the operational amplifier 60.

As to the specifications of FIG. 3 through to FIG. 14, setting similar to the specification of FIG. 17 may be used. That is, as to the total of the voltage levels, specifications of FIG. 3 through to FIG. 14 may be used for the section of the linear voltage characteristic, and specifications other than the specification of the present exemplary embodiment, such as the specification of FIG. 22, may be used for the section representing the non-linear voltage characteristic.

The specifications of FIG. 2A through to FIG. 14 may be combined with the section(s) of the linear voltage characteristic, with each section including not less than 16 levels. In such case, a set of the first and second decoders 10, 20 is provided from one specification to another and the sole operational amplifier 60 is shared by the first decoders 10 of the plural specifications.

Third Exemplary Embodiment

Figure 19:
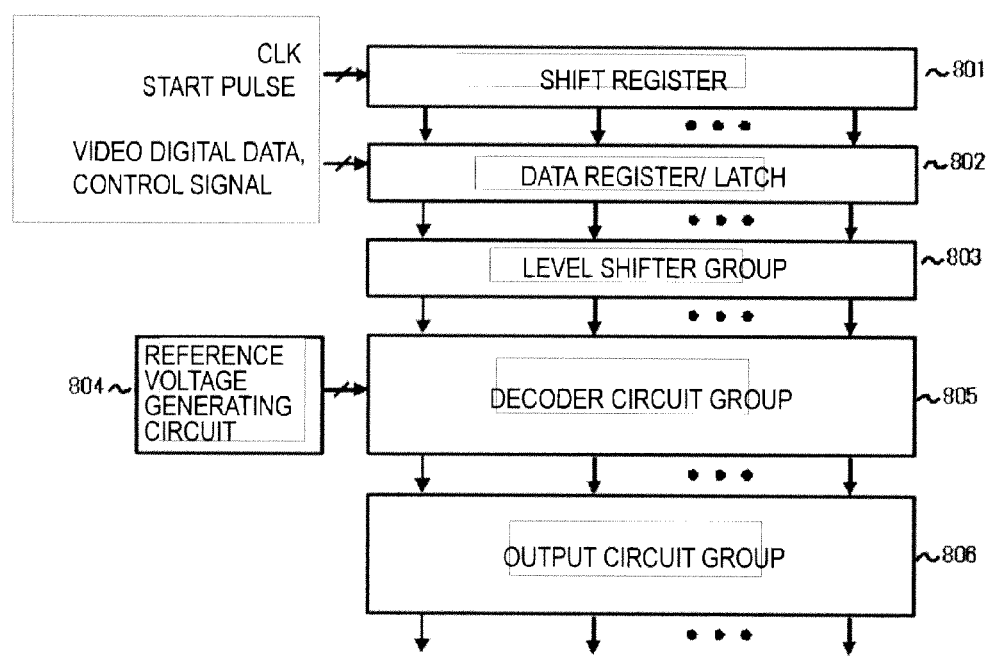
FIG. 19 is a diagram illustrating a configuration example of a data driver.

FIG. 19 illustrates a principle part of the configuration of a data driver for a display device according to a third exemplary embodiment of the present invention. This driver corresponds to a data driver 980 of FIG. 20A, and a display element of the display device is a liquid crystal or an organic LED. Referring to FIG. 19, the data driver is configured to include a shift register 801, a data register/latch 802, a level shifter group 803, a reference voltage generating circuit 804, a decoder circuit group 805 and output circuit group 806.

The reference voltage generating circuit 804 generates N number of reference voltages shown in FIG. 1. Or, the reference voltage generating circuit 804 includes the reference voltage generating circuit 50 of FIG. 15. The decoder circuit group 805 is configured to include plurality of the first decoders 10 of FIG. 1, or a plurality of decoder blocks 40 of FIG. 15, in correspondence with the number of outputs.

The output circuit group 806 is configured by a plurality of the operational amplifiers 60 of FIG. 1 and FIG. 15, in correspondence with the number of outputs. The reference voltages output from the reference voltage generating circuit 804, are supplied in common to a plurality of first decoders 10 (or the decoder blocks) composing the decoder circuit group 805.

In FIG. 19, the shift register 801 sets the data latch timing based on a start pulse and a clock signal CLK. The data register/latch 802 expands input video digital data to a digital data signal for each output unit, based on the timing determined by the shift register 801, and latches the signal from one output unit to another to output the signal to level shifter group 803 in response to a control signal. The level shifter group 803 converts the level of the digital data signal of each output unit, output from the data register/latch 802, from a low amplitude signal to a high amplitude signal, and output a resulting signal to the decoder circuit group 805. From reference signals generated by the reference voltage generating circuit 804, the decoder circuit group 805 selects, for each output, the reference voltages (first to third voltages (V(T1), V(T2), V(T3)), in accordance with a digital data signal received.

The output circuit group 806 receives, for each output, one or a plurality of reference voltages (first to third voltages (V(T1), V(T2), V(T3)) selected by the associated decoder of the decoder circuit group 805, and amplifies and outputs a grayscale signal corresponding to the one or the plurality of the reference voltages.

Figure 20B:
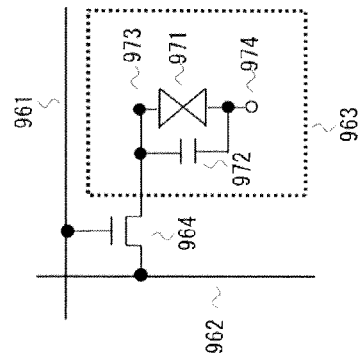
FIG. 20B is a circuit diagram illustrating a liquid crystal pixel.
Figure 20C:
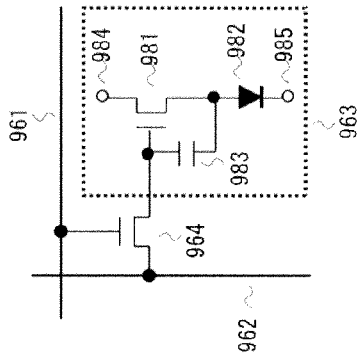
FIG. 20C is a circuit diagram illustrating an organic LED pixel.
Figure 20A:
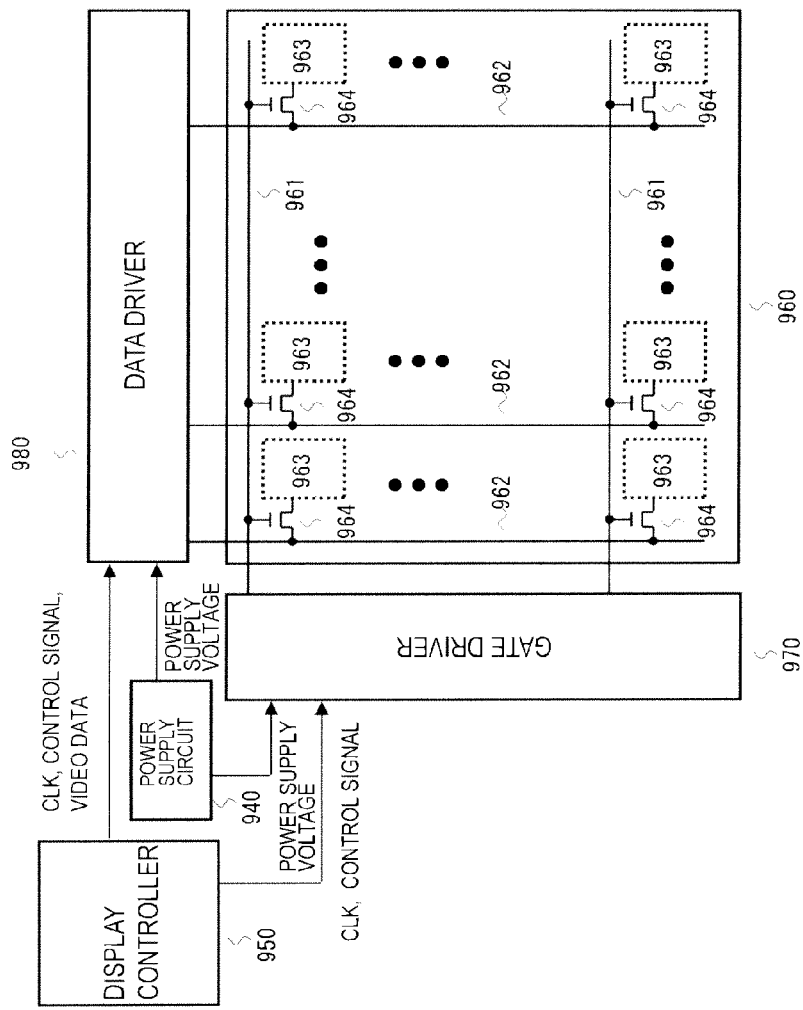
FIG. 20A is a circuit diagram illustrating the whole configuration of a display device.

Output terminals of the output circuit group 806 are connected to data lines of the display device (962 of FIG. 20A).

The shift register 801 and the data register/latch 802 are logic circuits, usually operating under a low voltage, such as 0V to 3.3V, and are supplied with corresponding power supply voltages. The level shifter group 803, the decoder circuit group 805 and the output circuit group 806 are usually configured with a high voltage necessary for driving a display element, such as 0V to 18V, and are supplied with corresponding power supply voltages.

In the present exemplary embodiment, the number of reference voltages needed is appreciably decreased in comparison with the number of levels of output voltages from the output circuit (operational amplifier 60). Since the number of the transistor switches composing a decoder circuit may be appreciably decreased, it is possible to implement a data driver used in a display device, in which a decoder area has been reduced.

The following describes specification examples and circuit configuration examples, which may be suitably applied to the decoder 10 of FIG. 1, FIG. 15 and FIG. 24 in the above described exemplary embodiments (FIG. 2A through to FIG. 14), with reference to the drawings.

First Example

FIG. 25 illustrates an example of the specification according to FIG. 2A, FIG. 2B (n=4, N=4, A=0). FIG. 25 shows the relationship between the voltages V(T1), V(T2), and V(T3), and the voltage Vout which is operated and output by the operational amplifier 60 from the voltages (V(T1), V(T2), V(T3)), wherein the voltages V(T1), V(T2), V(T3) are those selected response to the 4-bit digital signal (D3, D2, D1, D0) from the reference voltages supplied to the decoder 10 of FIG. 1 (corresponding to four number of reference voltages of the 0th level, 4th level, 12th level and 16th level of FIG. 2A). Note that, in FIG. 25, each voltage is represented by the voltage level number, the digital signal is represented by the value of the binary number (0 or 1). The specification of FIG. 25 is the same as that of the first section of FIG. 16. It is also possible to change the 0th level, which is a base level for the 0th to the 15th level of FIG. 25, to a voltage level of an optional multiple number of 16 for use as a base level for a section of 16 levels which commences from such voltage level.

Figure 26:
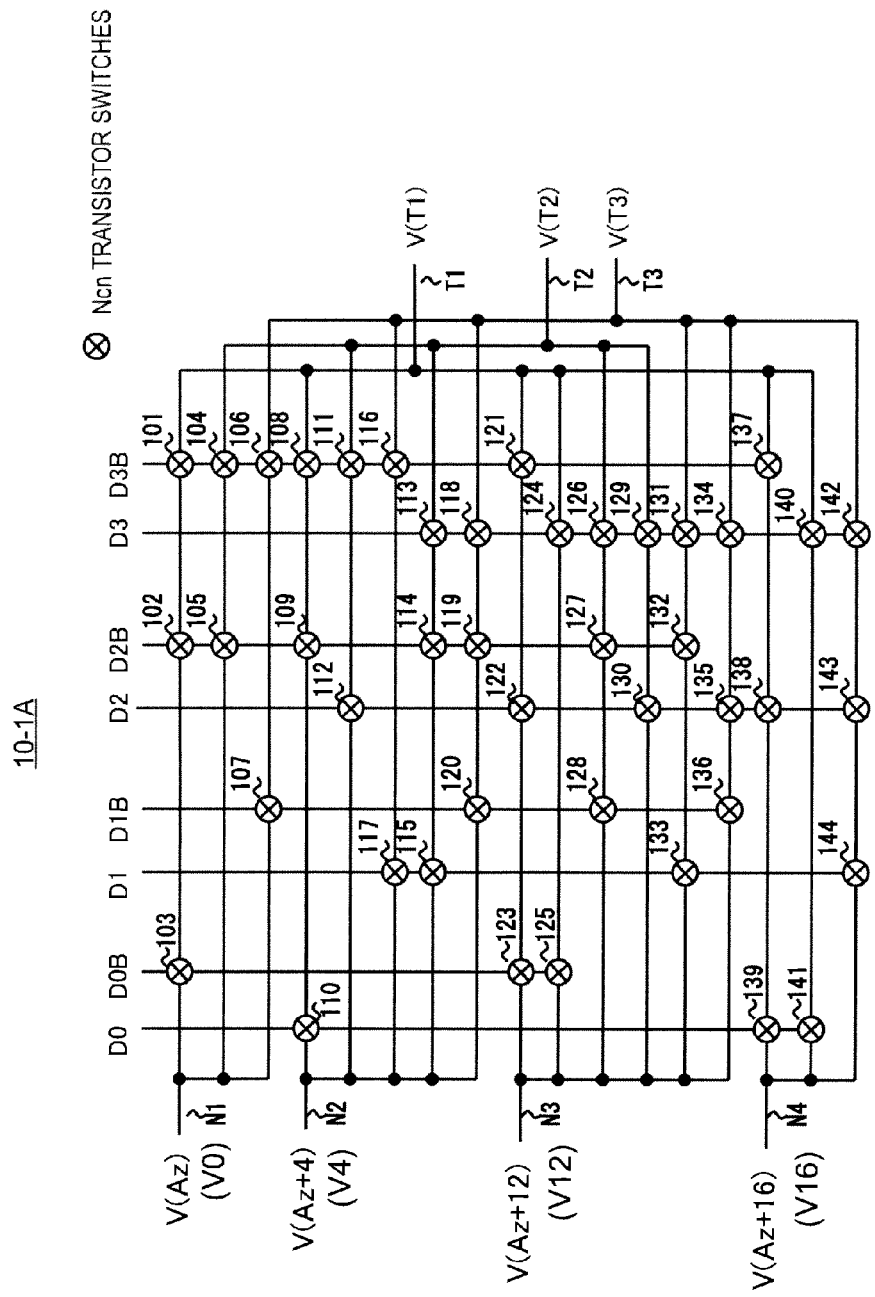
FIG. 26 is a diagram illustrating a circuit configuration of the first example.

FIG. 26 illustrates a circuit configuration example (10-1A) of the decoder 10 that implements the specification of FIG. 25. In FIG. 26, the reference voltages, supplied to the decoder 10-1A, are V(Az), V(Az+4), V(Az+12) and V(Az+16). A 4-bit digital signal (D3, D2, D1, D0) (lower 4 bits inclusive of an LSB) with complementary signals (D3B, D2B, D1B, D0B) are also supplied as the digital signal. In case of Az=0, the reference voltages V(Az), V(Az+4), V(Az+12) and V(Az+16) correspond to the 0th level (V0), 4th level (V4), 12th level (V12) and the 16th level (V16) of FIG. 25, respectively. The decoder (10-1A) of FIG. 26 is made up by N-channel transistor switches (referred to below as Nch transistor switches). Note that the Nch transistor switches are indicated in the drawings by encircled x marks. The Nch transistor switches are controlled by a digital signal Dx(x being an integer not less than 0), and its complementary signal DxB. When the digital signal Dx (x=0~3) is 1 (High), its complementary signal DxB (x=0~3) is 0 (Low), so that the Nch transistor switch, supplied with the signal Dx, is on (conducting), while the Nch transistor switch, supplied with the complementary signal DxB, is off (non-conducting). When the digital signal Dx (x=0~3) is 0 (Low), its complementary signal DxB (x=0~3) is 1 (High), so that the Nch transistor switch, supplied with the signal Dx, is off (non-conducting), while the Nch transistor switch, supplied with the complementary signal DxB, is on (conducting).

In case where the decoder (10-1A) is made up by P-channel transistor switches (referred to below as Pch transistor switches), simply the positive signal (Dx) of each bit signal and its complementary signals (DxB) are interchanged and the Nch transistor switches are replaced by the P-channel transistor switches. Although the circuit configuration, described hereinbelow, are constructed by the Nch transistor switches, they may, of course, be replaced by the P-channel transistor switches.

The decoder 10-1A of FIG. 26 corresponds to the specification of FIG. 25, as described above. For example, the value of the digital signal that selects the 0th level reference voltage of FIG. 25 (supplied to the node 1) as V(T1), is (D3, D2, M)=(0, 0, 0) and (D3B, D2B, D0B)=(1, 1, 1), and corresponds to transistor switches 101, 102 and 103 between the nodes N1 and T1 of FIG. 26 (the transistor switches 101, 102 and 103 have their gates respectively connected to D3B, D2B, and D1B and are turned on). Note that, when the value of the digital signal, such as Dx, is 1, the Nch transistor switch of FIG. 26 is controlled by the positive signal (Dx).

The value of the digital signal that selects the 0th level of the reference voltage of FIG. 25 as V(T2), is (D3, D2)=(0, 0) and (D3B, D2B)=(1, 1), and corresponds to transistor switches 104 and 105 between the nodes N1 and T2 of FIG. 26 (the transistor switches 104 and 105 have their gates respectively connected to D3B and D2B and are turned on).

The value of the digital signal that selects the 0th level of the reference voltage of FIG. 25 as V(T3), is (D3, D1)=(0, 0) and (D3B, D1B)=(1, 1), and corresponds to transistor switches 106, 107 between the nodes N1 and T3 of FIG. 26 (transistor switches 106, 107 have their gates respectively connected to D3B, D1B and are turned on).

In similar manner, the value of the digital signal that selects the 4th level of the reference voltage of FIG. 25 (fed to the node N2) as V(T1), is (D3 D2, D0)=(0, 0, 1) and (D3B, D2B, D0B)=(1, 1, 0), and corresponds to transistor switches 108, 109 and 110 between the nodes N2 and T1 of FIG. 26 (transistor switches 108, 109 and 110 have their gates respectively connected to D3B, D2B and D0 and are turned on). The value of the digital signal that selects the 4th level of the reference voltage of FIG. 25 as V(T2), is (D3, D2)=(0, 1), (D3B, D2B)=(1, 0), (D3, D2, D1)=(1, 0, 1) and (D3B, D2B, D1B)=(0, 1, 0) and corresponds to transistor switches 111 and 112 and transistor switches 113, 114, and 115 between the nodes N2 and T2 of FIG. 26. The gates of the transistor switches 111 and 112 are respectively connected to D3B and D2 and hence the transistor switches are turned on for (D3, D2) (0, 1). The gates of the transistor switches 113, 114 and 115 are respectively connected to D3B, D2B and D1 and hence the transistor switches are turned on for (D3, D2, D1)=(1, 0, 1). The digital signal that selects the 4th level reference voltage of FIG. 25 as V(T3), is (D3, D1)=(0, 1), (D3B, D1B)=(1, 0) and (D3, D2, D1)=(1, 0, 0), (D3B, D2B, D1B)=(0, 1, 1), and corresponds to transistor switches 116 and 117 and transistor switches 118, 119 and 120 between the nodes N2 and N3 of FIG. 26. That is, the transistor switches 116 and 117 have their gates respectively corrected to D3B and D1, and are turned on for (D3, D1)=(0, 1). The transistor switches 118, 119 and 1 have their gates respectively corrected to D3B, D2B and D1B, and are turned on for (D3, D2, D1)=(1, 0, 0).

In similar manner, the value of the digital signal that selects the 12th level reference voltage of FIG. 25 (supplied to node N3) as V(T1), is (D3, D2, D0)=(0, 1, 0), its complementary signal (D3B, D2B, D0B)=(1, 0, 1) and (D3, D0)=(1, 0), (D3B, D0B)=(0, 1), and corresponds to transistor switches 121, 122 and 123 and transistor switches 124 and 125 between nodes N3 and T1 of FIG. 26 (Note that the transistors 121, 122 and 123 have their gates respectively connected to D3B, D2 and D0B and are turned on for (D3, D2, D0)=(0, 1, 0), while the transistors 124 and 125 have their gates respectively connected to D3 and D0B and are turned on for (D3, D0)=(1, 0)). The value of the digital signal that selects the 12th level reference voltage of FIG. 25 as V(T2), is (D3, D2, D1)=(1, 0, 0), its complementary signal (D3B, D2B, (0, 1, 1) and (D3, D2)=(1, 1), (D3B, D2B)=(0, 0), and corresponds to transistor switches 126, 127 and 128 and transistor switches 129 and 130 between nodes N3 and T2 of FIG. 26 (Note that the transistors 126, 127 and 128 have their gates respectively connected to D3B, D2B and D1B and are turned on for (D3, D2, D0=(1, 0, 0), while the transistors 129 and 130 have their gates respectively connected to D3 and D2 and are turned on for (D3, D2)=(1, 1)).

The value of the digital signal that selects the 12th level reference voltage of FIG. 25 as V(T3), is (D3, D2, D1)=(1, 0, 1), (D3B, D2B, D0B)=(0, 1, 0) and (D3, D2, D1)=(1, 1, 0), (D3B, D2B, D0B)=(0, 0, 1), and corresponds to transistor switches 131, 132 and 133 and transistor switches 134, 135 and 136 between nodes N3 and T3 of FIG. 26 (Note that the transistors 131, 132 and 133 have their gates respectively connected to D3B, D2B and D1 and are turned on for (D3, D2, D0)=(1, 0, 1), while the transistors 134, 135, 136 have their gates respectively connected to D3. D2, D1B and are turned on for (D3, D2, D1)=(1, 1, 0)).

The value of the digital signal that selects the 16th level reference voltage of FIG. 25 (supplied to the node N4) as V(T1), is (D3, D2, D0)=(0, 1, 1), (D3B, D2B, D0B)=(1, 0, 0) and (D3, D0)=(1, 1), (D3B, D0B)=(0, 0) and corresponds to transistor switches 137, 138 and 139 and transistor switches 140 and 141 between nodes N4 and T1 of FIG. 26 (Note that the transistors 137, 138 and 139 have their gates respectively connected to D3B, D2 and D0 and are turned on for (D3, D2, D0)=(0, 1, 1), while the transistors 140 and 141 have their gates respectively connected to D3, D0 and are turned on for (D3, D0)=(1, 1)).

The value of the digital signal that selects the 16th level reference voltage of FIG. 25 as V(T3), is (D3, D2, D1)=(1, 1, 1), (D3B, D2B, D1B)=(0, 0, 0) and corresponds to transistor switches 142, 143 and 144 between nodes N4 and T3 of FIG. 26 (The transistor switches 142, 143 and 144 have their gates respectively connected to D3, D2 and D1 and are turned on). Note that, in the specification of FIG. 25, the 16th level of the reference voltage of FIG. 25 is not selected as V(T2).

It is seen from above that the decoder 10-1A of FIG. 26 are made up by 44 Nch transistor switches. Note that, in FIG. 25, the reference voltages, supplied to the nodes N1 through to N4, are selected from the lower order side (D0, D0B) towards the upper order side (D3, D3B) of the digital signal. However, in the configuration of FIG. 25, the order of the digital signal may optionally be interchanged.

Figure 27:
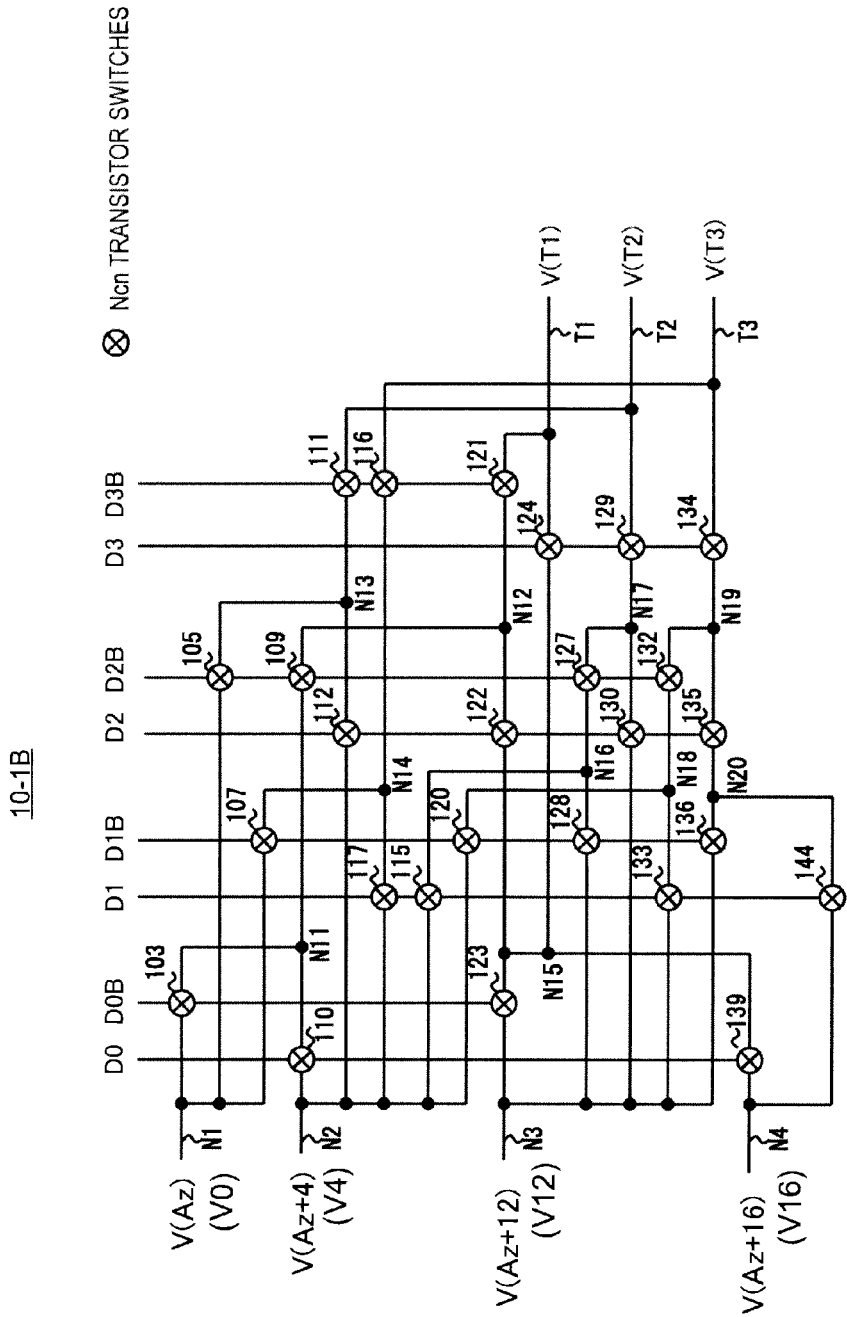
FIG. 27 is a diagram illustrating a modification of the circuit configuration of the first example.

FIG. 27 illustrates another example circuit configuration 10-1B of the decoder 10 that implements the specification of FIG. 25. The decoder 10-1B of FIG. 27 is a modification example of the decoder (10-1A) shown in FIG. 26. This circuit configuration enables the number of the transistor switches and the area to be reduced. The reference voltages and the digital signal supplied to the decoder 10-1B as well as the voltages selected and output at the terminals T1 to T3 are the same as those shown in FIG. 26.

In the decoder 10-1B, one of the transistor switches in the decoder 10-1A of FIG. 26, selecting the same voltage in common, is deleted to reduce the number of transistors. Attention is now directed, in the decoder 10-1A of FIG. 26, to the transistor switches (101, 102, 103) between the nodes N1 and T1 and to the transistor switches (108, 109, 110) between the nodes N2 and T1. The transistor switches 103 and 110 are controlled on/off by different digital signals D0B and D0. The transistor switches 101 and 108 are controlled on/off in common by the digital signal D3B, while the transistor switches 102 and 109 are controlled on/off in common by the digital signal D2B. The transistor switches 101, 102, 108 and 109 are rendered conductive in common with the terminal T1, when (D3B, D2B)=(1, 1), that is, for (D3, D2)=(0, 0). Thus, in the decoder 10-1B of FIG. 27, output side nodes of the transistor switches 103 and 110 in FIG. 26 may be connected in common (at node N11 of FIG. 27), the transistor switches (108, 109) of FIG. 26 may be left and the transistor switches (101, 102) of FIG. 26 may be removed. Also, in the decoder 10-1A of FIG. 26, the transistor switches 108 and 121 are both controlled by D3B and are rendered conductive in common with the terminal T1 at the time of selection (D3=0). Thus, in the decoder 10-1B of FIG. 27, output side nodes of transistor switches 109, 122 of FIG. 26 are connected in common (node N12 of FIG. 27), the transistor switch 121 of FIG. 26 is left and the transistor switch 108 of FIG. 26 is deleted.

In the decoder (10-1A) of FIG. 26, with regards to the transistor switches (104, 105) between the nodes N1 and T2 and to the transistor switches (111, 112) between the nodes N2 and T2, the transistor switches 104 and 111 are controlled in common by D3B and are rendered conductive along with the terminal T2 at the time of selection (D3=0). Thus, in the decoder 10-1B of FIG. 27, output side nodes of the transistor switches 105 and 122 of FIG. 26 are connected in common (node 13 of the transistor switch 111 of FIG. 26 is left and the transistor switch 104 of FIG. 26 is deleted.

In the decoder (10-1A) of FIG. 26, with regards to the transistor switches (106, 107) between nodes N1 and T3 and to the transistor switches (116, 117) between nodes N2 and T2, the transistor switches 106 and 116 are controlled in common by D3B, and are rendered conductive at the time of selection in common with the terminal T3. Thus, in the decoder 10-1B of FIG. 27, output side nodes of the transistor switches 107 and 117 of FIG. 26 are connected in common (node 14 of FIG. 27), the transistor switch 116 of FIG. 26 is left and the transistor switch 106 of FIG. 26 is deleted.

In the decoder (10-1A) of FIG. 26, with regards to the transistor switches (113, 114, 115) between nodes N2 and T2 and to the transistor switches (126, 127, 128) between nodes N3 and T2, the transistor switches 113 and 126 are controlled on/off in common by D3, while the transistor switches 114 and 127 are controlled on/off in common by D2B. At the time of selection, the transistor switches 113, 114, 126 and 127 are rendered conductive in common with the terminal T2. Thus, in the decoder 10-1B of FIG. 27, output side nodes of the transistor switches 115 and 128 of FIG. 26 are connected in common (node 16 of FIG. 27), the transistor switches (126, 127) of FIG. 26 are left and the transistor switches (113, 114) of FIG. 26 are removed. In the decoder (10-1A) of FIG. 26, the transistor switches 126 and 129 are controlled in common by D3 and, at the time of selection, rendered conductive in common with the terminal T2. Thus, in the decoder 10-1B of FIG. 27, output side nodes of the transistor switches 127, 130 of FIG. 26 are connected in common (node 17 of FIG. 27), the transistor switch 129 of FIG. 26 is left and the transistor switch 126 of FIG. 26 is deleted.

In the decoder (10-1A) of FIG. 26, with regards to transistor switches (118, 119, 120) between nodes N2 and T2 and to transistor switches (131, 132, 133) between nodes N3 and T3, the transistor switches 118 and 131 are controlled on/off in common by D3, while the transistor switches 119 and 132 are controlled on/off in common by D2B. At the time of selection, the transistor switches 118, 119, 131 and 132 are rendered conductive in common with the terminal T3. Thus, in the decoder 10-1B of FIG. 27, output side nodes of the transistor switches 120 and 133 of FIG. 26 are connected in common (node N18), and the transistor switches 118 and 119 of FIG. 26 are removed. On the other hand, in the decoder 10-1A of FIG. 26, transistor switches 131 and 134 are both controlled by D3 and, at the time of selection, are rendered conductive in common with the terminal T3. Thus, in the decoder 10-1B of FIG. 27, output side nodes of the transistor switches 132 and 135 of FIG. 26 are connected in common (node 19 of FIG. 27), the transistor switch 134 of FIG. 26 is left and the transistor switch 131 of FIG. 26 is deleted.

In the decoder (10-1A) of FIG. 26, with regards to transistor switches (134, 135, 136) between nodes N3 and T3 and to transistor switches (142, 143, 144) between nodes N4 and T3. Of these transistor switches, the transistor switches 134 and 142 are controlled on/off in common by D3, while the transistor switches 135 and 143 are controlled on/off in common by D2. At the time of selection, the transistor switches 134, 135, 143 and 144 are rendered conductive in common with the terminal T3. Thus, in the decoder 10-1B of FIG. 27, output side nodes of the transistor switches 136 and 144 of FIG. 26 are connected in common (node N20 of FIG. 27), the transistor switches (134, 135) are left and the transistor switches (142, 143) of FIG. 26 are removed.

In the decoder (10-1A) of FIG. 26, transistor switches 123 and 125 having one ends connected to node N3, are controlled on/off in common by D0B and at the time selection, rendered conductive in common with node N3. Thus, in the decoder 10-1B of FIG. 27, the transistor switches 123 and 125 of FIG. 26 are combined together, specifically, the transistor switch 123 is left and transistor switch 125 of FIG. 26 is deleted. In similar manner, the transistor switches 139 and 141 having one ends connected to node N4 of FIG. 26, are controlled in common by D0 and, at the time of selection, rendered conductive in common with node N4. Thus, in the decoder 10-1B of FIG. 27, the transistor switches 139 and 141 of FIG. 26 are combined together, specifically, the transistor switch 139 of FIG. 26 is left and transistor switch 141 of FIG. 26 is deleted.

In the decoder (10-1A) of FIG. 26, with regards to transistor switches (121, 122, 123) between nodes N3 and T1 and to transistor switches (137, 138, 139) between nodes N4 and T3, the transistor switches 121 and 137 are controlled on/off in common by D3B, while the transistor switches 122 and 138 are controlled on/off in common by D2. At the time of selection, the transistor switches 121, 122, 137 and 138 are rendered conductive in common with the terminal T1. Thus, in the decoder 10-1B of FIG. 27, output side nodes of the transistor switches 123, 139 may be connected in common (node N15), while the transistor switches (121, 122) of FIG. 26 may be left and the transistor switches (137, 138) of FIG. 26 removed. Also, in the decoder 10-1A of FIG. 26, with regard to transistor switches (124, 125) between the nodes N3 and T1 and to transistor switches (140, 141) between the nodes N4 and T3, the transistor switches 124 and 140 are controlled in common by D3 and, at the time of selection, are rendered conductive in common with the terminal T1. Thus, in the decoder 10-1B of FIG. 27, output side nodes of the transistor switches 125 and 141 of FIG. 26 are connected in common (node N15), and the transistor switch 140 of FIG. 26 is deleted.

Thus, the number of transistor switches of the decoder 10-1B is 26, as shown in FIG. 27. The number of transistor switches in the decoder 10-1A of FIG. 26 is 44. It is thus seen that the number of the transistor switches may be significantly reduced as compared with the configuration of FIG. 26.

In order to enable the number of transistor switches of a decoder to be reduced appreciably, such a configuration of the decoder is suitable in which reference voltages are selected in a sequence from the lower hit side (D0, D0B) towards the upper bit side (D3, D3B), as in the decoder 10-1B of FIG. 27 described above. It is because the upper hit side of the digital signal controls larger number of transistor switches in common than its lower bit side, and also because the number of input side nodes of the decoder is four (N1, N2, N3, N4) which is greater than the number of output side terminals (T1, T2, T3). Hence the number of transistors that can be cut down is increased, in the case where the transistor switches controlled by the upper bit side digital signal are arranged on the decoder output side.

Figure 28:
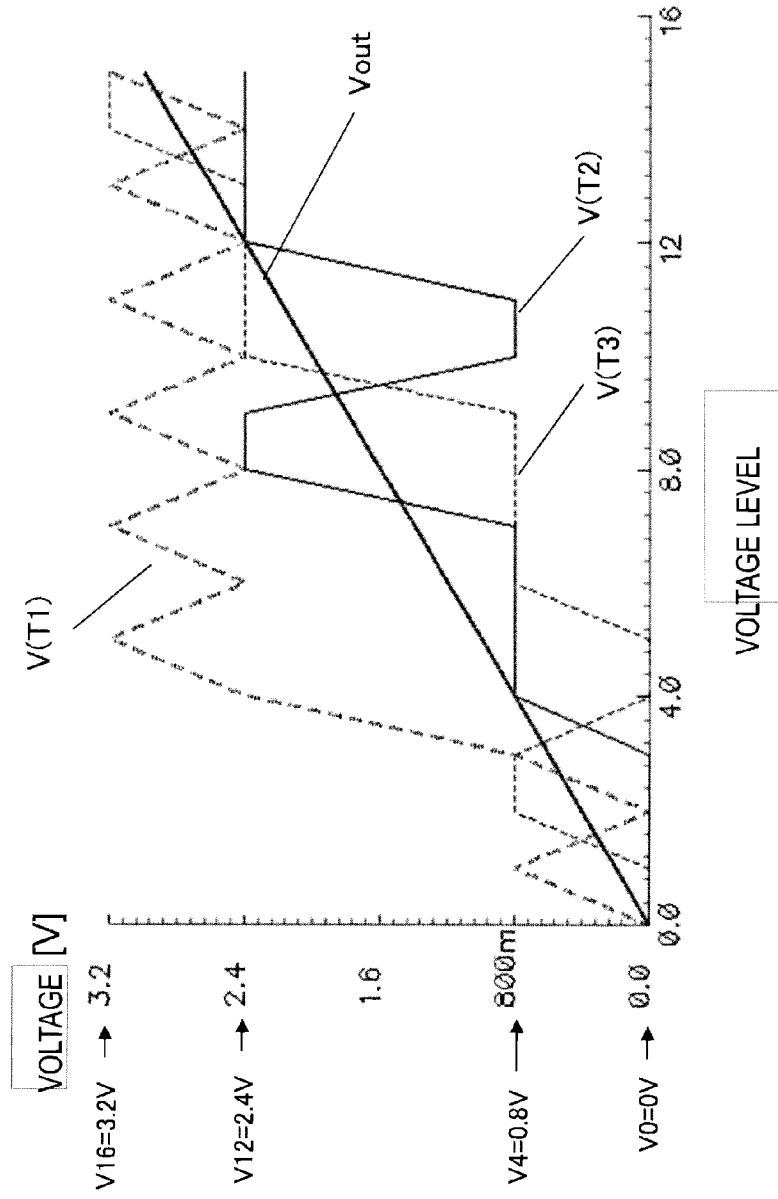
FIG. 28 is a diagram illustrating the result of simulation of the first example.

FIG. 28 shows the results of circuit simulation employing the decoder 10-1A of FIG. 26 and the decoder 10-1B of FIG. 27. In FIG. 28, the abscissa stands for the voltage level. The values of the digital signal, associated with the respective voltage levels of from the 1st level up to the 15th level, are supplied to (D3, D2, D1, D0) and to (D3B, D2B, D1B, D0B). As for the values of the digital signal, "0" denotes the Low level and "1" the High level. The reference voltages V0, V4, V12 and V16 are set to 0V, 0.8V, 2.4V and 3.2V, respectively. FIG. 28 shows voltages V(T1), V(T2) and V(T3), respectively selected and output at the output terminals T1, T2 and T3 of the decoder circuit in case the values of the digital signal are varied from the 1st level to the 15th level, and a voltage Vout operated and output by the operational amplifier 60 based on the voltages V(T1), V(T2) and V(T3). It has been confirmed from FIG. 28 that the voltages V(T1), V(T2) and V(T3), selected and output by the decoder (10-1A) of FIG. 26 and by the decoder 10-1B of FIG. 27, and the voltage Vout, coincide with the result indicated by the specification of FIG. 25.

Modification of the First Example

A modification FIG. 25 will now be shown. FIG. 29 illustrates another instance of a specification (n=4, N=4, A=0) corresponding to the specification shown FIG. 2A and FIG. 2B. Specifically, FIG. 29 shows the relationship between the voltages V(T1). V(T2) and V(T3) and the voltage Vout operated and output by the operational amplifier 60 based on the voltages V(T1), V(T2) and V(T3). The voltages V(T1), V(T2) and V(T3) are those selected and output at the output terminals T1, T2 and T3 of the decoder 10 from the reference voltages supplied to the decoder 10 (see FIG. 2A) in accordance with the 4 bit digital signal (D3, D2, D1, D0) which are similarly supplied to the decoder.

The specification shown in FIG. 29, minimizes the number of the combinations of the input voltages (V(T1), V(T2) and V(T3)) to the operational amplifier 60, in which V(T1)=V(T2)=V(T3)) by selecting the same reference voltages in the decoder 10 of FIG. 1. On the other hand, in the specification shown in FIG. 25, there are two combinations of V(T1), V(T2) and V(T3) in which the same reference voltages are selected (0th and 12th levels). Also, the 4th level can be set to a combination that the same reference voltages are selected for V(T1), V(T2) and V(T3).

However, the state that the same reference voltages (such as Vz), are selected in common as the input voltages V(T1), V(T2) and V(T3) for the operational amplifier 60 is not necessarily a desirable selection state. This will be explained by taking an instance.

The output terminals T1, T2 and T3 of the decoder 10 are connected to an input of the operational amplifier 60. For example, in the case wherein the operational amplifier 60 is configured as such an operational amplifier shown in FIG. 23, the terminals T1, T2 and T3 correspond to the terminals IN2, IN3 and IN1, respectively, and are connected to respective gate terminals of the transistor N5, the transistor N7 and the transistor N1 and N3, each forming a peer transistor of a differential amplifier. A transistor has a parasitic capacitance of a value related to the transistor size, and its gate terminal has a gate capacitance. That is, in the case where the reference voltage Vz is selected commonly as V(T1), V(T2), and V(T3), the respective gate capacitances of the four transistors N1, N3, N5 and N7 of the operational amplifier of FIG. 23 are charged or discharged to change the reference voltage Vz. Thus, in the case where an impedance of the decoder selecting the reference voltage Vz is large, it may occur that a delay in a voltage change in each of the inputs to the operational amplifier of FIG. 23 (gates of the transistors N1, N3, N5 and N7) is generated, thus causing a delay in a change of the output voltage of the operational amplifier 60.

In order to suppress delay in the changing of the input and output voltages of the operational amplifier 60, such as to cope with the high speed operation of the decoder 10, it is effective to reduce the number of combinations of (V(T1), V(T2), V(T3)) which will yield V(T1)=V(T2)=V(T3) to a minimum.

However, the voltage level combination (V(T1), V(T2), V(T3)) at one of two extreme ends of each section is such combination where V(T1)=V(T2)=V(T3). Therefore, the smallest number of combinations where the same reference voltage is selected common is 1. In FIG. 29, 16 levels of from level 0 to level 15 make up a section. For the 0th level, out of the two extreme ends of the section (0th and 15th levels), the reference voltage is selected common as V(T1), V(T2) and V(T3). For the 1st level up to the 15th level, at least two or three respective different reference voltages are selected as V(T1), V(T2) and V(T3).

The degree of the delay differs depending on whether single reference voltage is selected in common, two reference voltages are selected, or three reference voltages are selected, for the input voltages (V(T1), V(T2), V(T3)) of the operational amplifier 60.

In case a single reference voltage is selected common as the first to third input voltages V(T1), V(T2) and V(T3) of the operational amplifier 60, the parasitic capacitance of the transistor switches in the decoder 10 traversed by the current is increased because of trifurcation to the terminals T1, T2 and T3 in the decoder 10. This adds to the input capacitance (gate capacitance) of the operational amplifier 60.

Thus, the combination of (V(T1), V(T2), V(T3)), where the three input voltages V(T1), V(T2) and V(T3) of the operational amplifier 60 become common or identical, it is likely that the delay in input/output voltage changes in the operational amplifier 60 is thereby affected most appreciably. Hence, in the present exemplary embodiment, the number of such combinations is set to the smallest value (a single set).

As for the single voltage level that yields V(T1)=V(T2)=V(T3) (the 0th level of FIG. 29), it is possible to use a distinct means to reduce the impedance of the decoder 10 in selecting the voltage level (the 0th level of FIG. 29).

Figure 30:
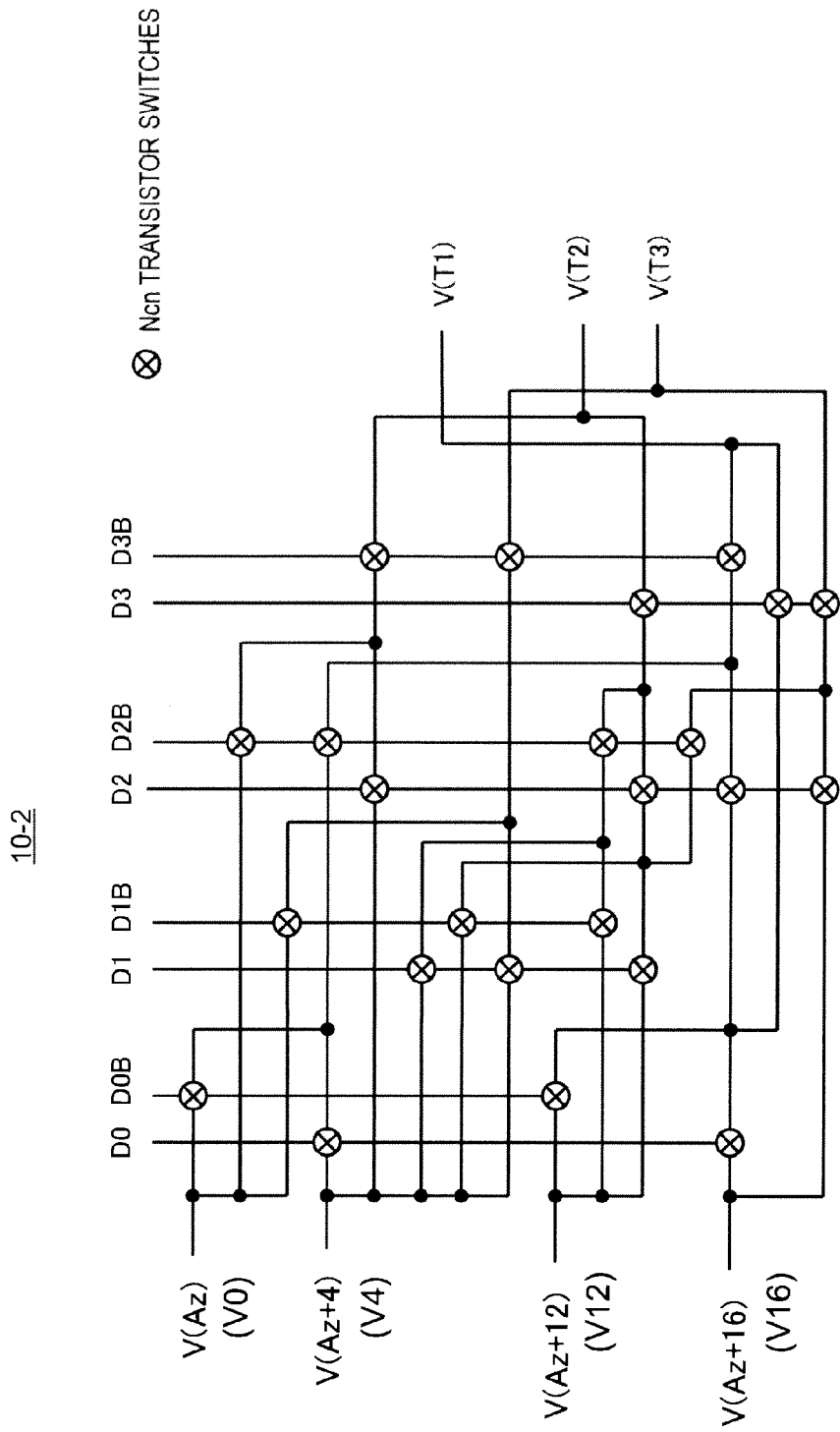
FIG. 30 is a circuit diagram illustrating a circuit configuration of the modification of the first example.

FIG. 30 is a diagram illustrating another circuit configuration example of the decoder 10 that implements the specification of FIG. 29. The reference voltages and the digital signal, supplied to a decoder 10-2 in FIG. 30, are the same as those shown in FIG. 26. However, the voltages V(T1), V(T2) and V(T3), selected and output at the terminals T1 through to T3, correspond to those in the specification of FIG. 29. The decoder 10-2 of FIG. 30 is a configuration example made up of Nch transistor switches.

Like the decoder 10-1B of FIG. 27, the decoder 10-2 of FIG. 30 is configured to reduce the number of the transistor switches and hence the circuit area. The decoder (10-1A) of FIG. 26 corresponds to a configuration of the decoder 10-1B of FIG. 27 before reducing the number of transistor switches. However, the decoder circuit of the circuit configuration of FIG. 30 before reducing the number of transistor switches (decoder circuit corresponding to the specification of FIG. 29) is not shown. The method for reducing the number of transistors is similar to that shown in FIG. 27 and hence the detailed explanation is dispensed with. In the decoder 10-2 of FIG. 30, in which the number of the transistor switches is 24, the number of the transistor switches is significantly reduced, as in the decoder 10-1B of FIG. 27.

In the decoder 10-2 of FIG. 30, as in the decoder 10-1B of FIG. 27, the reference voltages are selected in the sequence proceeding from the lower bit side (D0, D0B) to the upper bit side (D3, D3B) of the digital signal. A circuit simulation shown in FIG. 28 has been performed for the decoder 10-2 of FIG. 30. It is confirmed that the voltages V(T1), V(T2) and V(T3), selected and output by the decoder 10-2 of FIG. 30, and the voltage Vout, are coincident with those shown in the specification of FIG. 29. The results of the simulation are dispensed with.

Second Example

FIG. 31 is a diagram illustrating an example of the specification for FIG. 3 and FIG. 4, where n=5, N=6 and A=0. Specifically, FIG. 31 shows the relationship between the voltages V(T1), V(T2) and V(T3) and the voltage Vout, operated and output by the operational amplifier 60, based on the voltages (V(T1), V(T2), V(T3)), wherein the voltages V(T1), V(T2) and V(T3) are those selected from N=6 reference voltages supplied to the decoder 10 of FIG. 1 in correspondence with a 5-bit digital signal (D4, D3, D2, D1, D0) which is also supplied to the decoder and output to the output terminals T1, T2 and T3 of the decoder 10 (6 reference voltages corresponding to FIG. 3, are 0th level, 4th level, 12th level, 28th level and 32nd level).

In the specification of FIG. 31, as in FIG. 29, the number of combinations of the input voltages (V(T1), V(T2), V(T3)) to the operational amplifier 60, where V(T1)=V(T2)=V(T3), in the decoder 10 of FIG. 1, is minimized (only one for the 0th level) by selecting the same reference voltages out of the six reference voltages (0th level, 4th level, 12th level, 20th level, 28th level and 32nd level). This configuration makes it possible to suppress changes in the input voltages and an output voltage of the operational amplifier 60 from becoming delayed.

Figure 32:
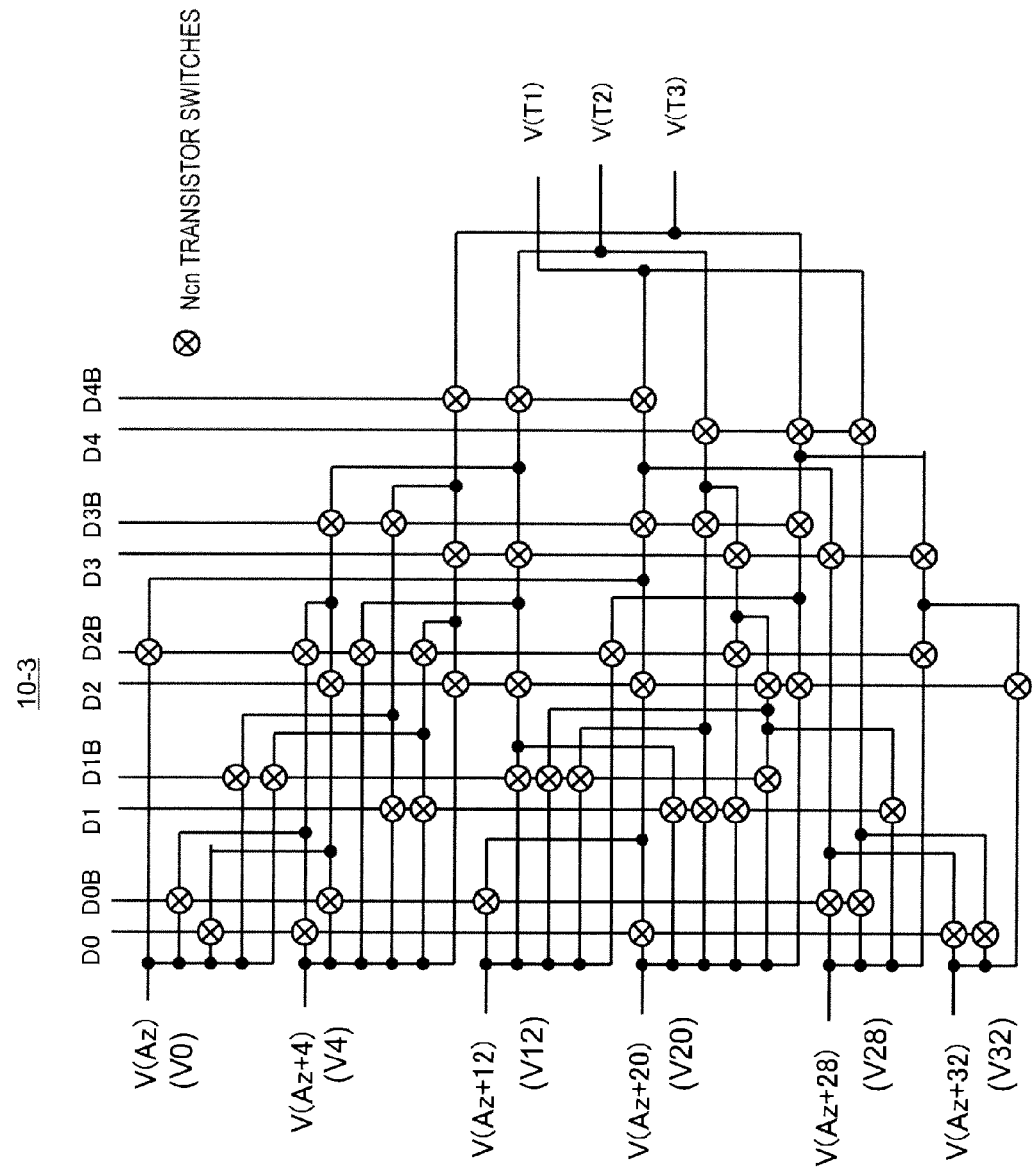
FIG. 32 is a circuit diagram illustrating a circuit configuration of the second example.

FIG. 32 is a diagram illustrating a circuit configuration example 10-3 of the decoder 10 implementing the specification of FIG. 31. Referring to FIG. 32, the reference voltages, supplied to this decoder 10-3, are V(Az), V(Az+4), V(Az+12), V(Az+20), V(Az+28) and V(Az+32), while the input digital signal is a 5-bit digital signal (D4, D3, D2, D1, D0) as well as its complementary signal (D4B, D3B, D2B, D1B, D0B).

If AZ=0, the reference voltages V(Az), V(Az+4), V(Az+12), V(Az+20), V(Az+28) and V(Az+32) correspond to the 0th level (V0), 4th level (V4), 12th level (V12), 20th level (V16), 28th level (V28) and 32nd level (V32) of FIG. 31. The decoder 10-3 of FIG. 32 is made up by Nch transistor switches.

Like the decoder 10-1B of FIG. 27, the decoder 10-3 of FIG. 32 is configured to reduce the number of the transistor switches and hence to reduce the circuit area. The decoder 10-1A of FIG. 26 corresponds to a configuration of the decoder 10-1B of FIG. 27 before reducing the number of transistor switches. However, the decoder circuit of the circuit configuration of FIG. 32 before reducing the number of transistor switches (decoder circuit corresponding to the specification of FIG. 31) is not shown. The method for reducing the number of transistors is similar to that shown in FIG. 27 so that detailed explanation is dispensed with. In the decoder 10-3 of FIG. 32, as in the decoder 10-1B of FIG. 27, the reference voltages are selected in the sequence proceeding from the lower bit side (D0, D0B) to the upper hit side (D4, D4B) of the digital signal.

A circuit simulation shown in FIG. 28 has been performed for the decoder 10-3 of FIG. 32. It is confirmed that the voltages V(T1), V(T2) and V(T3), selected and output by the decoder 10-3 of FIG. 32, and the voltage Vout, are coincident with those shown in the specification of FIG. 31. The results of the simulation are dispensed with.

Third Example

FIG. 33 is a diagram illustrating an example of the specification for FIG. 5 and FIG. 6, where n=5, N=5 and A=0. Specifically, FIG. 33 shows the relationship between the voltages V(T1), V(T2) and V(T3) and the voltage Vout, operated and output by the operational amplifier 60 of FIG. 1 based on the voltages (V(T1), V(T2), V(T3)), wherein the voltages V(T1), V(T2) and V(T3) are those selected from N=5 reference voltages supplied to the decoder 10 of FIG. 1 for selection depending on a 5 bit digital signal (D4, D3, D2, D1, D0) which is also supplied to the decoder and output to the output terminals T1, T2 and T3 of the decoder 10 (N=5 reference voltages correspond to FIG. 5 and are 0th level, 4th level, 12th level, 28th level and the 32nd level).

In the specification of FIG. 33, as in FIG. 29, the number of combinations of the input voltages V(T1), V(T2) and V(T3), where V(T1)=V(T2)=V(T3), is minimized (only one for the 0th level). Such combinations will be encountered when the same reference voltages are selected in the decoder 10. This configuration makes it possible to suppress the change in the input and output voltages of the operational amplifier 60 from being delayed.

Figure 34:
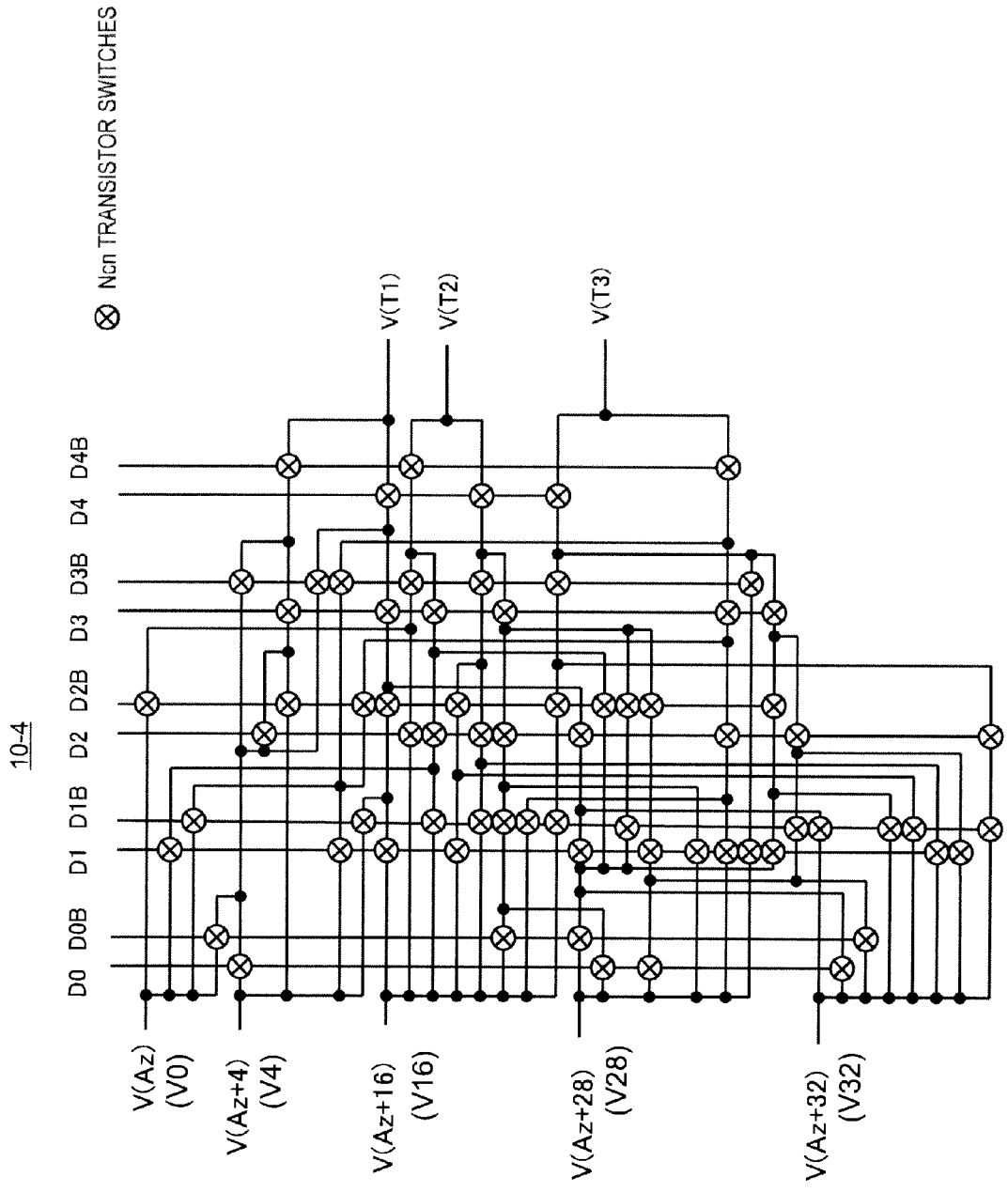
FIG. 34 is a circuit diagram illustrating a circuit configuration of the third example.

FIG. 34 illustrates a circuit configuration example of the decoder 10 implementing the specification of FIG. 33. Referring to FIG. 34, the reference voltages, supplied to this decoder 10-4, are V(Az), V(Az+4), V(Az+16), V(Az+28) and V(Az+32), while the input digital signal is a 5-bit digital signal (D4, D3, D2, D1, D0) as well as its complementary signal (D4B, D3B. D2B, D1B, D0B). In case of AZ=0, the reference voltages V(Az), V(Az+4), V(Az+16), V(Az+28) and V(Az+32) correspond to the 0th level (V0), 4th level (V4), 16th level (V16), 28th level (V28) and 32nd level (V32) of FIG. 32. The decoder 10-4 of FIG. 34 is made up by Nch transistor switches.

Like the decoder 10-1B of FIG. 27, the decoder 10-4 of FIG. 34 is configured to reduce the number of the transistor switches and hence the circuit area. The decoder (10-1A) of FIG. 26 corresponds to a configuration of the decoder 10-1B of FIG. 27 before reducing the number of transistor switches. However, the decoder circuit of the circuit configuration of FIG. 34 before reducing the number of transistor switches (decoder circuit corresponding to the specification of FIG. 33) is not shown. The manner in reducing the number of transistors in the decoder 10-4 of FIG. 34 is similar to that shown in FIG. 27 so that detailed explanation is dispensed with.

In the decoder 10-4 of FIG. 34, as in the decoder 10-1B of FIG. 27, the reference voltages are selected in the sequence proceeding from the lower bit side (D0, D0B) to the upper bit side (D4, D4B) of the digital signal.

A circuit simulation shown in FIG. 28 has been conducted for the decoder 10-4 of FIG. 34 and it has been confirmed that the voltages V(T1), V(T2) and V(T3), selected and output by the decoder 10-4 of FIG. 34, and the voltage Vout, are coincident with the relationship shown in the specification of FIG. 33. However, the result of the simulation is dispensed with.

The specifications of FIG. 7-FIG. 8, FIG. 9-FIG. 10, FIG. 11-FIG. 12, and FIG. 13-FIG. 14 for n=6, N=7, A=0, as well as the circuit configuration of the decoder 10 that implements these specifications, may be obtained by the technique of the Examples shown in FIG. 25 through to FIG. 34. Hence, the specifications or the circuit configuration are dispensed with.

The disclosure of the aforementioned Patent Publication is incorporated by reference herein. The particular exemplary embodiments or examples may be modified or adjusted within the scope of the entire disclosure of the present invention, inclusive of claims, based on the fundamental technical concept of the invention. In addition, variegated combinations or selections of the elements herein disclosed, inclusive of the elements of the claims, examples or drawings, may be made within the context of the claims. That is, the present invention may encompass various modifications or corrections that may occur to those skilled in the art within the gamut of the entire disclosure of the present invention, inclusive of claim and the technical concept of the invention.

REFERENCE SIGNS LIST 10, 10-1A, 10-1B, 10-2, 10-3, 10-4 first decoders
20 second decoder
30 third decoder
40 decoder
50 group of reference voltages
60 operational amplifier
101~144 Nch transistor switches
801 shift register
802 shift register/latch
803 level shifter group
804 reference voltage generating circuit
805 decoder circuit group
806 output circuit group
940 power supply circuit
950 display controller
960 display part 961 scan line
962 data line
963 display element
964 thin-film transistor (TFT)
964 display electrode
970 gate driver
971 liquid crystal capacitance
972 auxiliary capacitance
973 pixel electrode
974 opposing substrate electrode
980 data driver
981 thin-film transistor (TFT)
982 organic LED
983 auxiliary capacitance
984, 985 power supply terminals

What is claimed is:

1. A digital-to-analog conversion circuit comprising
a first decoder that receives N number of reference voltages and an n-bit digital signal (n being a predetermined integer not less than 4) to select first to third voltages from the N number of reference voltages in accordance with the n-bit digital signal; and
an operational amplifier that receives the first to third voltages selected by the first decoder to produce a voltage level corresponding to an operation of $$\{(\text{the first voltage}) + (\text{the second voltage}) + 2(\text{the third voltage})\}/4;\ \text{wherein}$$

for respective $2^n$ (^ being a power operator) number of combinations of the n-bit digital signal, $2^n$ number of voltage levels from Ath level, as a base level, to $(A-1+2^n)$th level, are able to be output from the operational amplifier, wherein
the N number of reference voltages include:
for the Ath level to the $(A-1+2^n)$th level of the $2^n$ number of output voltage levels,
four number of reference voltages including the Ath level, $(A+4)$th level, $(A-4+2^n)$ level, and $(A+2^n)$ level, out of $\{1+2^{(n-2)}\}$ number of reference voltages corresponding to voltage levels: A+4k (where k is an integer from 0 to $2^{(n-2)}$) that are spaced each other at an interval of 4 levels from the Ath level; and
at most $\{-4+2^{(n-2)}\}$ number of reference voltages, obtained by decimating at least one predetermined reference voltage from $\{-3+2^{(n-2)}\}$ number of reference voltages that are other than the four number of reference voltages out of the $\{2^{(n-2)}+1\}$ reference voltages corresponding to the voltage levels spaced apart at an interval of 4 levels from the Ath level, and wherein
N is not less than 4 and not more than $2^{(n-2)}$.

2. The digital-to-analog conversion circuit according to claim 1, wherein the $2^n$ output voltage levels include
voltage levels output from the operational amplifier based on three number of reference voltages with respective different voltage levels selected in the first decoder as the first to third voltages.

3. The digital-to-analog conversion circuit according to claim 1, comprising
a group of reference voltages;
a digital signal of m-bit width including the n-bit digital signal in lower order bits thereof where m>n; and
a second decoder, wherein
the voltage levels being able to be output from the operational amplifier are divided into a first section to an Sth section not overlapping with one another (where S is a pre-set integer not less than 1),
a zth section (1 z S) includes a $2^n$ voltage levels made up of Azth level to $(Az-1+2^n)$th level, and wherein
the group of the reference voltages includes,
in correspondence with each section z (1 z S),
four number of reference voltages including the Azth level, $(Az+4)$th level, $(Az-4+2^n)$th level and $(Az+2^n)$th level, out of $\{1+2^{(n-2)}\}$ reference voltages corresponding to voltage levels: Az+4k (where k is an integer from 0 to $2^{(n-2)}$) that are spaced each other at an interval of 4 levels from the Ath level, and
at most $\{-4+2^{(n-2)}\}$ reference voltages obtained by decimating a pre-set at least one reference voltage from $\{-3+2^{(n-2)}\}$ reference voltages that are other than the four number of reference voltages out of the $\{2^{(n-2)}+1\}$ reference voltages corresponding to the voltage levels spaced apart at an interval of 4 levels from the Azth level,
N being not less than 4 and not more than $2^{(n-2)}$,
the reference voltage at the $(Az+2^n)$th level of the zth section (1 z<S) being equal to the reference voltage of the $A(z+1)$th level which is the base level of the $(z+1)$st section,
a total number of the reference voltages of the 1st to the Sth sections being S (N−1)+1, and wherein
the second decoder selects, in accordance with the value of the upper order side (m−n) bits of the m hit digital signal, the N number of reference voltages allocated to an associated section among the 1st to the Sth section, the second decoder outputting the so selected N-number of the reference voltages to the first decoder.

4. The digital-to-analog conversion circuit according to claim 1, comprising
a group of reference voltages;
a digital signal of m bit width including the n-bit digital signal as lower order bits, where m>n; and
second and third decoders, wherein
the voltage levels that are able to be output from the operational amplifier are divided into a first to an Sth section not overlapping with one another (where S is a pre-set integer not less than 1),
a zth section (1 z S) includes a $2^n$ number voltage levels made up of an Azth level to the $(Az-1+2^n)$th level;
the group of the reference voltages includes,
in correspondence with at least one section p out of the 1st to the Sth sections,
four number of reference voltages including Apth level, $(Ap+4)$th level, $(Ap-4+2^n)$th level and $(Ap+2^n)$th level, out of $\{1+2^{(n-2)}\}$ reference voltages corresponding to voltage levels: Ap+4k (where k is an integer from 0 to $2^{(n-2)}$) that are spaced each other at an interval of 4 levels from the Apth level, and
at most $\{-4+2^{(n-2)}\}$ reference voltages obtained by decimating a pre-set at least one reference voltage from $\{-3+2^{(n-2)}\}$ reference voltages that are other than the four number of reference voltages out of the $\{2^{(n-2)}+1\}$ reference voltages corresponding to the voltage levels spaced apart at an interval of 4 levels from the Apth level,
N being not less than 4 and not more than $2^{(n-2)}$,
the group of the reference voltages further including,
in correspondence with at least one section q distinct from the section p of the 1st section to the Sth section,
$2^{(n-2)}$ reference voltages from the Aqth level to the $(Aq-4+2^n)$th level, spaced each other at an interval of 4 levels, and wherein
the second decoder is configured to select, in accordance with the value of upper order (m−n) bits of the m bit digital signal, the N-number of the reference voltages allocated to an associated section p out of the 1st to the Sth sections, from the group of the reference voltages, and to output the reference voltages selected to the operational amplifier, and the third decoder is configured to receive the $2^{(n-2)}$ reference voltages from the group of the reference voltages, the third decoder, responsive to the m-bit digital signal selecting the first to third voltages from the $2^{(n-2)}$ reference voltages to supply the selected first to third voltages to the operational amplifier, the first decoder and the third decoder sharing the operational amplifier.

5. The digital-to-analog conversion circuit according to claim 1, wherein n is 4 and N is 4, and wherein for 16 voltage levels made up of the Ath level to the (A+15)th level that are able to be output from the operational amplifier, the N-number of the reference voltages are set at Ath, (A+4)th, an (A+12)th, and (A+16)th voltage levels.

6. The digital-to-analog conversion circuit according to claim 1, wherein n is 5 and N is 6, and wherein for 32 voltage levels made up of the Ath level the (A+31)st level that are able to be output from the operational amplifier, the N-number of the reference voltages are set at Ath, (A+4)th (A+12)th, (A+20)th, (A+28)th and (A+32)nd voltage levels.

7. The digital-to-analog conversion circuit according to claim 1, wherein n is 5 and N is 5, and wherein for 32 voltage levels made up of the Ath level to the (A+31)st level that are able to be output from the operational amplifier, the N-number of the reference voltages are set at Ath, (A+4)th, (A+16)th, (A+28)th and (A+32)nd voltage levels.

8. The digital-to-analog conversion circuit according to claim 1, wherein n is 6 and N is 7, and wherein for 64 voltage levels made up of the Ath level to the (A+63)rd level that are able to be output from the operational amplifier, the N-number of the reference voltages are set at two voltage levels of any one of combinations:

(A+16)th and (A+48)th, (A+8)th and (A+56)th, (A+12th) and (A+52)nd, and (A+20)th and (A+44)th, in addition to five voltage levels of Ath, (A+4)th, (A+32)nd, (A+60)th and (A+64)th.

9. The digital-to-analog conversion circuit according to claim 1, wherein in the first decoder, among output combinations of the first to third voltages, included in the $2^n$ number of output voltage levels from the operational amplifier and selected from the N-number reference voltages, the number of the combinations which select one of the N-number reference voltages in common for the first to third voltages, is minimized to a single set.

10. The digital-to-analog conversion circuit according to claim 1, wherein the first decoder sequentially selects the N-number reference voltages from the lower bit side towards the upper bit side of the n-bit digital signal.

11. A data driver including the digital-to-analog conversion circuit according to claim 1, the digital-to-analog conversion circuit receiving an input digital signal corresponding to an input video signal to output a voltage corresponding to the input digital signal, wherein the data driver drives a data line at a voltage corresponding to the input digital signal.

12. A display device including a pixel switch and a display element at an intersection of a data line and a scan line, a signal on the data line being written on the display element via the pixel switch turned on by the scan line, wherein the display device includes the data driver of claim 11 as a data driver that drives the data line.

13. The display device according to claim 12, wherein the display element is a liquid crystal element or an organic LED.

* * * * *